(12) United States Patent
Jalali et al.

(10) Patent No.: US 9,479,192 B2
(45) Date of Patent: Oct. 25, 2016

(54) METHOD FOR DATA COMPRESSION AND TIME-BANDWIDTH PRODUCT ENGINEERING

(71) Applicant: THE REGENTS OF THE UNIVERSITY OF CALIFORNIA, Oakland, CA (US)

(72) Inventors: Bahram Jalali, Los Angeles, CA (US); Mohammad H. Asghari, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/749,626

(22) Filed: Jun. 24, 2015

(65) Prior Publication Data

US 2016/0006453 A1 Jan. 7, 2016

Related U.S. Application Data

(63) Continuation of application No. PCT/US2013/077969, filed on Dec. 27, 2013.

(60) Provisional application No. 61/746,244, filed on Dec. 27, 2012, provisional application No. 61/841,290, filed on Jun. 29, 2013, provisional application No. 61/867,515, filed on Aug. 19, 2013, provisional application No. 61/867,519, filed on Aug. 19, 2013.

(51) Int. Cl.
*H03M 7/30* (2006.01)
*H03M 5/22* (2006.01)

(52) U.S. Cl.
CPC ............. *H03M 5/22* (2013.01); *H03M 7/3059* (2013.01)

(58) Field of Classification Search
CPC ........... H03M 1/1215; H03M 1/1265; H03M 1/1245; H03M 1/361; H03M 1/365; H03M 1/12; H03M 1/32; H03M 1/121; H03M 1/64; H04N 13/0011; H04N 1/387; H04R 25/353; H04R 25/505; G06K 9/2063
USPC ....... 341/60–90; 348/43, 411; 381/321, 313, 381/316
See application file for complete search history.

(56) References Cited

U.S. PATENT DOCUMENTS 6,323,797 B1 * 11/2001 Kikumoto ........ G11B 20/00007
341/144
7,242,332 B1 * 7/2007 Boemler ............. H03M 1/0604
250/208.1

(Continued)

OTHER PUBLICATIONS

Korea Intellectual Property Office (KIPO), international search report and written opinion, PCT/US2013/077969, issued Apr. 18, 2014, pp. 1-9, with claims searched, pp. 10-13, counterpart to this U.S. Appl. No. 14/749,626.

(Continued)

*Primary Examiner* — Lam T Mai
(74) *Attorney, Agent, or Firm* — O'Banion & Ritchey LLP; John P. O'Banion

(57) ABSTRACT

A method and apparatus for compression of digital and analog data utilizing an anamorphic spectrum transformation to warp an analog or digital signal to provide time-bandwidth compression after sampling is performed on the warped signal. The anamorphic spectrum transformation performs reallocating samples to assign more samples to fine features with high frequency waveform portions and fewer samples to coarse features with low frequency portions of the analog temporal signal, resulting in shorter record length and fewer number of samples.

35 Claims, 37 Drawing Sheets

(56) References Cited

U.S. PATENT DOCUMENTS

| | | | | |
|---|---|---|---|---|
| 7,242,334 | B2* | 7/2007 | Holden | H04B 1/0028 |
| | | | | 341/139 |
| 7,962,087 | B2* | 6/2011 | Spence | G03G 15/657 |
| | | | | 271/283 |
| 8,432,153 | B2* | 4/2013 | Gupta | 324/96 |
| 8,553,808 | B2* | 10/2013 | Luthra | H03M 1/1265 |
| | | | | 375/130 |
| 2007/0132623 | A1 | 6/2007 | Holden | |
| 2008/0143573 | A1 | 6/2008 | Luthra | |
| 2008/0215330 | A1* | 9/2008 | Harma | H04R 25/353 |
| | | | | 704/265 |
| 2009/0185132 | A1* | 7/2009 | Raymond | A61B 3/1015 |
| | | | | 351/205 |
| 2009/0271182 | A1* | 10/2009 | Athineos | G10L 15/02 |
| | | | | 704/205 |
| 2010/0201345 | A1 | 8/2010 | Gupta et al. | |
| 2013/0289879 | A1* | 10/2013 | Grandi | G01V 1/30 |
| | | | | 702/6 |

OTHER PUBLICATIONS

Gupta et al., "Time-Warp correction and calibration in photonic time-stretch analog-to-digital converter", Optics Letters, Nov. 15, 2008, vol. 33, No. 22, pp. 2674-2676.

Gupta et al., "Time-Warp in Photonic Time Stretch ADC and Their Mitigation", In: Microwave photonics, 2008, jointly held with the 2008 asia-pacific microwave photonics conference, 2008, pp. 43-46.

* cited by examiner

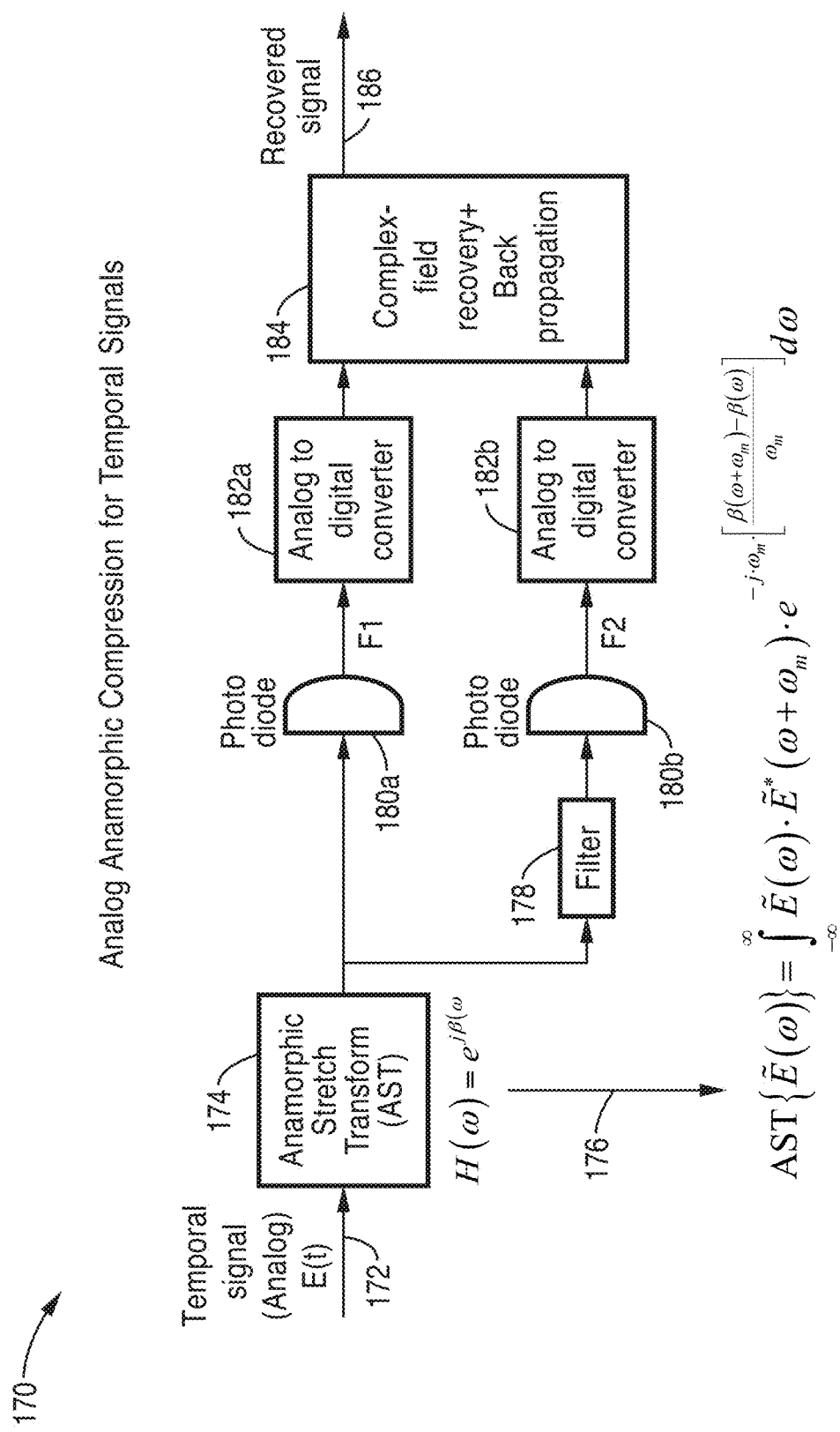

METHOD FOR DATA COMPRESSION AND TIME-BANDWIDTH PRODUCT ENGINEERING

CROSS-REFERENCE TO RELATED APPLICATIONS

This application is a 35 U.S.C. §111(a) continuation of PCT international application number PCT/US2013/077969 filed on Dec. 27, 2013, incorporated herein by reference in its entirety, which claims priority to, and the benefit of, U.S. provisional patent application Ser. No. 61/746,244 filed on Dec. 27, 2012, and which claims priority to, and the benefit of, U.S. provisional patent application Ser. No. 61/841,290 filed on Jun. 29, 2013, incorporated herein by reference in its entirety, and which claims priority to, and the benefit of, U.S. provisional patent application Ser. No. 61/867,515 filed on Aug. 19, 2013, incorporated herein by reference in its entirety, and which claims priority to, and the benefit of, U.S. provisional patent application Ser. No. 61/867,519 filed on Aug. 19, 2013, incorporated by reference in its entirety. Priority is claims to each of the foregoing applications.

The above-referenced PCT international application was published as PCT International Publication No. WO 2014/106034 on Jul. 3, 2014, which publication is incorporated herein by reference in its entirety.

STATEMENT REGARDING FEDERALLY SPONSORED RESEARCH OR DEVELOPMENT

This invention was made with Government support under 0812072, awarded by the National Science Foundation. The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to compression of digital and analog signals and data, and more particularly to compression of time-bandwidth product utilizing a transformation stage imparting a reshaping that includes nonlinear warping of the temporal waveform.

2. Description of Related Art

Various forms of analog and digital data proliferate the modern age, making compression techniques a key technology to aid in the processing, communication and storage of these forms of data. A wide variety of approaches have been applied for the efficient collection and compression of analog and digital data.

Analog and digital data compression takes many forms, typically configured for reducing data redundancies or using lossless arithmetic coding techniques in digital data. Examples of digital data compression include, PKZIP, PNG, LZW and so forth.

Another category of data comprises temporal signals which must be sampled at a sufficient rate so as to obtain desired signal information, and then communicate/store that data efficiently. One existing mechanism for reaching a sufficient sampling rate involves time-stretching to trade off intensity-bandwidth and temporal-duration, thus allowing sampling to be performed at a lower rate while proportionally increasing the temporal duration. Time-stretching performed in the analog domain prior to sampling reduces signal bandwidth, but does not reduce the time-bandwidth product (TBP) because the signal is temporally stretched in time, whereby storage requirements remain constant.

Current data compression techniques operate on digital data only. However, in high speed sensors and instruments, the analog data is often too fast to be digitized in real time. One exception in the prior art is that compressive sensing operates on analog data, although it does not lend itself to fast real-time implementation.

Accordingly, a need exists for an enhanced data compression apparatus and method which reduces modulation intensity bandwidth otherwise known as envelope-bandwidth without a proportional increase in temporal duration.

BRIEF SUMMARY OF THE INVENTION

The present invention is a method/apparatus for compressing temporal data utilizing a transformation stage having a nonlinear warp to reshape the complex field of the signal selectively, so that sampling becomes feature selective, wherein fast features of the signal are then sampled at a higher rate than slow features containing temporal redundancy. In utilizing the inventive method, the time-bandwidth product itself is compressed. The term anamorphic transform, or anamorphic stretch transform (AST), is utilized herein to describe this new form of data collection and/or compression. The technique can be performed in the analog domain, digital domain, optical domain, or electrical/microwave/radio domains, or a combination thereof.

A wide range of applications can benefit from utilizing the anamorphic transforms described herein, including applications involving analog signals, optical signals, electronic and microwave signals, digital data, "big data" systems, spectroscopy, genome sequencing, analog to digital conversion, temporal imaging, to name just a few.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 18A and FIG. 18B are block diagrams comparing analog and digital AST compression according to embodiments of the present invention.

DETAILED DESCRIPTION OF THE INVENTION

1. Introduction

In conventional sampling, the analog signal is sampled at twice the highest frequency of the signal, which is the so-called Nyquist rate. The present invention considers that sampling in this conventional manner makes inefficient use of the available samples because frequency components below the Nyquist rate are oversampled. This uniform, frequency-independent sampling has two major shortcomings: (i) it limits the maximum frequency that can be captured with a given sampling rate to half of the sampling rate, and (ii) it results in a record length that is much larger than necessary for a signal containing redundancy, because the low frequencies are oversampled.

Figure 1:
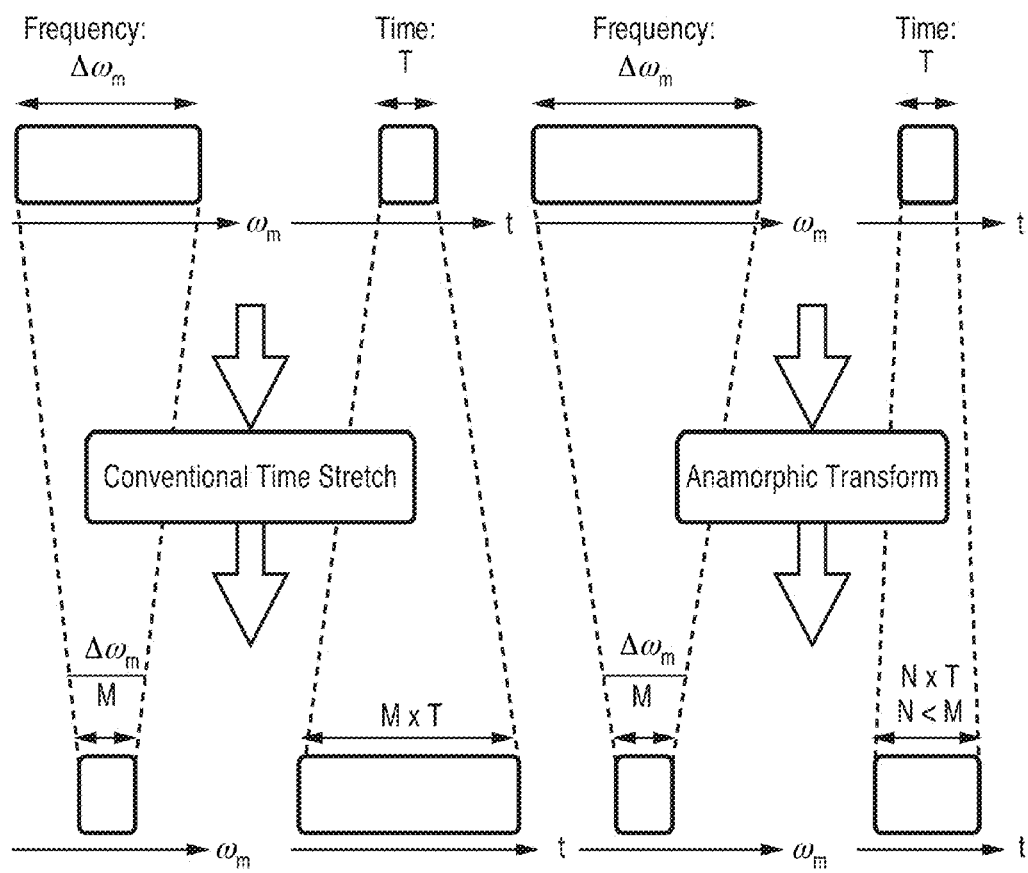
FIG. 1 are transformation time-bandwidth plots comparing conventional time stretching with an anamorphic transform according to an embodiment of the present invention.

FIG. 1 illustrates a comparison of conventional time stretching with anamorphic transforms utilized according to the present invention. On the left side of the figure, time-stretching is seen being performed in the analog domain prior to sampling, with the object of reducing signal bandwidth. A frequency span $\Delta\omega_m$ and time T are seen at the top on each side, in which $\omega_m$ represents modulation frequency. On the left the frequency and time components pass through a time stretch transform to a result having a reduced frequency range, over a larger time span. In a conventional time stretch method, the signal may be modulated on a chirped optical carrier and then subjected to a dispersive Fourier transform (DFT), which causes the signal, now represented by the modulation intensity of the carrier, to be stretched in time, wherein its bandwidth is compressed. Since the photodiode measures the modulation intensity, this reduces the bandwidth requirements of the photodiode and the analog to digital converter (ADC). Here the time-bandwidth product (TBP) remains constant because when the modulation intensity bandwidth is compressed by a factor M, the time duration of the signal is increased by the same factor. Fast features are suitably slowed down for the digitizer to sample and quantize them at the Nyquist rate; however, the slow features are oversampled. This redundant oversampling results in a needlessly large record length.

The present invention considers that it would be highly desirable to compress the bandwidth without this proportional increase in the time duration, thus achieving a reduction of the modulation TBP. To achieve this beneficial objective requires a feature-selective time-stretch, which is particularly beneficial when fast features occur sparsely. This benefit would be similarly attractive to that offered by compressive sensing, however, performed through warping of the signal as opposed to modification of the sampling process. Accordingly, the present invention can be utilized with conventional data converter for compression and decompression (e.g., ADCs and DACs).

The present invention describes an apparatus and methods for a new transformation that compresses the time-bandwidth product of signal intensity by reshaping the complex field of the signal in the analog domain before sampling and digitization. Results provided by these transformation embodiments are also detailed. This feature-selective sampling is performed by reshaping the signal with a phase filter having a nonlinear group delay.

In anamorphic transformation, a specific group delay versus frequency profile is identified using a stretched modulation distribution ($S_M$) comprising a two-dimensional function unveiling signal intensity bandwidth and its dependence on group delay. These plots were previously referred to as modulation intensity distribution (MID) in a provisional application of the Applicants. However, to avoid confusion with a different function of the same name, the description herein opts to refer to this function as stretched modulation distribution ($S_M$). It should also be noted that in another provisional patent disclosure of the Applicants this distribution has been referred to as anamorphic spectral distribution (ASD).

The signal reshaping operation is then combined with complex field detection followed by digital reconstruction at the receiver. As can be seen in the right side of FIG. 1, the net result of the anamorphic transform is to decrease intensity bandwidth without the aforementioned expense of a proportional increase in temporal duration. In the lower right of the figure one can see that although the bandwidth is still reduced by a bandwidth compression factor M, the resultant time required expands only to N×T, instead of M×T as in a conventional time stretch, wherein value N<M.

In practical application it will be seen that both techniques are performed prior to sampling and they boost signal sampling rate, such as that of an analog-to-digital converter (ADC). However, for a given bandwidth compression factor M, the anamorphic transform results in shorter record lengths with fewer samples.

The inventive technique allows capturing an ultrafast signal in real-time with a digitizer that would otherwise lack a sufficient sampling rate. Furthermore, the number of samples needed for digital representation of the sample is reduced, and hence the digital data size is similarly reduced. The technique measures both the time domain and the spectrum of ultrafast signals in real-time. For application to optical waveforms, the nonlinear group delay filter operation can be performed with dispersive elements with engineered group velocity dispersion, such as chirped fiber Bragg gratings (CFBG), chromo modal dispersion or free space gratings.

While the discussion herein largely focuses on applications for capturing ultrafast analog signals where the anamorphic transformation is performed in the analog domain, these mathematical transformations can also be performed in the digital domain on digital data. This all-digital implementation comprises a data compression algorithm that may prove useful in overcoming "big data" problems resulting from storage and transmission bottlenecks.

2. Technical Description

A passband analog signal can be represented by an envelope waveform modulated on a carrier. The envelope is the modulation waveform. The envelope (i.e., modulation) is the magnitude of the complex electric field. Envelope intensity, (i.e., modulation) intensity, is the magnitude squared. Analog to digital converters (ADCs) usually detect the modulation intensity of the input signal, i.e., after down conversion. The present invention derives a mathematical algorithm describing the optimum analog transformation for reshaping the spectrum of the signal such that its modulation can be captured with an ADC that would otherwise be too slow (i.e., have an insufficient sampling rate). Unlike the conventional uniform time-stretch processing, the new transformation minimizes the record length and number of samples. This transformation is implemented utilizing a filter with an engineered group delay.

Figure 2:
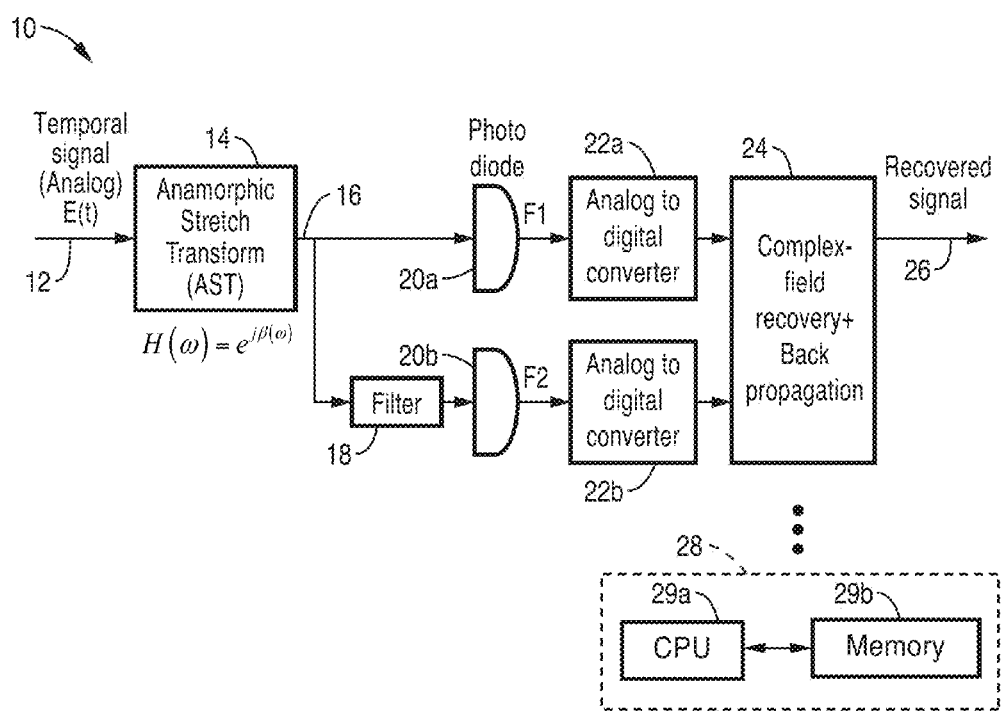
FIG. 2 is a block diagram of an anamorphic transformation apparatus according to an embodiment of the present invention, shown using an AST filter with tailored frequency-dependent group delay.

FIG. 2 illustrates an example embodiment 10 of anamorphic transformation performed using a filter with a tailored frequency-dependent group delay. It can be seen in the figure that an analog signal 12 is received for anamorphic stretch transform (AST) 14 whose output 16 is split, with one portion received through filter 18, after which both portions are detected by photo-diodes 20a, 20b, whose outputs F1, F2 are received by analog-to-digital converters (ADC)s 22a, 22b, followed by complex field recovery and back propagation 24 to output a recovered signal 26. In this recovery block 26, the complex field of the transformed signal is measured using two intensity measurements and the input signal is reconstructed using back propagation. It should be appreciated that reconstruction is the process of decompression consisting of phase recovery and inverse AST operations.

A computer processor 28, such as containing at least one central processing unit 29a (e.g., digital signal processor, central processing unit, general processing unit, microcontroller, or processor enabled FPGA or ASICs) and memory 29b capable of storing and executing programming, is utilized in at least one embodiment of FIG. 2, for performing the complex field recovery and back propagation. It should be appreciated that other embodiments of the present invention which perform digital processing can be similarly configured with a computer processor, or other forms of digital circuitry capable of performing these method steps and/or computations, or combinations of computer processors and other digital circuitry. It will be appreciated that programming stored on the memory associated with the computer processor may include solid state memory (e.g., RAM, DRAM, SRAM, EEPROM, MRAM, FLASH, etc.), computer-readable media, and other forms of computer accessible memory without limitation, and combinations thereof, insofar as these are non-transitory and thus do not constitute a transitory electronic signal.

The following describes the basic operating principles.

Table 1, found at the end of the specification, lists parameters and acronyms that have been utilized herein.

Let $H(\omega)=e^{j\beta(\omega)}$ be the spectral response of a filter with phase $\beta(\omega)$ and group delay (GD) of $\tau(\omega)=\partial[\beta(\omega)]/\partial\omega$.

The modulation intensity spectrum of the input signal can be described in terms of the complex amplitude E(t):

$$I(\omega_m) = FT\{|E(t)|^2\} \quad (1)$$

where FT{ } is the Fourier transform operator and $\omega_m$ is the modulation (sideband) frequency measured with respect to the carrier frequency $\omega$. It is easy to show that the modulation spectrum can be written as a correlation function:

$$I(\omega_m) = \int_{-\infty}^{\infty} \tilde{E}(\omega)\tilde{E}^*(\omega + \omega_m)d\omega \quad (2)$$

where $\tilde{E}(\omega)$ is the spectrum of the input signal. Eq. (2) describes the correlation of the electric field with its frequency-shifted copy and calculates the spectrum of the modulation intensity. After passing through the filter, the modulation spectrum of the output signal, can be calculated as follows:

$$I_o(\omega_m) = \int_{-\infty}^{\infty} \tilde{E}(\omega)\tilde{E}^*(\omega + \omega_m)e^{j(\beta(\omega) - \beta(\omega + \omega_m))}d\omega \quad (3)$$

This mathematical transformation reshapes the envelope intensity spectrum, therefore it can be called anamorphic spectral transform (AST) or anamorphic stretch transform (AST), that relates input carrier (field) spectrum to two output modulation intensity spectrum:

$$AST\{E(\omega)\} = \int_{-\infty}^{\infty} \tilde{E}(\omega) \cdot \tilde{E}^*(\omega + \omega_m) \cdot e^{-j\omega_m \cdot \left[\frac{\beta(\omega + \omega_m) - \beta(\omega)}{\omega_m}\right]}d\omega \quad (4a)$$

For complex field recovery a second measurement is required. Specifically AST maps the input signal spectrum to two parameters, $\tilde{F}1$ and $\tilde{F}2$:

$$AST\{\tilde{E}(\omega)\} = \begin{cases} \tilde{F}1(\omega_m) = \int_{-\infty}^{\infty} E(\omega) \cdot \tilde{E}(\omega + \omega_m) \cdot \\ \qquad e^{-j\omega_m \cdot \left[\frac{\beta(\omega + \omega_m) - \beta(\omega)}{\omega_m}\right]}d\omega \\ \tilde{F}2(\omega_m) = \int_{-\infty}^{\infty} E(\omega) \cdot \tilde{E}(\omega + \omega_m) \cdot D(\omega) \cdot D^*(\omega + \omega_m) \cdot \\ \qquad e^{-j\omega_m \cdot \left[\frac{\beta(\omega + \omega_m) - \beta(\omega)}{\omega_m}\right]}d\omega \end{cases} \quad (4b)$$

where $\tilde{F}2(\omega_m)$ is the intensity spectrum after $H(\omega)$ filter and $\tilde{F}2(\omega_m)$ is the intensity spectrum after the $H(\omega)$ filter cascaded with the filter $D(\omega)$. The $H(\omega)$ filter is used to compress the time-bandwidth product and $D(\omega)$ is responsible for phase discrimination for complex field recovery.

As seen later, for time-bandwidth compression, the shape of the optimum $H(\omega)$ filter group delay is a sublinear function resembling the letter "5". Therefore, previous disclosures by the Applicants referred to this particular implementation as the S Transform (ST), although it should be noted that the anamorphic stretch transform is more general than this particular group delay function.

For $H(\omega)$ filters operating in the far field (i.e., filters with large group velocity dispersion (GVD)), the signal is stretched in time by a large amount, hence its modulation frequency $\omega_m \ll \omega$ and the bracketed term in the exponent of Eq. 4a is reduced to the group delay, $d\beta(\omega)/d\omega = \tau(\omega)$. Thus, in the far field condition, AST is simplified to:

$$AST\{\tilde{E}(\omega)\} = \begin{cases} \tilde{F}1(\omega_m) = \int_{-\infty}^{\infty} \tilde{E}(\omega) \cdot \tilde{E}^*(\omega + \omega_m) \cdot e^{-j\omega_m \cdot \tau(\omega)}d\omega \\ \tilde{F}2(\omega_m) = \int_{-\infty}^{\infty} \tilde{E}(\omega) \cdot \tilde{E}^*(\omega + \omega_m) \cdot D(\omega) \cdot D^*(\omega + \omega_m) \cdot e^{-j\omega_m \cdot \tau(\omega)}d\omega \end{cases} \quad (4c)$$

2.1 Description of AST Operation in Time Domain.

AST operation explained in Eq. (4a) can also be described in the time domain as follows:

$$AST\{E(t)\} = \left|\int_{-\infty}^{\infty} e^{j\Phi(t-t_1)} \cdot E(t_1) \cdot dt_1\right|^2 \quad (4d)$$

The frequency operation for phase recovery explained in Eq. (4b) can also be described in the time domain as follows:

$$AST\{E(t)\} = \begin{cases} F1(t) = \left|\int_{-\infty}^{\infty} e^{j\Phi(t-t_1)} \cdot E(t_1) \cdot dt_1\right|^2 \\ F2(t) = \left|\int_{-\infty}^{\infty} d(t-t_1) \cdot \int_{-\infty}^{\infty} e^{j\cdot\Phi(t_1-t_2)} \cdot E(t_2)dt_2 dt_1\right|^2 \end{cases} \quad (5)$$

2.2. Stretched Modulation Distribution ($S_M$).

Since the objective is to simultaneously minimize modulation bandwidth and time duration, a mathematical tool is required that describes both modulation spectrum and its temporal duration. The following 2D distribution describes modulation intensity spectrum and its dependence on time, and is referred to herein as stretched modulation distribution ($S_M$):

$$S_M(\omega_m, t) = \int_{-\infty}^{\infty} \tilde{E}(\omega)\tilde{E}^*(\omega + \omega_m)e^{-j\omega_m\left[\frac{\beta(\omega + \omega_m) - \beta(\omega)}{\omega_m}\right]}e^{j\omega t}d\omega \quad (6)$$

The modulation spectrum and time duration of a signal subject to an arbitrary group delay is obtained from this 2D distribution. This information is then utilized to design a filter with the proper group delay. The $S_M$ can be mathematically described as the cross-correlation of the output signal spectrum with its temporally shifted waveform. At t=0 (i.e., time shift of zero) the $S_M$ becomes the autocorrelation of the output signal spectrum (i.e., the output modulation spectrum). Thus, the trajectory at t=0 in the $S_M$ represents the output modulation spectrum (i.e., AST) and its width determines the output modulation bandwidth. In addition, the maximum absolute amount of temporal shift of cross-correlation has non-zero values given by the time duration of the output signal. Hence, the output signal duration can be measured from the $S_M$ as half of the time range over which the $S_M$ has non-zero values.

Figure 3A:
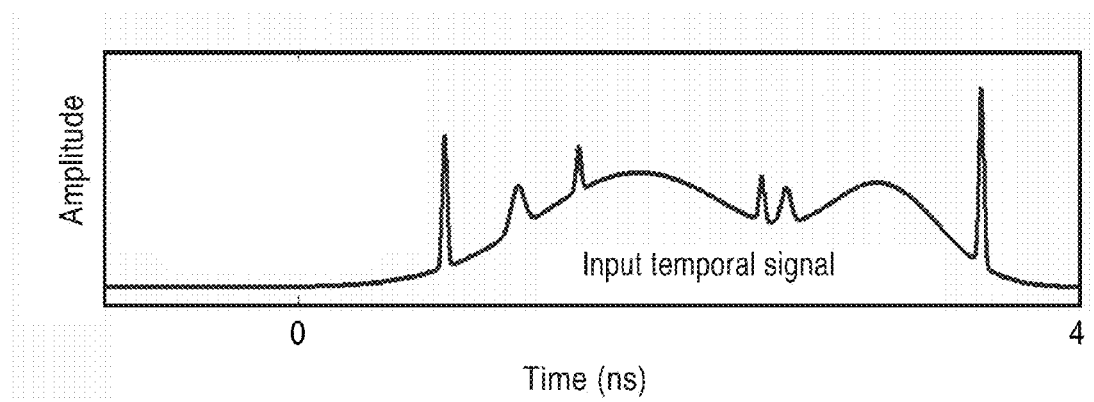
FIG. 3A through FIG. 3E are various plots of input and output signal profiles for demonstrating AST operation according to an embodiment of the present invention.
Figure 3B:
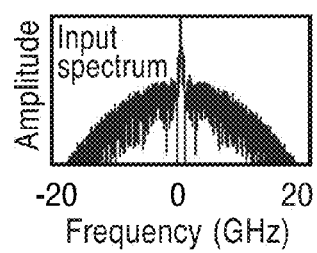
Figure 3C:
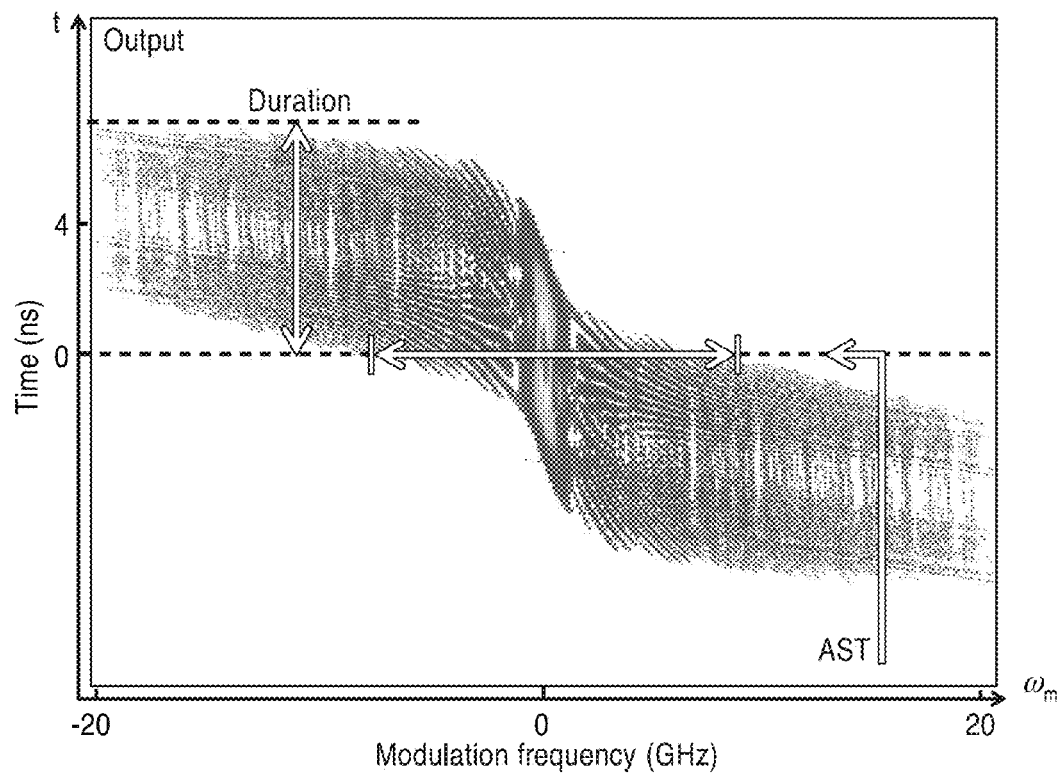
Figure 3D:
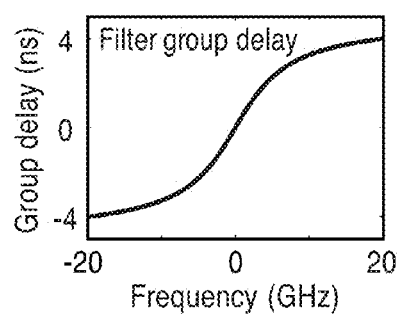
Figure 3E:
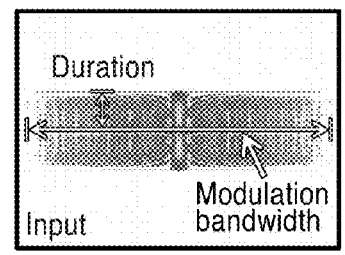

FIG. 3A through FIG. 3E depict $S_M$ plots for an arbitrary signal in which $\omega_m$ corresponds to the modulation frequency and $\omega_m=0$ corresponds to the carrier frequency. The arbitrary signal is shown in FIG. 3A, whose associated field spectrum is shown in FIG. 3B. The arbitrary signal is subjected to a filter with an S-shaped group delay (GD) in FIG. 3C. The filter GD is shown in FIG. 3D, while the $S_M$ of the input signal without the filter is shown in FIG. 3E.

The 3D plot in FIG. 3C shows the dependence of the modulation amplitude at the output on time and modulation frequency, with FIG. 3E showing the same for the input signal, relating bandwidth and temporal length of modulation to the filter phase response (group delay profile). By choosing the proper filter, modulation bandwidth of the signal can be engineered to match the sampling rate of the ADC and its time duration to minimize the number of samples needed to represent it. In FIG. 3C for example, the horizontal arrow shows the modulation bandwidth and the vertical arrow designates the time duration. It should be mentioned that the output signal has both amplitude and phase information requiring complex-field detection. The time domain signal can then be reconstructed from the measured complex field. A number of complex field detection techniques can be employed for the reconstruction.

While filters with arbitrary GD profiles can be considered for AST operation, of more particular interest are filters with general GD profiles that compress the modulation time-bandwidth product (TBP). As suggested by the $S_M$ plot in FIG. 3A through FIG. 3E, such filters should have a sublinear group delay profile. Sublinear is a subset of injective functions. Injective group delay corresponds to a phase response that depends on combining even-order powers of frequency with weighting factors. In other words, phase versus frequency is a polynomial with even powers of frequency. While this is the preferred implementation, the concept is not limited to this. Indeed the polynomial can have both even and odd powers of frequency. The group delay polynomial is the derivative of the phase polynomial with respect to frequency. As long as the group delay has a sublinear profile, time bandwidth compression can be achieved. If it is superlinear, then time bandwidth expansion is achieved. The group delay can be a hybrid with sublinear and superlinear profiles in different portions of the frequency spectrum. A simple sublinear group delay profile is the $\tan^{-1}$ function:

$$\tau(\omega)=A\cdot\tan^{-1}(\beta\cdot\omega), \quad (7)$$

where A and B are arbitrary real numbers. Using Eq. (7), a wide range of filter GD profiles can be generated requiring only two parameters to represent them (as described in a later section). Parameter A in Eq. (7) is the amount of group delay dispersion, and it determines whether the filter is in the near field or far field regime. In the near field, A is on the order of the input signal duration, whereas in the far field, A is much larger than the duration. Parameter B is related to the degree of anamorphism. More details on the choice of $\tan^{-1}$ function are found in a later section of the application.

The $S_M$ function shows that the modulation bandwidth is given by a trajectory through t=0 of the $S_M$ that is the horizontal axis. This property deserves an explanation as it is central to the utility of this new distribution function in identifying the optimum filter (group delay profile) that compresses the time-bandwidth product. The filter applies a phase shift that is an increasing function of frequency. Referring to Eq. (3), higher frequencies in the argument of the integral become highly uncorrelated and the integral over these fast oscillations vanishes. Accordingly, the modulation bandwidth is governed by the central portion of the $S_M$. It should be appreciated that the modulation bandwidth defined in the $S_M$ (FIG. 3A through FIG. 3E) is the passband (double sideband) bandwidth whereas beyond the photo detector, one is concerned with the baseband (single sideband) bandwidth which would be half of the former.

3. Far Field Regime

In the first example on engineering the $S_M$, optimum group delay (GD) profile is discussed for a filter operating in the far field condition. The far field and near field regimes of group velocity dispersion (GVD) can be understood in terms of the stationary-phase approximation. The far field corresponds to having sufficient dispersion to satisfy the stationary phase approximation while the near field refers to the regime before the approximation is satisfied.

Figure 4A:
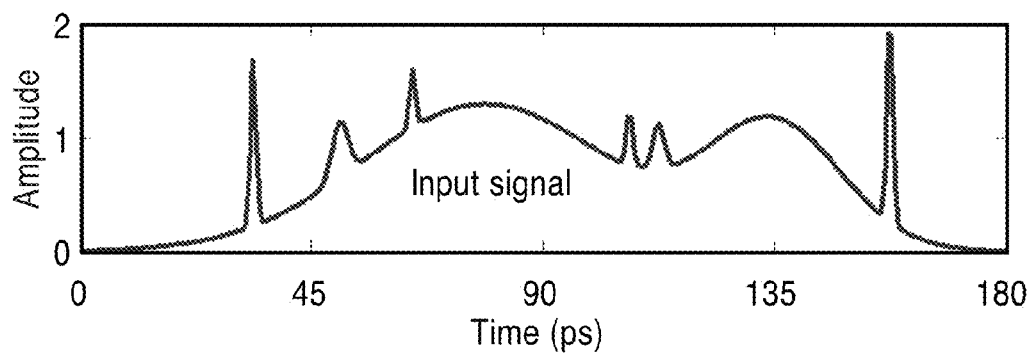
FIG. 4A and FIG. 4B are plots of an analog input profile and bandwidth in a far field regime demonstration of AST according to an embodiment of the present invention.
Figure 4B:
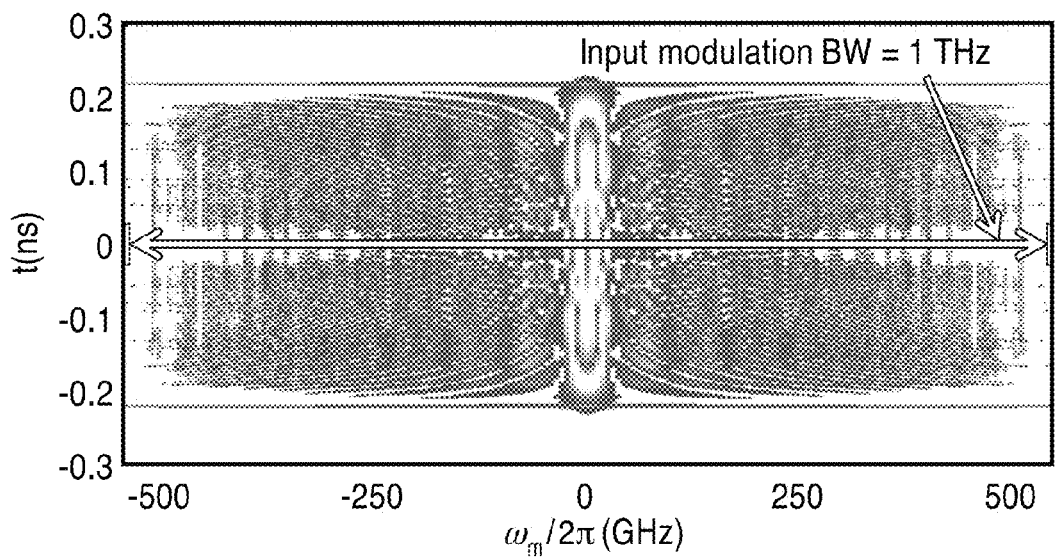

FIG. 4A and FIG. 4B depict an input signal (FIG. 4A) and its stretched modulation distribution ($S_M$) showing 1 THz modulation bandwidth (FIG. 4B). It is an object of the present invention to compress the modulation bandwidth of the input analog signal while minimizing its duration. These figures depict an example of an input signal having a modulation bandwidth of 1 THz (field bandwidth 0.5 THz) and duration of 180 ps. The $S_M$ of the input signal without any filter in the system is shown in FIG. 4B. Utilizing the present invention, this input signal modulation bandwidth is compressed down to 8 GHz, which provides a compression factor of 125.

The filter transfer function is chosen so that GD for higher frequencies is less than the case of linear GD. This must be the case, because to achieve the same output modulation bandwidth, the GD required to compress the bandwidth of the high frequency portion of the spectrum is less, achieved using Eq. (7) with $A=7.86\times10^{-9}$ and $B=6\times10^{-13}$.

Figure 5:
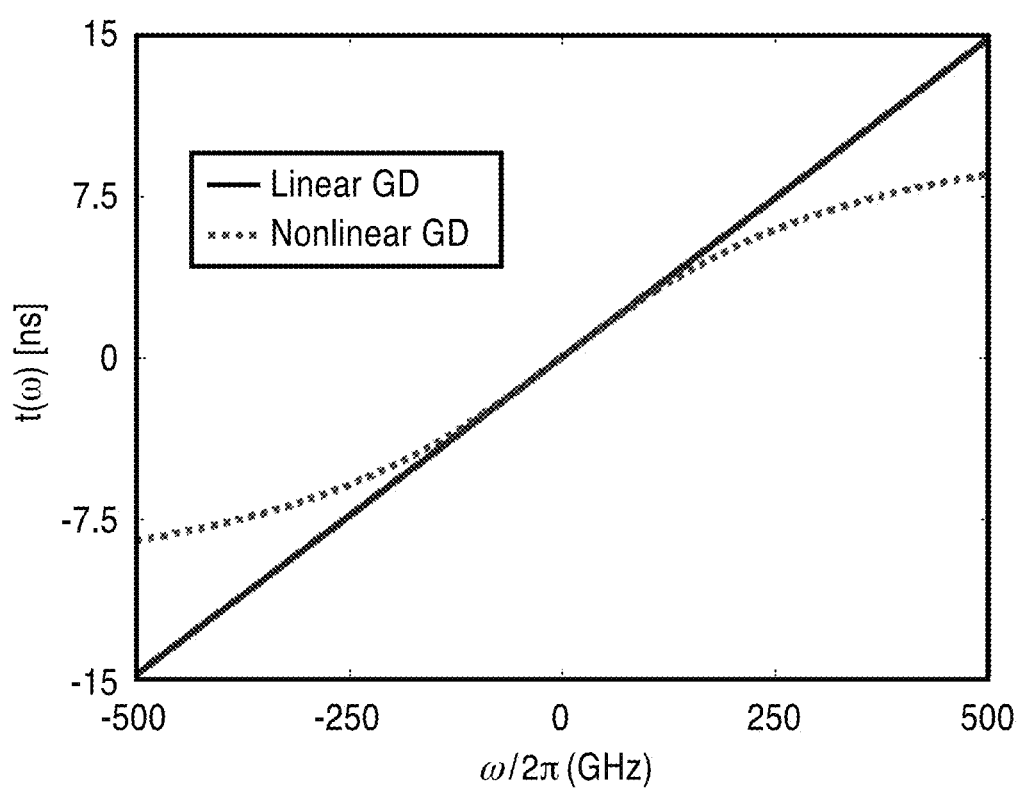
FIG. 5 is a plot of linear and nonlinear filter group delay for an AST demonstration utilized according to an embodiment of the present invention.

FIG. 5 compares nonlinear GD with a linear GD that would have resulted in the same 8 GHz output modulation bandwidth, while nonlinear GD provides reduced time duration. Notice that the frequency axis in this figure shows the frequency deviation, with zero dispersion of the filter seen at the origin of the plot, at the carrier frequency of the input signal.

Figure 6A:
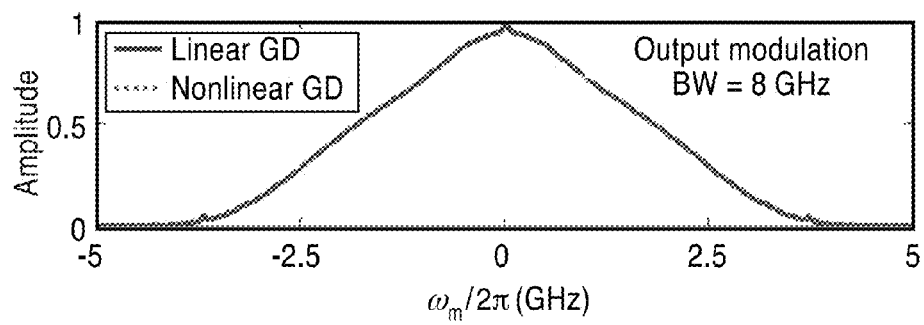
FIG. 6A through FIG. 6C are plots comparing linear group delay and nonlinear group delay inputs and results according to an embodiment of the present invention.
Figure 6B:
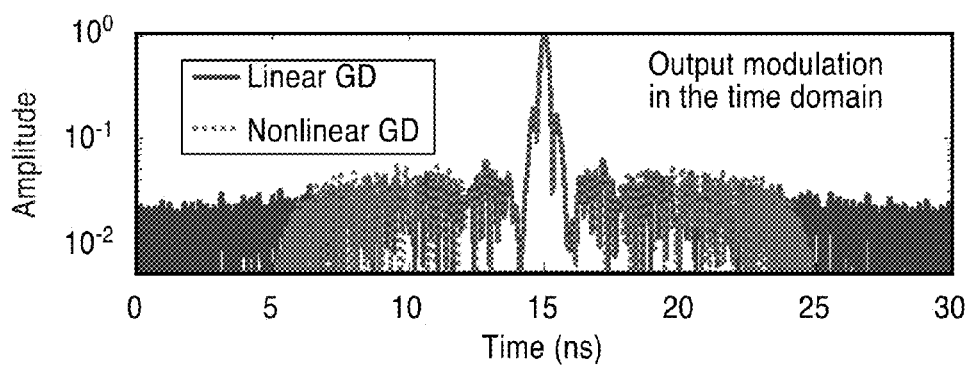
Figure 6C:
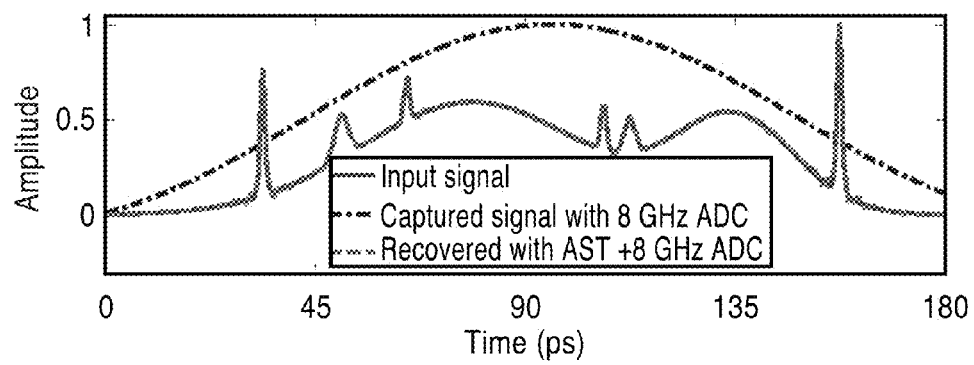

FIG. 6A through FIG. 6C depict results comparing use of linear and nonlinear filter group delay (GD) profiles. Output modulation is shown in FIG. 6A with linear and non-linear GD overlapping one another. In FIG. 6B one can see that linear GD covers the full time span shown of 0 to 30 ns, while nonlinear GD time span is compressed in the 5 to 25 ns range. As seen in FIG. 6A, the modulation bandwidth is 8 GHz in both cases. However, the temporal duration (see FIG. 6B) is reduced from about 30 ns for linear GD, to approximately 18 ns for nonlinear GD, which represents a 40% reduction.

In FIG. 6C one sees a comparison between recovered input signal using AST with the original input signal. The input signal and signal recovered with AST utilizing an 8 GHz ADC overlay one another, showing the true reproduction of the input signal at a reduced sample rate. However for comparison, an upper dashed line can be seen which illustrates capturing the input signal, without AST, using same 8 GHz ADC. This figure illustrates that using AST, the input signal can be captured accurately with an ADC that has lower bandwidth than the input signal. In both cases of using the 8 GHz ADC, modulation bandwidth is reduced from 1 THz to 8 GHz, however, the temporal length, and hence the number of samples needed to represent it, is nearly 40% lower with AST. It should also be appreciated that AST minimizes record length in comparison to the case of using a filter with linear GD.

Figure 7A:
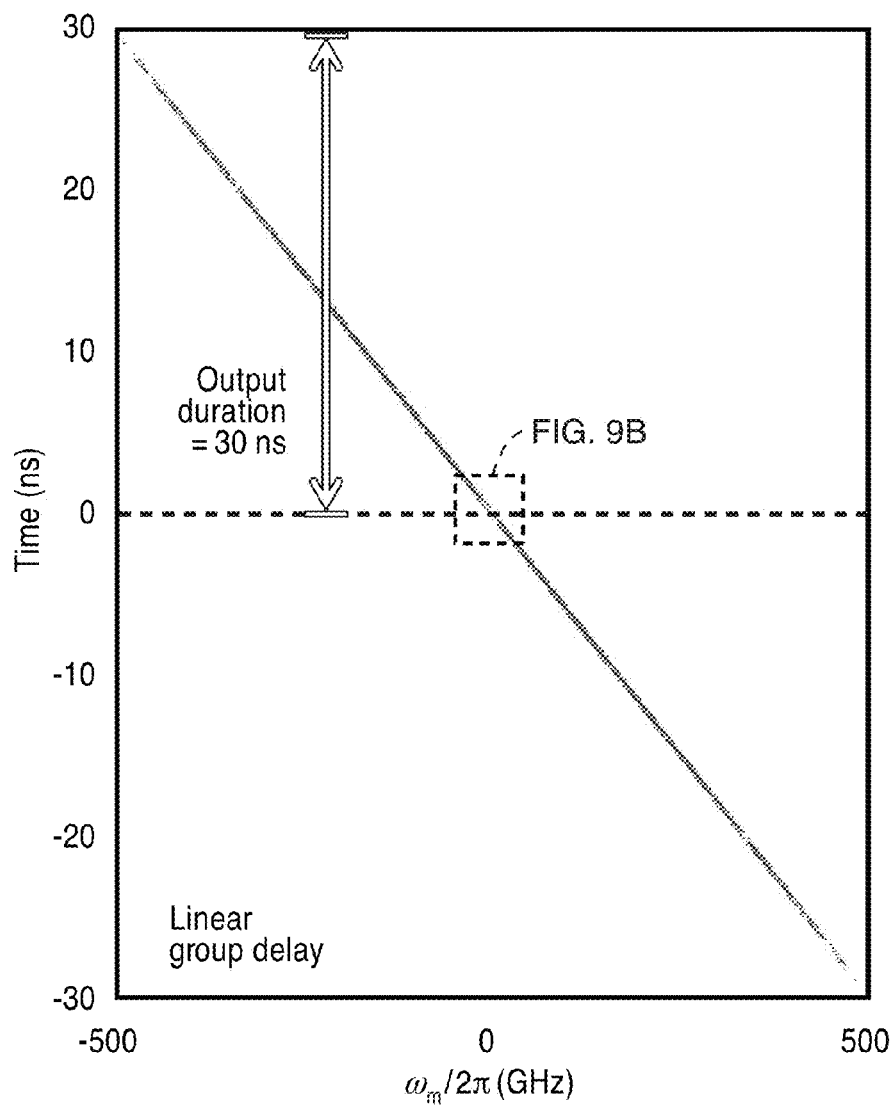
FIG. 7A through FIG. 7D are group delay plots comparing linear and non-linear group delay according to an embodiment of the present invention.
Figure 7B:
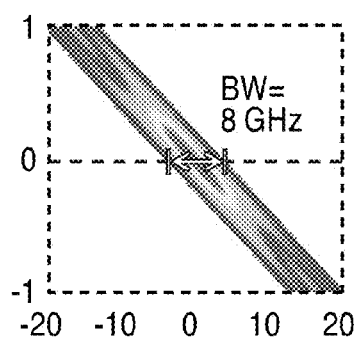
Figure 7C:
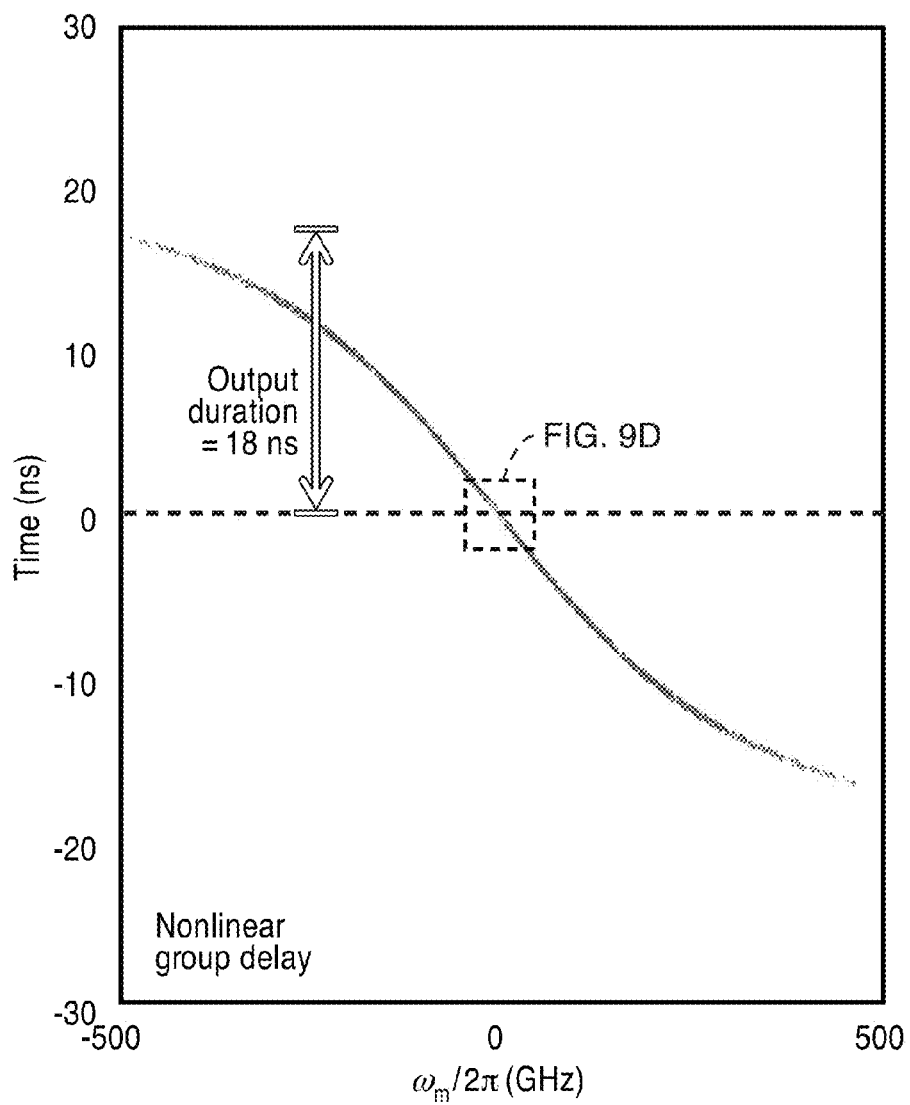
Figure 7D:
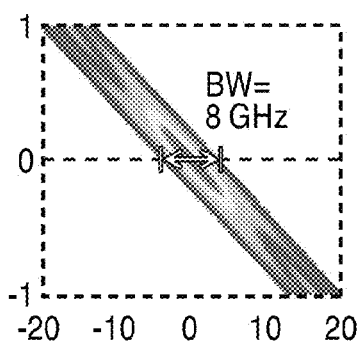

FIG. 7A and FIG. 7C depict plots of stretched modulation distribution ($S_M$) plots for the linear GD and nonlinear (S-shaped) GD, respectively, with FIG. 7C and FIG. 7D showing $S_M$ plots for FIG. 7A, FIG. 7C, respectively, which both having a bandwidth of 8 GHz. It will be noted that in FIG. 7A, one sees the resultant output duration of 30 ns depicted for the vertical arrow, while in FIG. 7C one sees an output duration of 18 ns.

These $S_M$ plots were used to design and analyze the optimized bandwidth compression system in this demonstration. The distribution is characterized by a well-defined, sharp, trajectory because the system is operating in the far field.

4. Near Field Regime

As another demonstration of the present invention, an optimum GD profile is described for time-bandwidth compression using a filter operating in the near field. This would be important for cases where far field regime cannot be achieved because of insufficient available GD or limited bandwidth of the input signal.

The filter transfer function is chosen such that for frequency components ranging from DC to 8 GHz a larger GD is applied to higher frequencies than the case of linear GD. The GD for frequency components above 8 GHz is designed to be less than the case of linear GD. This is because to achieve the same output modulation bandwidth, less group delay is required for fast features. Specifically, the chosen parameters for the group delay profile of the filter given by Eq. (7) is A=3.14×10$^{-9}$ seconds and B=2.7×10$^{-11}$ seconds.

Figure 8A:
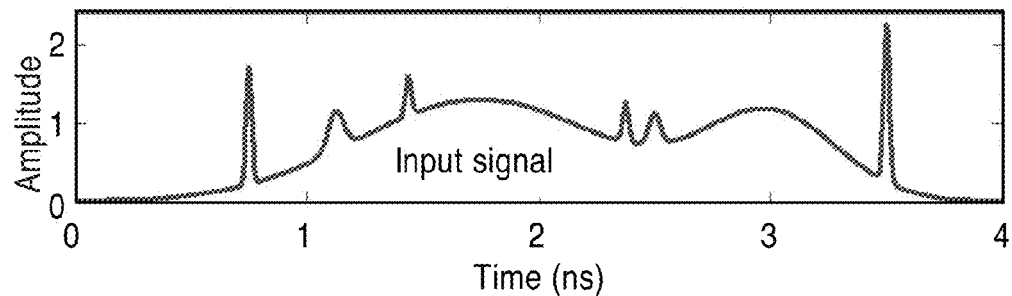
FIG. 8A and FIG. 8B are plots of input signal and modulation utilized according to an embodiment of the present invention.
Figure 8B:
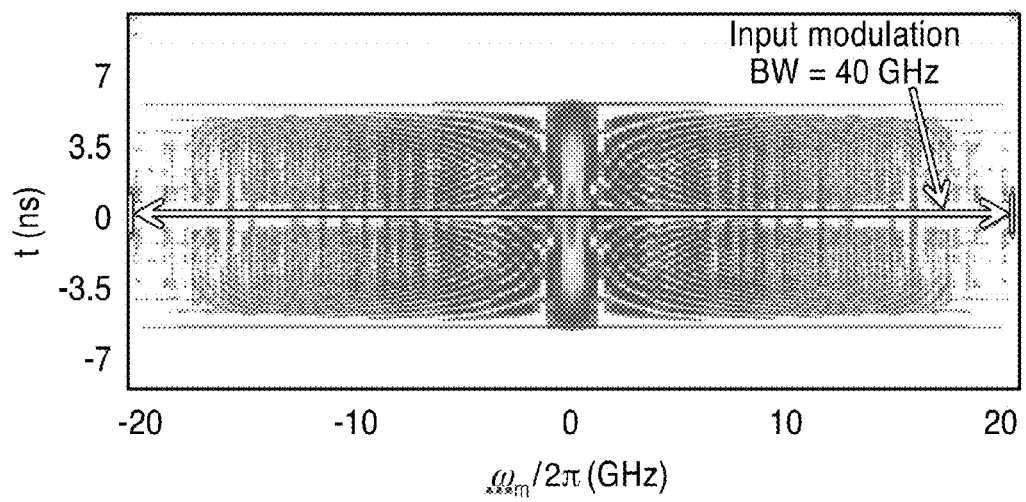

FIG. 8A and FIG. 8B depict an example input signal having a time duration of 4 ns seen in FIG. 8A, and a modulation bandwidth of 40 GHz (field bandwidth 20 GHz) seen in the input signal $S_M$ of FIG. 8B. Utilizing the present invention, this input signal modulation bandwidth is compressed from 40 GHz to 16 GHz, representing a compression factor of 2.5.

Figure 9:
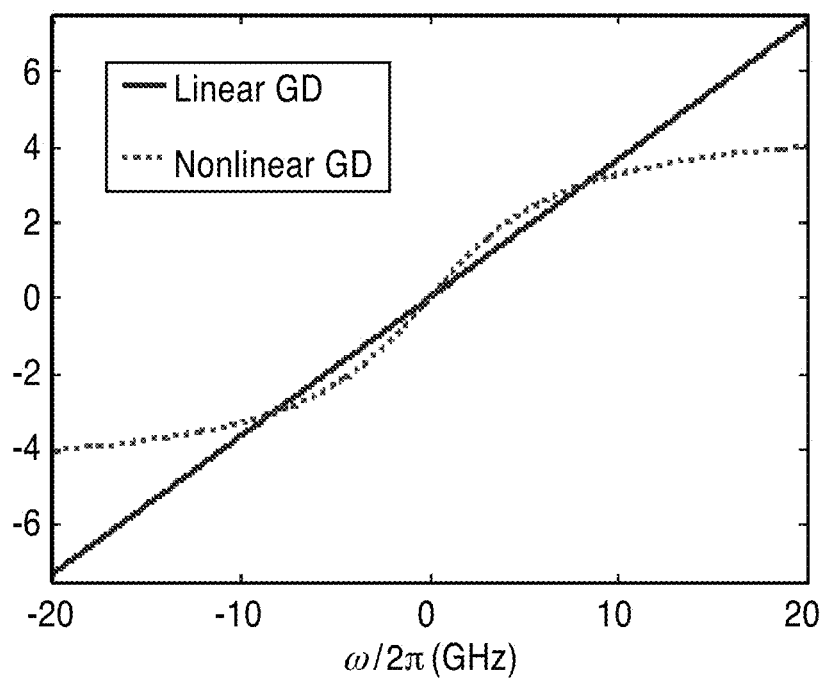
FIG. 9 is a plot comparing use of linear and nonlinear group delay within an embodiment of the present invention.

FIG. 9 compares the nonlinear GD used with a linear GD that would have resulted in the same 16 GHz output modulation bandwidth.

Figure 10A:
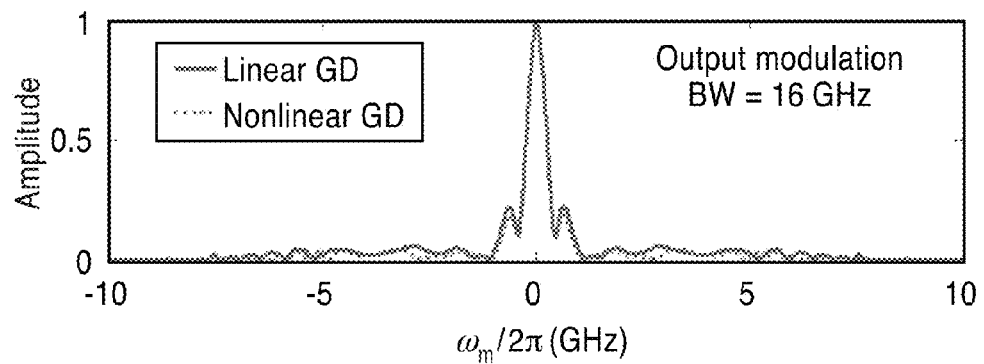
FIG. 10A through FIG. 10D are plots of near field AST outputs generated according to an embodiment of the present invention.
Figure 10B:
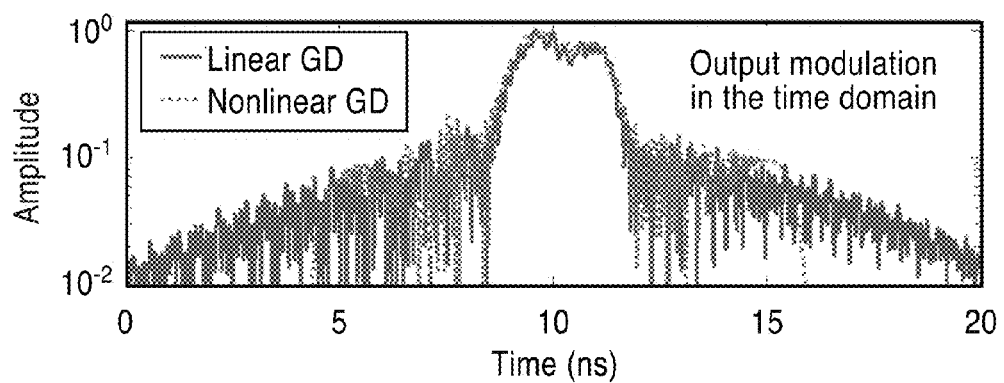
Figure 10C:
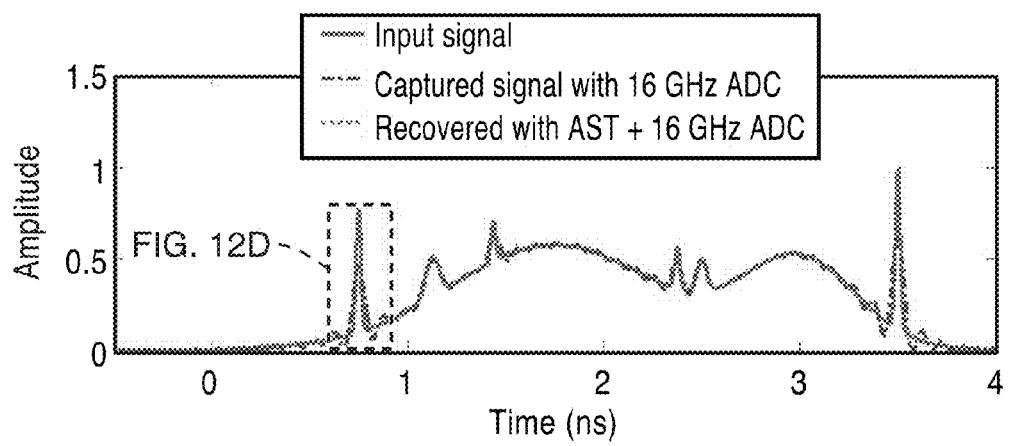
Figure 10D:
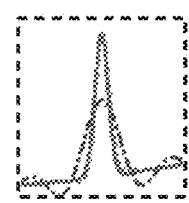

FIG. 10A through FIG. 10D illustrate the results of using AST in this near field example, in which utilizing nonlinear GD results in a smaller time duration. As seen in FIG. 10A, modulation bandwidth is 16 GHz in both cases, represented by the curves shown substantially overlapping. However, the temporal duration seen in FIG. 10B, shows a reduction from about 20 ns (full scale range) to approximately 13 ns (between about 4 ns to 17 ns) when using AST in this manner, resulting in about a 35% reduction in time (signal duration). FIG. 10C compares the recovered input signal using the AST method with the original input signal, while the captured signal with the same 16 GHz ADC but without AST is also shown. FIG. 10D depicts a magnified signal relationship at a fast transition, making it easier to discern that the recovered signal with AST and 16 GHz ADC fully tracks the input signal, while the signal captured with 16 GHz ADC, but no AST, fails to reproduce the input signal at the fast transitions. Accordingly, the figure indicates that using AST, the input signal can be captured accurately with an ADC that has lower bandwidth than the input signal. AST also minimizes the record length for bandwidth compression in comparison to the case of using a filter with linear GD.

Figure 11A:
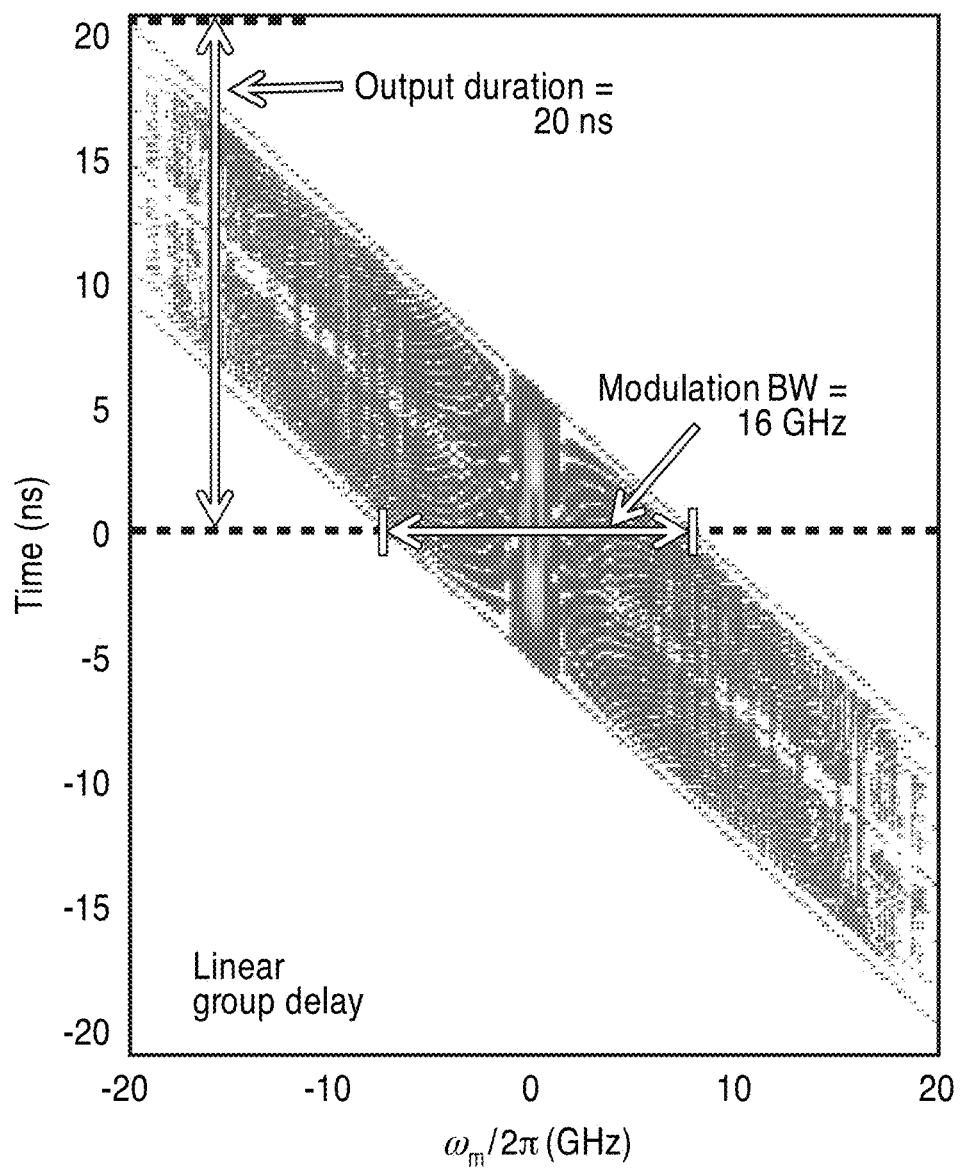
FIG. 11A and FIG. 11B are plots of stretched modulation distribution ($S_M$) for linear and nonlinear group delay utilized according to an embodiment of the present invention.
Figure 11B:
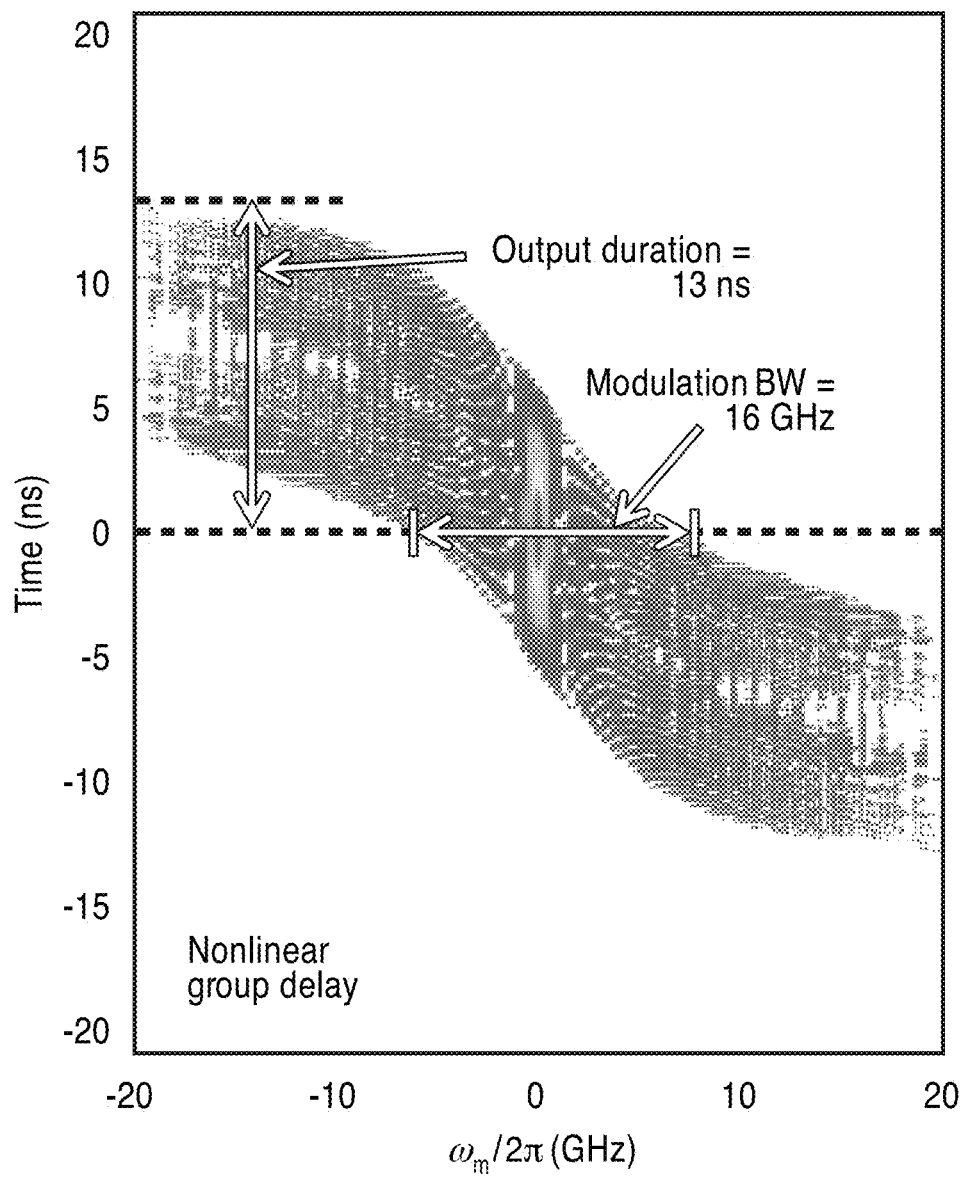

FIG. 11A and FIG. 11B depict stretched modulation distribution ($S_M$) for the linear GD in FIG. 11A showing output duration of 20 ns, and for a nonlinear GD in FIG. 11B showing output duration of 13 ns. These plots were used to identify the optimum GD profile. It should be appreciated that the complex interference patterns seen in the $S_M$ plots arise because the system is operating in the near field.

5. Discussion

AST can be considered a generalized (or nonlinear) time-wavelength mapping. It reduces the modulation bandwidth so the signal can be captured with an ADC having a bandwidth that would otherwise be insufficient. At the same time, it minimizes the number of samples needed for a digital representation of the signal; in other words, it reduces the record length or the digital data size. A valid question is whether this time-bandwidth compression results in a loss of information. As a consequence of AST, a portion of the information contained in the signal modulation is transferred into the phase of the carrier. Hence, no information is lost and the compression is lossless. However, because some of the information is now contained in the signal phase, complex field detection is necessary in order to recover the original signal.

AST uses an all-pass filter to add phase shift to the input signal, the amount of which increases with frequency in a prescribed manner. The stretched modulation distribution ($S_M$) shows that, in order to compress the time-bandwidth product, the filter must have a nonlinear group delay profile, with proper slope at the origin (at carrier central frequency). The slope at the origin is inversely proportional to modulation bandwidth. The relation between the filters with linear and nonlinear GDs can be represented by an all-pass filter with a rational polynomial function. In the region of interest, close to the origin, the lowest order polynomial gives the $\tan^{-1}$ function in Eq. (7).

A tailored dispersion profile can be obtained by a number of techniques, such as chirped fiber Bragg grating (CFBG) with custom chirp, chromo modal dispersion (CMD) or diffraction gratings. CFBG offers great flexibility in dispersion profile and low insertion loss. However, CFBG exhibits problematic group delay ripples which can be mitigated in the present invention utilizing known techniques.

6. Experimental Demonstration

Figure 12A:
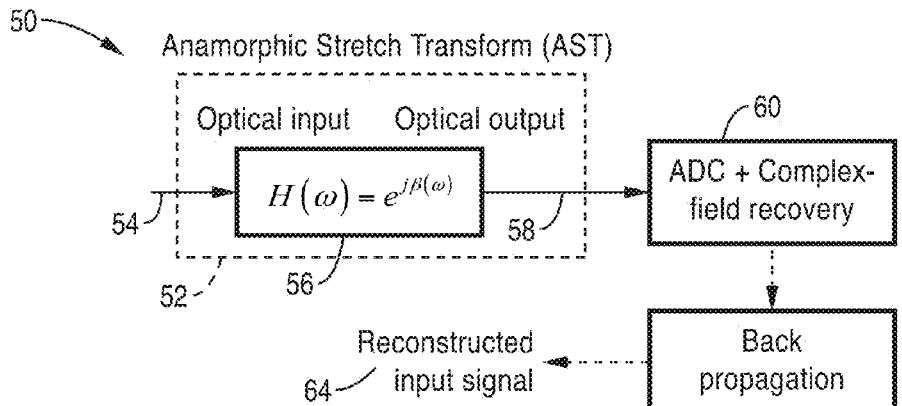
FIG. 12A through FIG. 12C are block diagrams of optical data compression including AST according to at least one embodiment of the present invention.
Figure 12B:
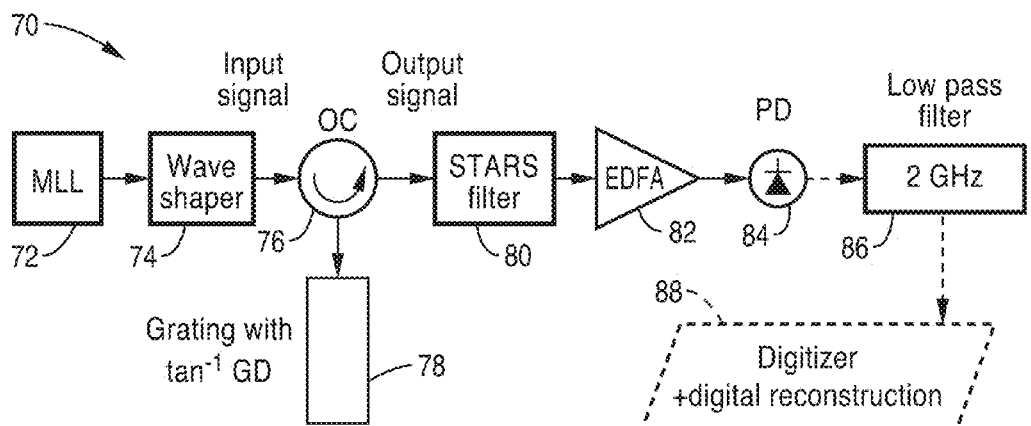
Figure 12C:
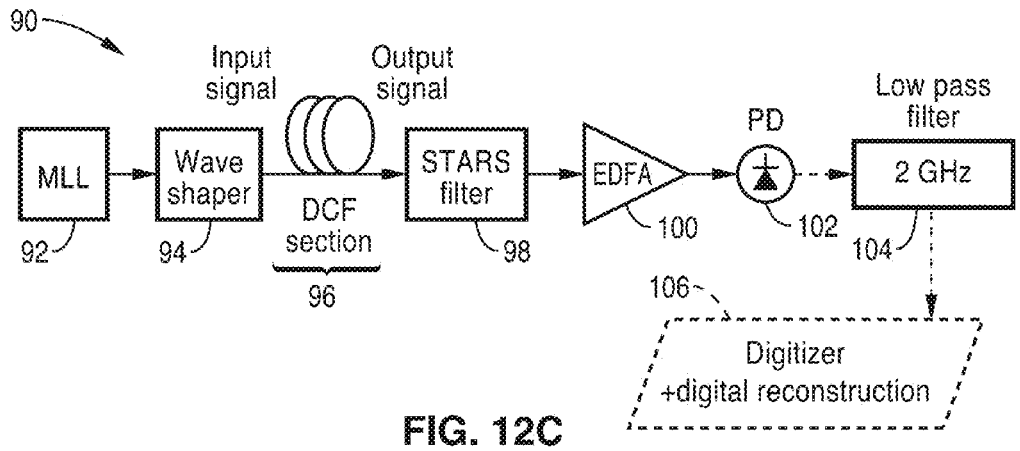

FIG. 12A through FIG. 12C illustrate example embodiments 50, 70, 90 used for demonstrating comparative modulation bandwidth and signal duration.

In FIG. 12A, an anamorphic stretch transform (AST) embodiment 50 is shown. AST is a physics-based signal transformation that enables a digitizer to capture signals that would otherwise be beyond its bandwidth, while at the same time compressing digital data volume. AST makes it possible to (i) capture high-throughput random signals in real-time and (ii) to alleviate the storage and transmission bottlenecks associated with the resulting big data. It does so by compressing the time-bandwidth product. The block diagram of an AST system 50 in FIG. 12A shows an AST block 52 receiving an optical input signal 54 upon which the transform $H(\omega)=e^{j\beta(\omega)}$ 56 is performed and outputting optical output 58 which can be stored or communicated, prior to being received for ADC and complex field recovery 60, followed by back propagation 62, to generate an output 64 which reconstructs the original input signal.

In FIG. 12B and FIG. 12C are demonstration embodiments 70 and 90 for demonstrating the difference between use of a linear versus nonlinear GD. The experiments compare time-bandwidth of the signal for FIG. 14B nonlinear (inverse tangent) group delay (GD) and FIG. 12C for a linear group delay, and the results validate the time-bandwidth compression using the specifically designed nonlinear GD. The specific GD profile was obtained using the $S_M$ function, see Eq. (6).

The nonlinear GD in the experimentally realized embodiment 70 of FIG. 12B uses a mode-locked laser (MLL) 72 coupled to a waveshaper 74 to generate the input signal to an optical circulator (OC) 76 coupled to a custom chirped fiber Bragg grating 78. The output signal from the custom chirped Bragg grating is received at a STARS filter 80 followed by an Erbium-doped fiber amplifier (EDFA) 82, prior to detection at a photodiode (PD) 84, filtering at low-pass filter 86, and final processing with digitizing and digital reconstruction 88. In practice, the output of the STARS filter consists of two outputs 20a and 20b shown in FIG. 2.

The linear GD in the demonstration embodiment 90 in FIG. 12C uses the same input and output elements, but with a dispersion compensating fiber (DCF) 76, instead of the custom-chirped fiber Bragg grating. Thus, the linear GD circuit is seen with mode-locked laser (MLL) 92 coupled to waveshaper 94 to generate the input signal to a dispersion compensating fiber (DCF) 96, which outputs a STARS filter 98 followed by an Erbium-doped fiber amplifier (EDFA) 100, prior to detection at a photodiode (PD) 102, filtering at low-pass filter 104, and digitization and digital reconstruction 106.

It will be appreciated that reconstruction of the input signal from the measured waveforms to generate a reconstructed output, requires complex-field recovery followed by digital back-propagation technique as seen in FIG. 12A through FIG. 12C. The STARS technique was utilized for complex field measurement, although it should be appreciated that other complex field recovery methods can be utilized without departing from the teachings of the present invention.

The following describes a demonstration of the present invention in which the input signal electrical bandwidth was compressed from 1 THz to 2 GHz, providing a compression factor of 500. The input signal for the demonstration was generated using a mode-locked laser (MLL) and an optical waveshaper (e.g., Finisar® 1000s).

Figure 13A:
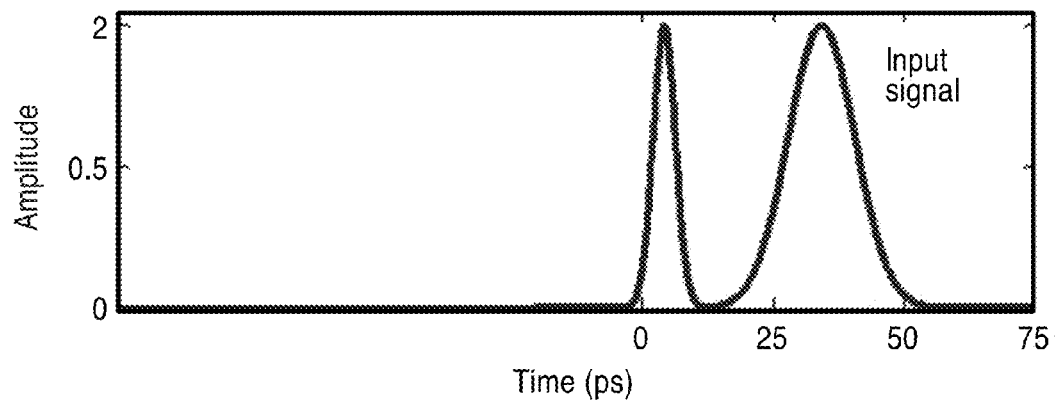
FIG. 13A and FIG. 13B are plots of input signal and spectrum utilized in a demonstration of AST according to an embodiment of the present invention.
Figure 13B:
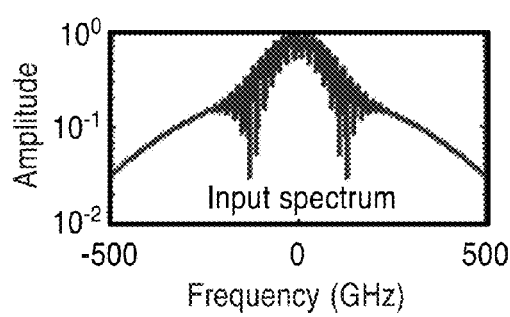

FIG. 13A and FIG. 13B illustrate an input signal designed using numerical simulation. The complex spectrum obtained from simulation was programmed into the waveshaper to produce the physical input to the experiment. The input signal has a field modulation bandwidth of 1 THz and duration of 50 ps as seen in FIG. 13A, with its field spectrum shown in FIG. 13B.

To show the effectiveness of the present invention, the AST is compared using filters with linear GD to the case of nonlinear, in particular, inverse tangent ($\tan^{-1}$) GD. The linear case, in the far field, corresponds to the well-known time-stretch DFT.

Figure 14:
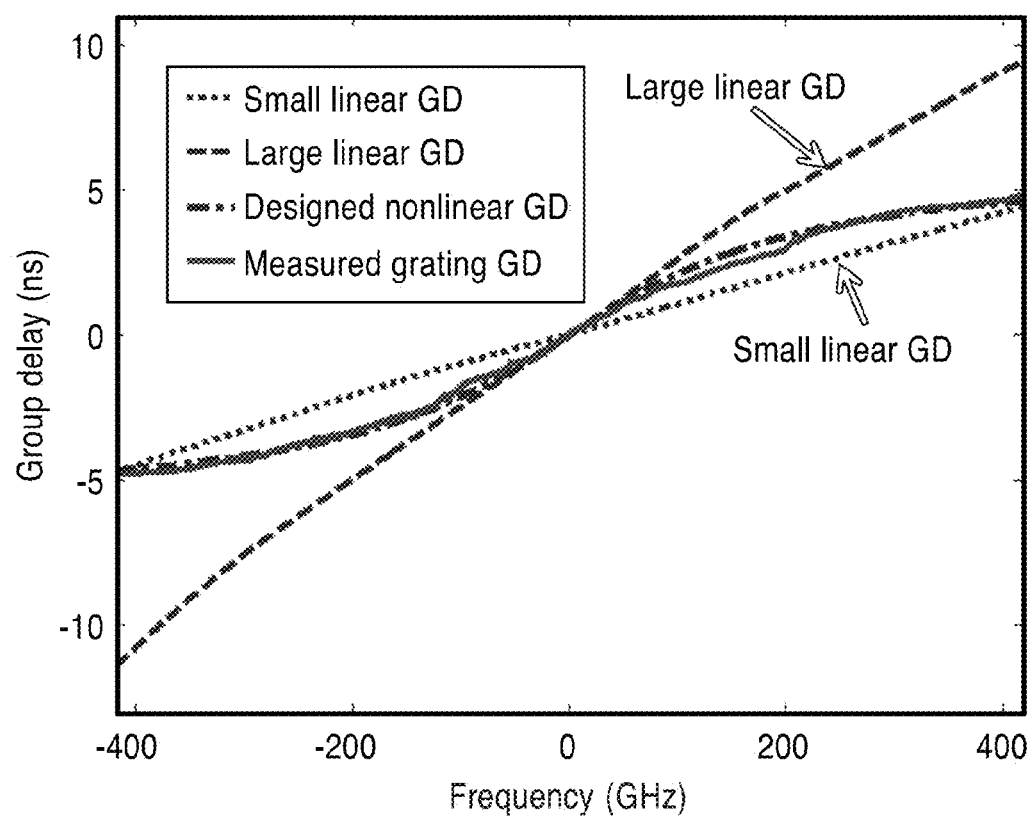
FIG. 14 is a plot comparing different linear group delays with nonlinear group delay utilized according to an embodiment of the present invention.

FIG. 14 depicts a comparison of small linear GD, large linear GD, designed nonlinear GD, and measured grating GD used in this demonstration. For time-bandwidth compression, AST was utilized with an inverse tangent profile GD, and these results were compared to those using linear GD, such as realized using dispersion compensating fiber (DCF) modules. Two different modules for linear GD were utilized comprising a "small GD" having a total GD equal to that of the AST filter, and a "large GD" having the same GD slope at the origin. Specifically, large GD was set at 25,600 ps² and small GD was set at 8,800 ps². For the inverse tangent group delay, the following profile was utilized:

$$\tau(\omega) = A \cdot \tan^{-1}(B \cdot \omega), \quad (8)$$

where $A = 5 \times 10^{-9}$ and $B = 8.7 \times 10^{-13}$ seconds. The AST filter utilized a sublinear GD, in particular a $\tan^{-1}$ GD, which was implemented using a CFBG with customized grating chirp profile. Referring to FIG. 14, it should be noted that the frequency axis is the frequency deviation. It will be noted that zero dispersion for the filter is seen at the origin of the plot, and is at the carrier frequency of the input signal.

Figure 15A:
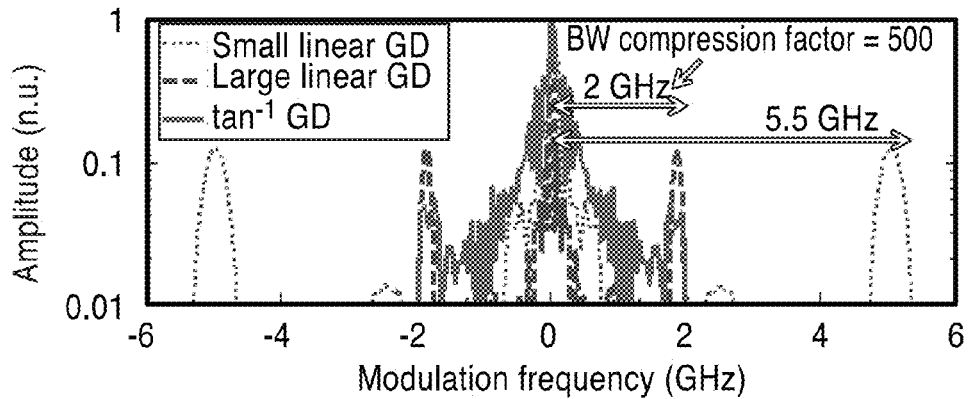
FIG. 15A through FIG. 15C are plots of modulation frequency and time for a demonstration of AST according to an embodiment of the present invention.
Figure 15B:
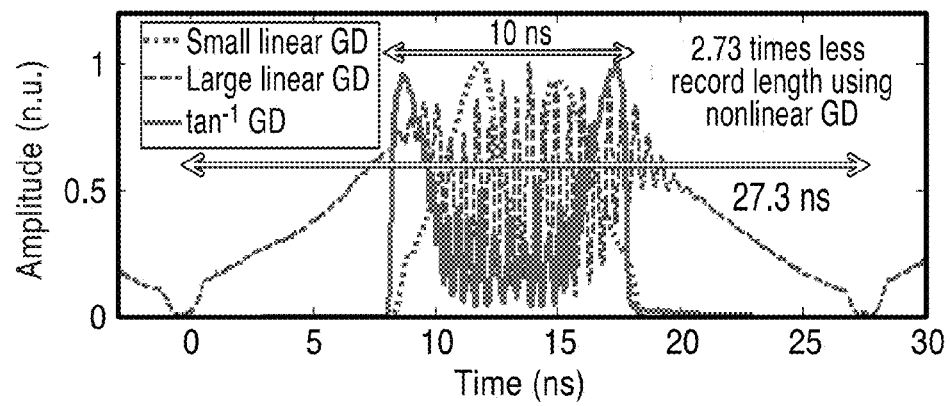
Figure 15C:
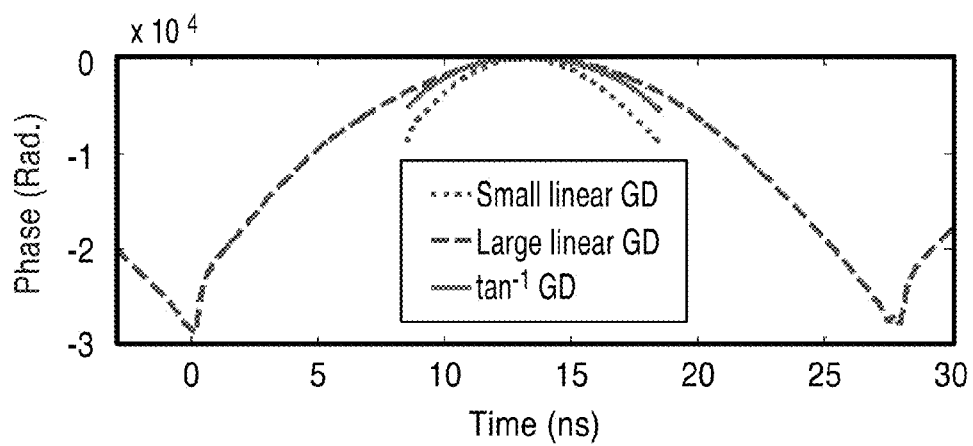

FIG. 15A through FIG. 15C depict comparisons of these different filter group delays (GD) described in the above demonstration. To show time-bandwidth compression, the results from AST compression were compared to those that use linear GD with small or large GD.

In FIG. 15A measured modulation intensity spectrums are compared between the two linear and one nonlinear GD associated with AST. In order to compare the true bandwidth of the waveforms, the 2 GHz low pass filter 86, 104 shown in FIG. 12B, 12C was not used in these measurements. As clearly seen, the electrical bandwidth in the case of using small GD is 5.5 GHz and in cases using large GD and inverse tangent GD was 2 GHz, which is the target electrical bandwidth.

In FIG. 15B the measured output temporal intensity profiles are compared. In this plot, the 2 GHz electrical low pass filter emulates a system with only 2 GHz analog input bandwidth. In the case of small GD, the output electrical bandwidth is 5.5 GHz, so after the 2 GHz low pass filter, the measured signal has lost its higher frequency features. In cases of large GD and inverse tangent GD, electrical bandwidths are reduced from 1 THz to the target 2 GHz. However the temporal length, and hence the number of samples needed to represent the signal, is 2.73 times smaller with the $\tan^{-1}$ GD, than with the large GD, thus clearly demonstrates the benefits of the inventive AST time-bandwidth compression.

In FIG. 15C, measured phase profiles of these demonstrations are compared. The dynamic range of the phase in the case of inverse tangent GD is seen being significantly less than that for large GD, and in fact being similar to that for small linear GD.

It should be noted that this reduction in time duration results in higher peak power making the detection easier. Also, that in the case of large linear GD, the loss of the dispersive element is about 18 dB compared to about 1 dB for the inverse tangent filter. In fact, to observe the signal in the case of large GD, the signal had to be averaged 4,000 times. Therefore, while the large GD results are equally effective in reducing electrical bandwidth, they provide a much lower signal to noise ratio (SNR) than the inverse tangent GD, and of course fail to provide time-bandwidth compression.

Figure 16A:
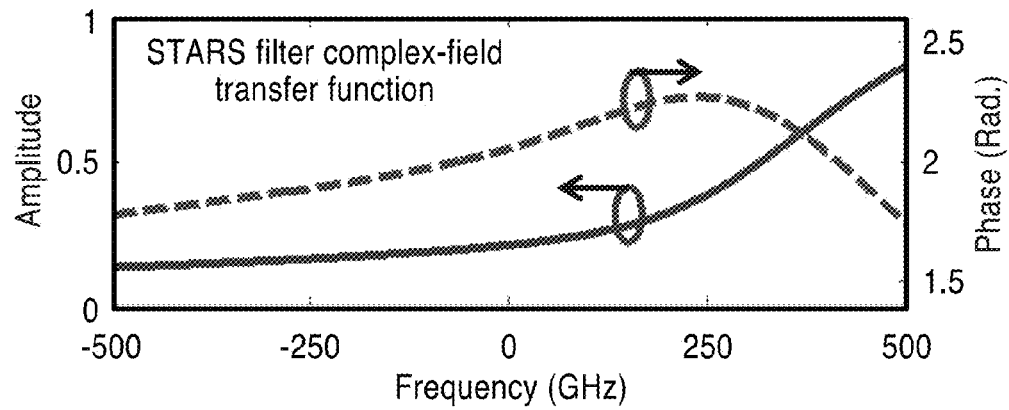
FIG. 16A through FIG. 16C are plots of spectral amplitude and phase of the filter used for phase recovery, measured time domain signals, and digitally recovered time domain signal, respectively, in a demonstration of complex field recovery according to an embodiment of the present invention.
Figure 16B:
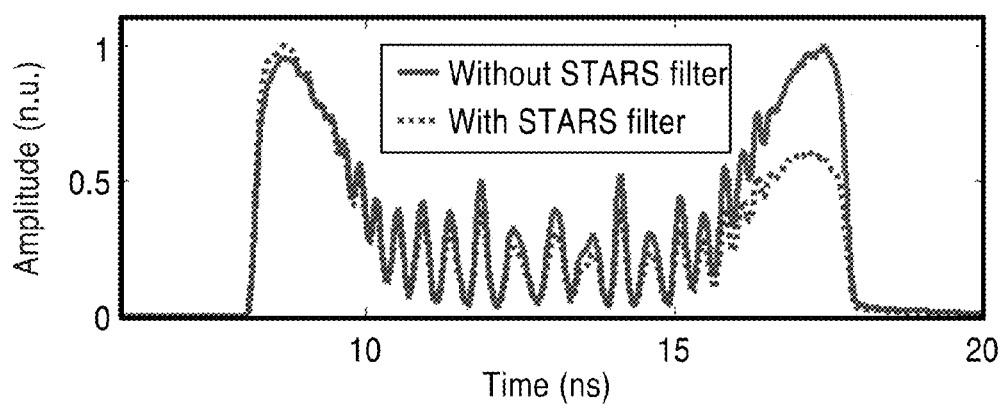
Figure 16C:
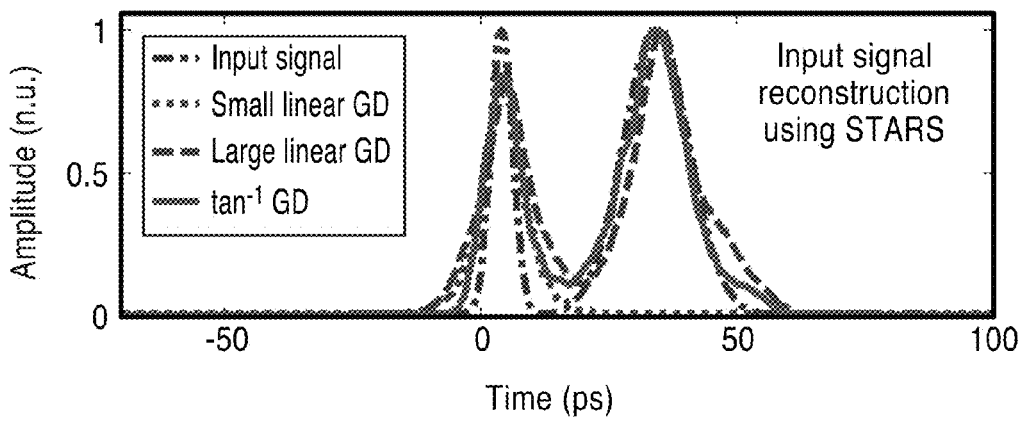

FIG. 16A through FIG. 16C depict spectral amplitude and phase responses associated with complex field recovery in the above demonstration. By way of example and not limitation, complex-field recovery utilized the STARS technique, with its spectral amplitude and phase response shown in FIG. 16A. FIG. 16B shows the oscilloscope traces of the two STARS outputs, for the $\tan^{-1}$ GD. As previously mentioned, in a practical circuit output of the STARS filter preferably consists of two outputs 20a and 20b shown in FIG. 2. The complex-field is recovered using these two measurements and the algorithm is known as the stereopsis reconstruction algorithm developed previously by the inventors (M. H. Asghari, B. Jalali, IEEE photonics journal, 2012). Using the complex field, the input signal is reconstructed utilizing digital back propagation. FIG. 16C compares the recovered input signal with the original signal programmed into the waveshaper. In the case of linear small GD, the input signal cannot be recovered because fast features are lost. In cases comparing large linear GD and $\tan^{-1}$ GD, the input signal is properly recovered, however, the temporal record length is 2.73 times smaller utilizing $\tan^{-1}$ GD. As noted earlier, the large losses in the case of large GD also necessitated signal averaging. Therefore, the results for this case are not real-time.

7. Implementations of AST for Time Bandwidth Compression

Figure 17A:
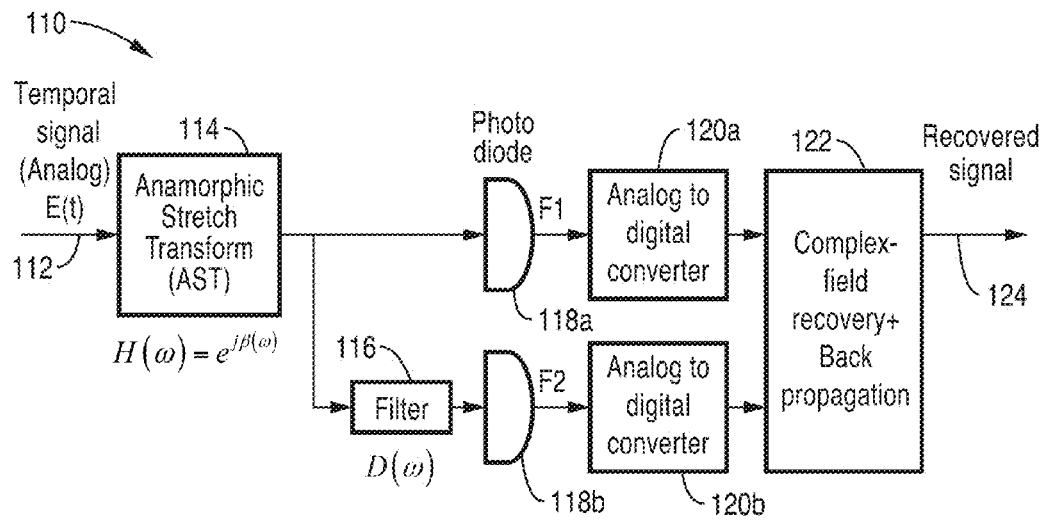
FIG. 17A through 17C are block diagrams of AST systems according to embodiments of the present invention.
Figure 17B:
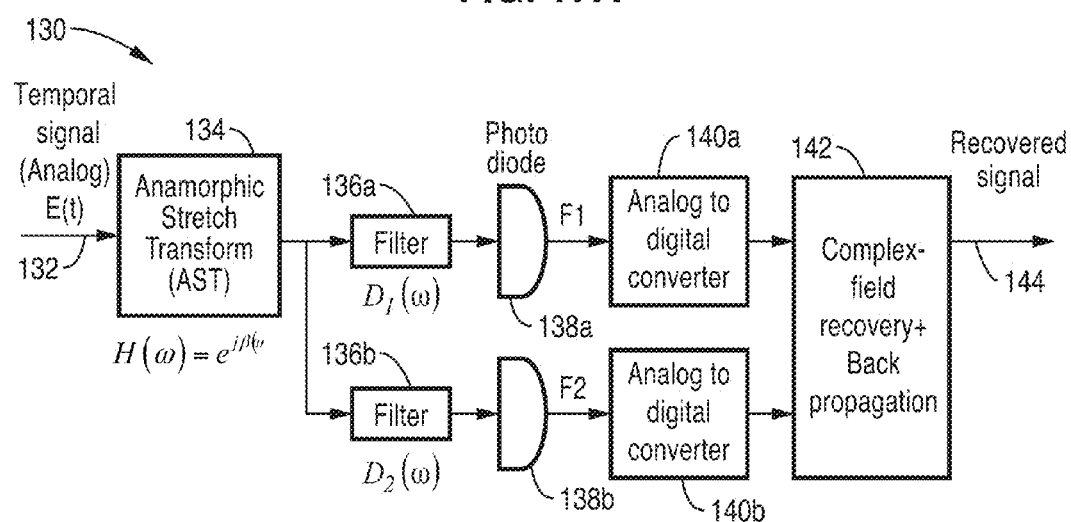
Figure 17C:
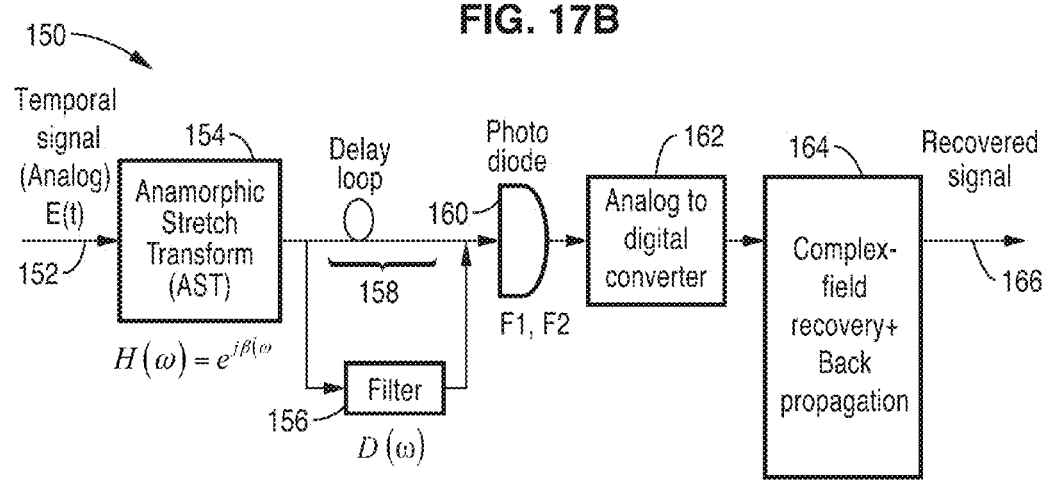

FIG. 17A through FIG. 17C illustrate different example embodiments 110, 130, 150 for performing the inventive anamorphic stretch transform (AST), and more particularly, different methods for implementing phase recovery.

In example embodiment 110 of FIG. 17A an analog temporal signal 112 is received by an AST filter 114 which compresses the time-bandwidth product. Output from AST 114 is split for two intensity measurements. A non-filtered output is received at a first optical detector (e.g., photodiode) 118a, while a second portion of the output is filtered 116, using a phase discriminator filter D(ω), before detection at a second optical detector 118b. Outputs from each optical detector are then converted to digital in ADCs 120a, 120b, before both signals are received into a module 122 for performing complex field recovery and back propagation in the digital domain and generating a recovered signal 124.

Example embodiment 130 in FIG. 17B is similar to that of FIG. 17A, yet utilizes a filter for each portion of the AST output prior to detection. In particular, analog signal 132 is received for AST 134, and output to two filters 136a, 136b, before detection by optical detectors 138a, 138b, then ADC conversion 140a, 140b, and complex field recovery and back propagation 142 to generate reconstructed output 144. The filters 136a, 136b, comprise phase discriminator filters $D_1(\omega)$ and $D_2(\omega)$.

Example embodiment 150 In FIG. 17C is similar to the above, yet utilizes a delay line along one portion of the signal output from the AST filter. More specifically, analog signal 152 is received for AST 154, and output to a first filter 156, and in parallel to an optical delay line 158, prior to detection by a single optical detector 160, and ADC 162. Complex field recovery and back propagation 164 is performed on ADC output to generate a reconstructed output 166. For complex field recovery the output of the AST filter is interleaved with the output of the AST filter cascaded with discriminator filter D(ω) 156. Thus, the time delay associated with the optical delay should be sufficiently long so that the two waveforms do not interfere. In this scheme, only one analog to digital converter (ADC) for intensity detection is required.

8. Digital Implementation of AST for Data Compression

Figure 18B:
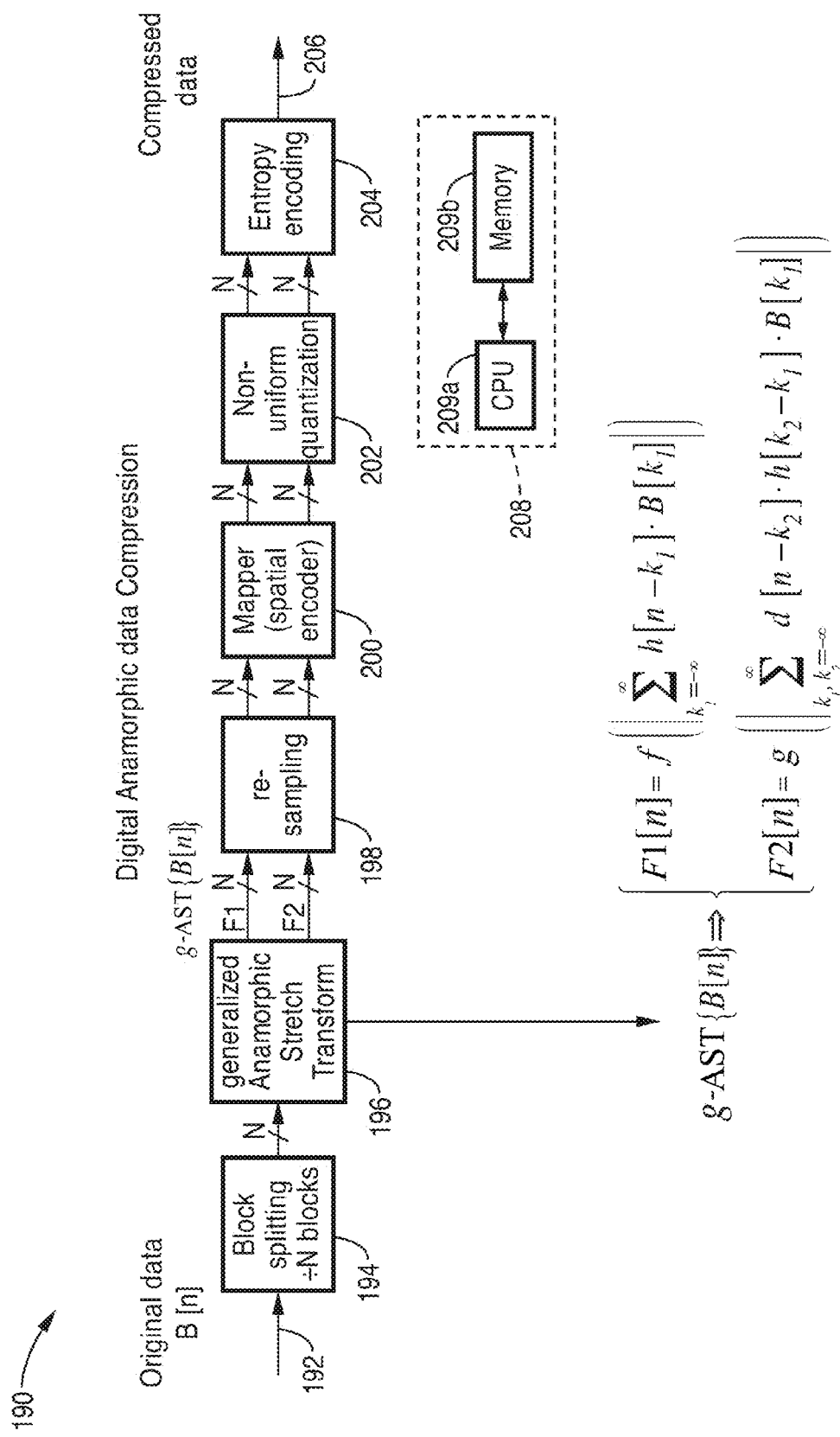

FIG. 18A and FIG. 18B illustrate example embodiments 170, 190 comparing analog and digital AST. Embodiment 170 in FIG. 18A illustrates analog temporal AST operation. This is as shown previously with signal 172 is received by AST filter 174, output in parallel through a non-filtered output received at a first optical detector 180a, with a second portion filtered 178, such as using a phase discriminator, before detection at a second optical detector 180b. Optical detector output is ADC converted 182a, 182b, before both signals are received into a module for performing complex field recovery and back propagation 184 in the digital domain to generate a recovered signal 186.

Embodiment 190 in FIG. 18B illustrates digital AST compression operation. Original data B[n] 192 is received for block splitting 194, followed by the generalized AST (g-AST) 196 with the equation shown in the figure. It will be noted that FIG. 18B also shows the mathematical generalization of AST known as g-AST:

$$g\text{-}AST\{B(t)\} = \tag{9a}$$

$$\begin{cases} F1(t) = f\left(\left|\int_{-\infty}^{\infty} h(t-t_1) \cdot B(t_1) \cdot dt_1\right|\right) \\ F2(t) = g\left(\left|\int_{-\infty}^{\infty} d(t-t_1) \cdot \int_{-\infty}^{\infty} h(t_1-t_2) \cdot B(t_2) \cdot dt_2 dt_1\right|\right) \end{cases}$$

where B(t) is the input data, $h(t-t_1)$ is the g-AST kernel, $d(t-t_1)$ function is required for phase recovery and f(x) and g(x) are arbitrary injective functions for x≥0. The analog formula for g-AST operation can also be represented in the discrete-time domain as follow:

$$g\text{-}AST\{B[n]\} \Rightarrow \tag{9b}$$

$$\begin{cases} F1[n] = f\left(\left|\sum_{k_1=-\infty}^{\infty} h[n-k_1] \cdot B[k_1]\right|\right) \\ F2[n] = g\left(\left|\sum_{k_1,k_2=-\infty}^{\infty} d[n-k_2] \cdot h[k_2-k_1] \cdot h[k_2-k_1] \cdot B[k_1]\right|\right) \end{cases}$$

In one embodiment of the present invention, the generalized anamorphic stretch transform g-AST assumes that f(x) and g(x) in Eq. (9a) are powers of x, whereby this results in the following:

$$g\text{-}AST\{E(t)\} = \begin{cases} F1(t) = \left|\int_{-\infty}^{\infty} e^{j\Phi(t-t_1)} \cdot E(t_1) \cdot dt_1\right|^N \\ F2(t) = \left|\int_{-\infty}^{\infty} d(t-t_1) \cdot \int_{-\infty}^{\infty} e^{j\Phi(t_1-t_2)} \cdot E(t_2) dt_2 dt_1\right|^N \end{cases} \tag{10}$$

where N is an integer and N≠0.

Considering the specific case in which N=2, this approach is referred to as an anamorphic stretch transform (AST). AST has the property that it is also described in the frequency domain with a simple formula given by Eq. (4b).

Outputs F1 and F2 are then received for resampling 198, mapping 200 (e.g., spatial encoder), non-uniform quantization 202, and finally entropy encoding 204 to generate compressed signal 206.

One of ordinary skill in the art will appreciate that the blocks shown in FIG. 18A (and digital processing blocks represented in other figures herein) represent functional processing stages, and that the device need not have physical modules or specific circuits dedicated to performing these functions. In at least one embodiment, a computer processing element 208, such as containing at least one computer processor 209a and memory 209b capable of storing and executing programming, is preferably utilized for performing these data compression steps. It should be appreciated that other embodiments of the present invention which perform digital processing can be similarly configured with a computer processor, or other forms of digital circuitry capable of performing these functions/computations, or combinations of one or more processors and other digital circuitry.

Figure 19A:
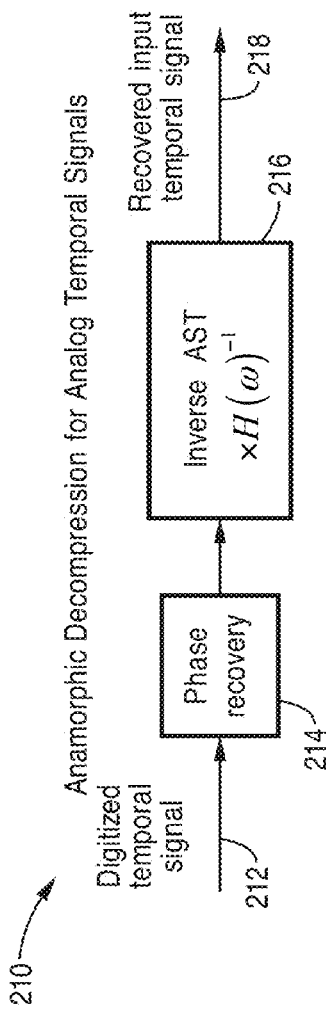
FIG. 19A and FIG. 19B are block diagrams comparing analog and digital AST decompression according to embodiments of the present invention.
Figure 19B:
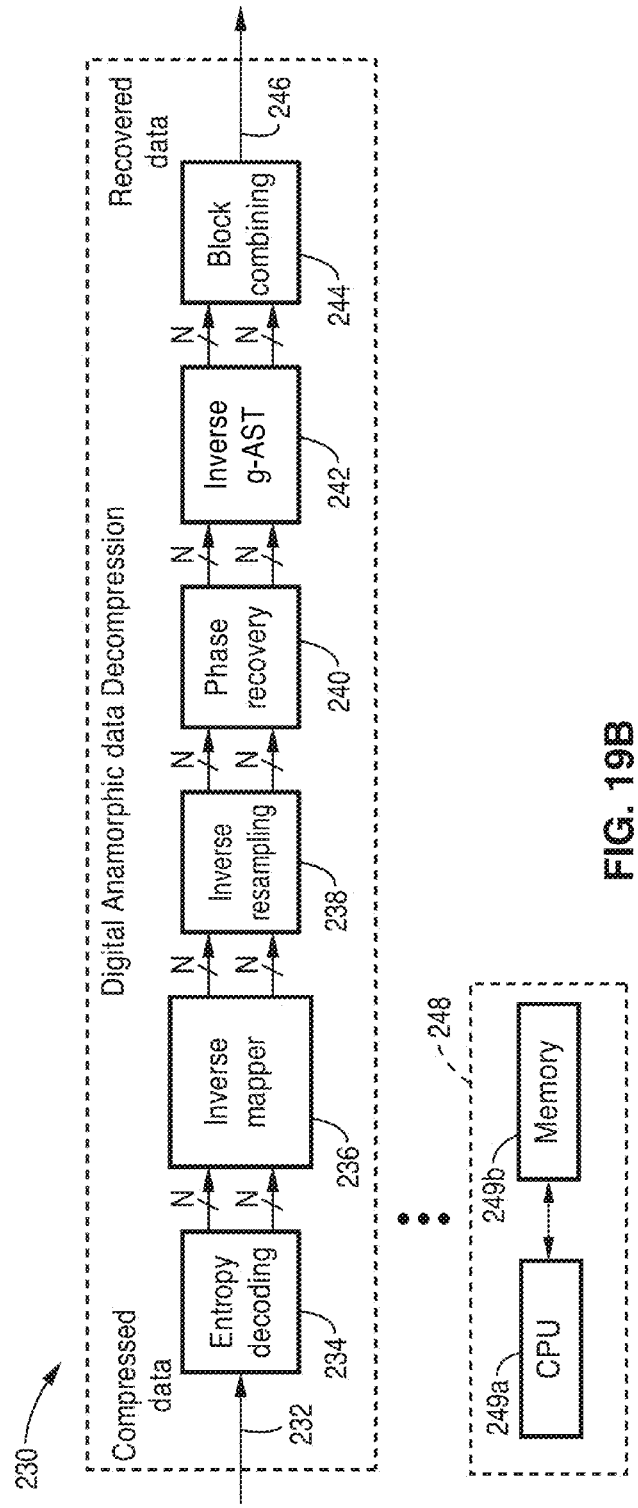

FIG. 19A and FIG. 19B illustrate example embodiments 210, 230 comparing analog and digital AST decompression. In FIG. 19A, an analog temporal signal is decompressed. A digitized temporal signal 212 is received for phase recovery 214, followed by an inverse AST 216 which generates the temporal signal of the recovered input 218. In FIG. 19B data 232 is decompressed in response to entropy decoding 234, inverse mapping 236, inverse resampling 238, phase recovery 240, inverse g-AST 242, and block combining 244 to output recovered data 246. In at least one embodiment, a computer processing element 248, such as containing at least one computer processor 249a and memory 249b capable of storing and executing programming, is preferably utilized for performing these data decompression steps.

Figure 20A:
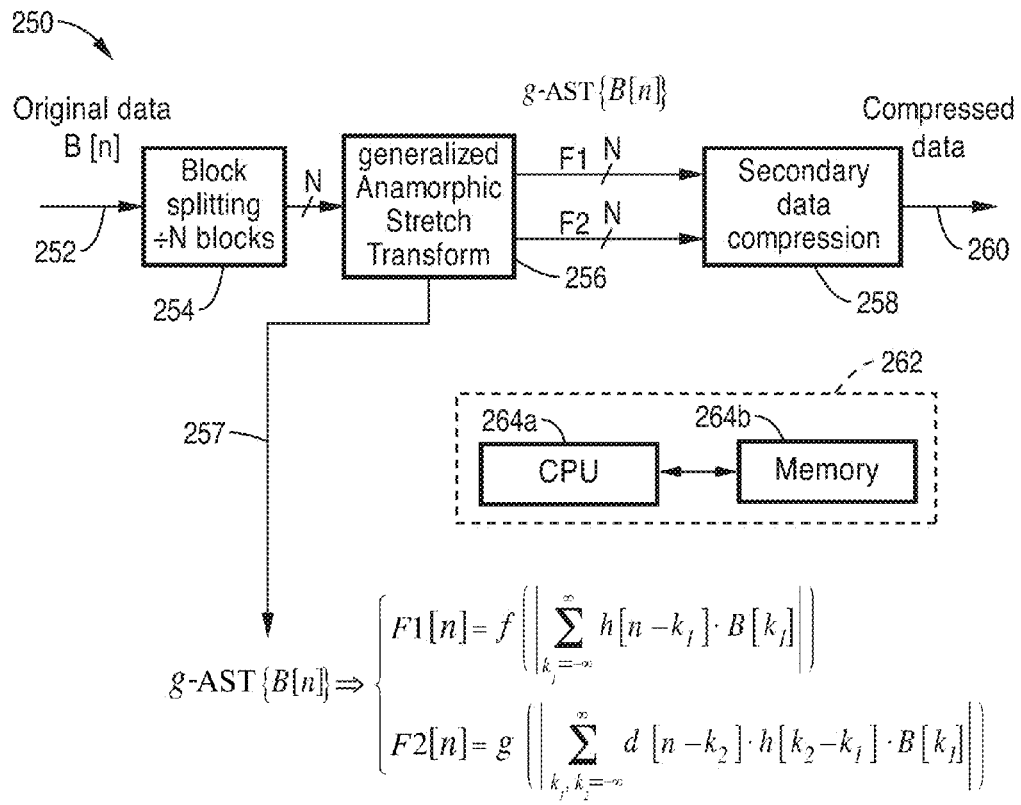
FIG. 20A and FIG. 20B are block diagrams of secondary compression/decompression utilized in combination with AST compression/decompression according to an embodiment of the present invention.
Figure 20B:
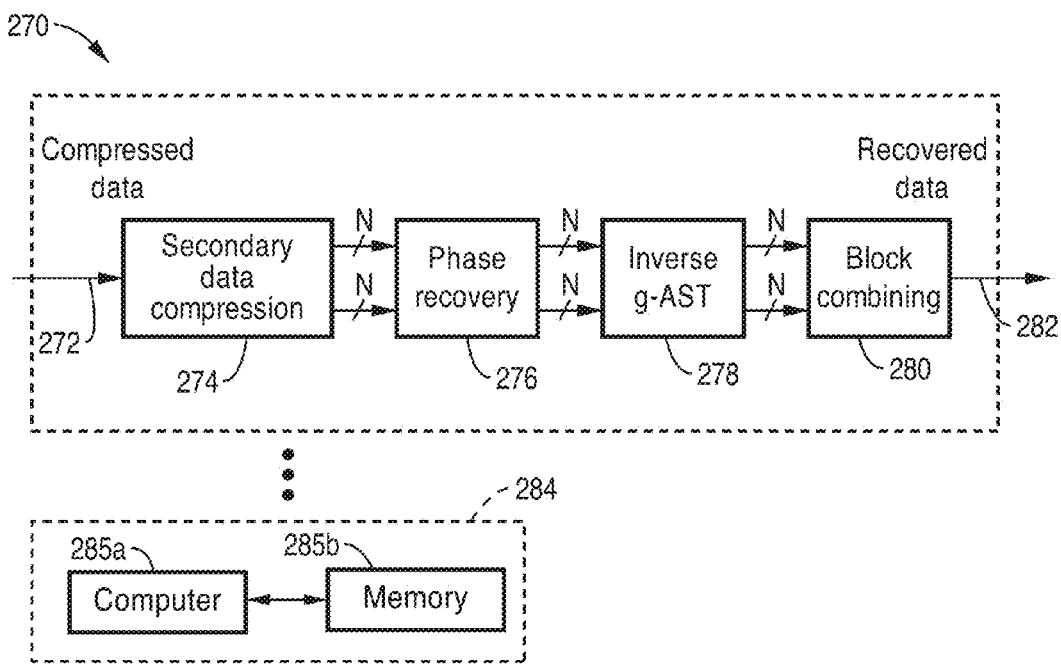

FIG. 20A and FIG. 20B illustrate example embodiments 250, 270 compression and decompression, respectively, utilizing AST compression in combination with a secondary compression method. In FIG. 20A compression is seen being performed first by AST, depicted as digitally splitting the blocks 254 of digital data 252, followed by g-AST 256, exemplified as determined according to equation 257, whose output is then subject to secondary compression 258 from which the compressed data 260 is generated. A processing element 262 is shown with computer processor 264a (e.g., digital signal processor), and memory 264b for executing the digital steps represented in FIG. 20A.

It should be appreciated that secondary compression may comprise one or more compatible compression techniques, and is not limited to a single form of compression. In this embodiment, g-AST is combined with secondary data compression to improve compression factor, or perform faster compression with the same quality, or to provide improved compression quality. The secondary data compression method may include, but is not limited to ZIP, RAR, Tar, Snappy, and other similar data compression techniques.

In FIG. 20B decompression is seen performed by first performing secondary decompression 274 on compressed data 272, followed by phase recovery 276, inverse g-AST 278, and block combining 280 to output recovered data 282. A processing element 284 is shown with computer processor 285a (e.g., digital signal processor), and memory 285b for executing the digital steps represented in FIG. 20A.

Figure 21:
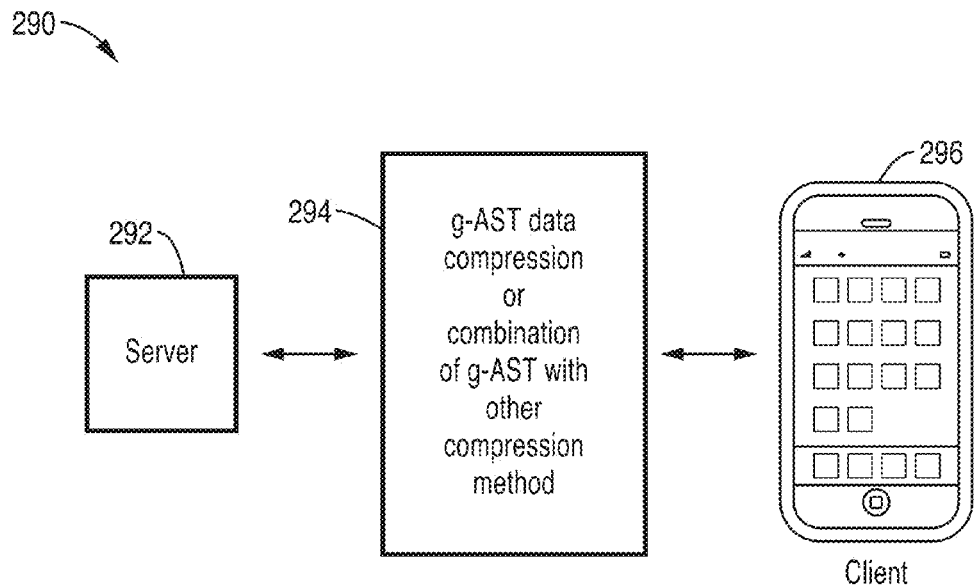
FIG. 21 is a block diagram of AST (g-AST) compression and decompression utilized between a client and server according to an embodiment of the present invention.

FIG. 21 illustrates an example embodiment 290 of g-AST compression and decompression to a web browsing and video streaming application. A server 292 is seen coupled to a means 294 for performing the inventive g-AST compression and decompression, between server 292 and one or more clients 296. It should be appreciated that the client may comprise any device connected to a network. It should also be appreciated that the AST compression/decompression means may be executed on server 292, on intermediary devices between server and client, on the client itself, or combinations thereof. It should also be appreciated that the means for performing g-AST preferably comprises programming for executing AST method steps on the server, or client, or on another accessible device containing a computer processor and memory.

9. AST Compressing Electrical or Microwave Signals

Figure 22:
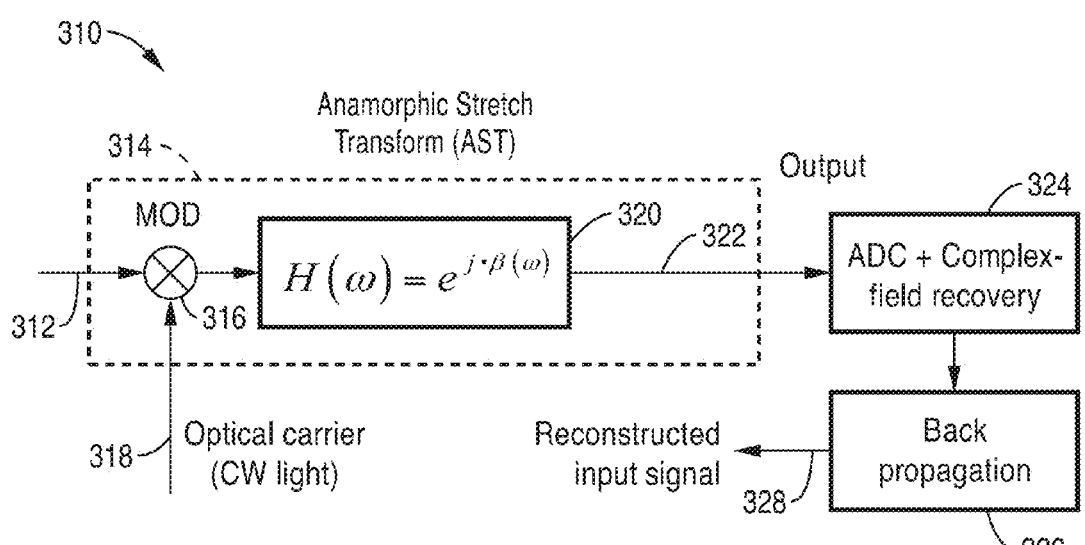
FIG. 22 is a block diagram of AST compression for electrical and microwave signals according to an embodiment of the present invention, showing conversion into optical signals with a modulator prior to AST transformation.
Figure 23A:
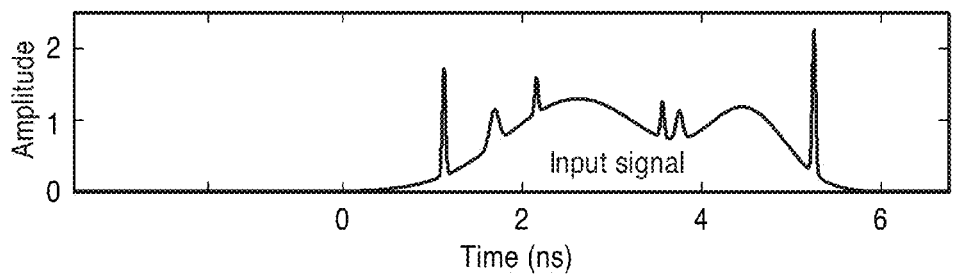
FIG. 23A through FIG. 23H are plots of input and outputs signals utilized in a near field AST demonstration according to an embodiment of the present invention.
Figure 23B:
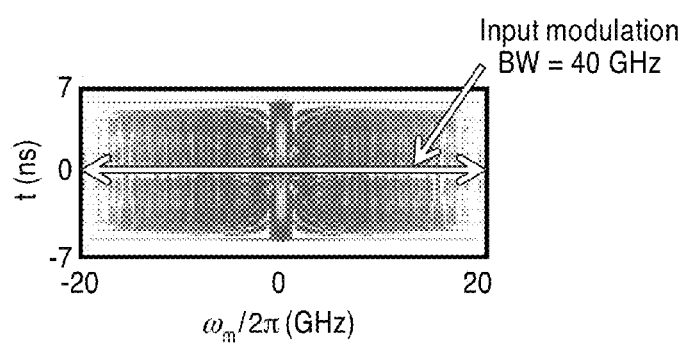
Figure 23C:
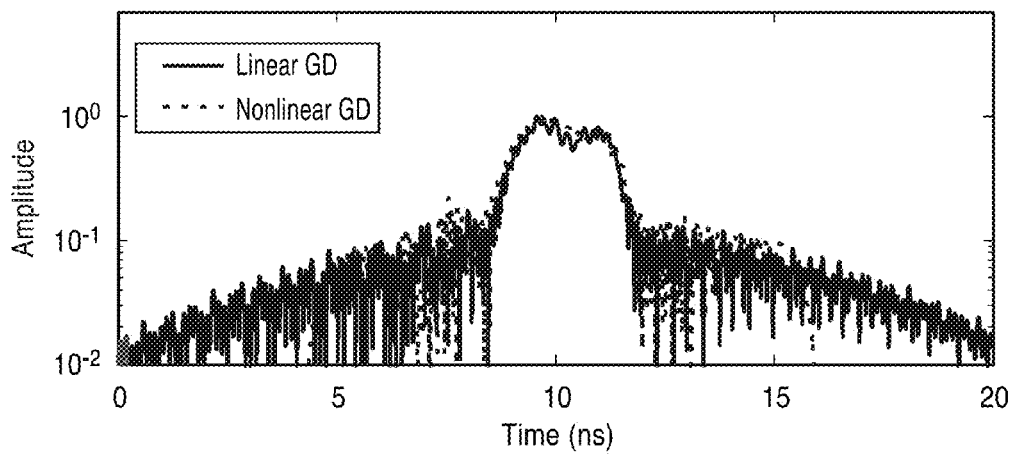
Figure 23D:
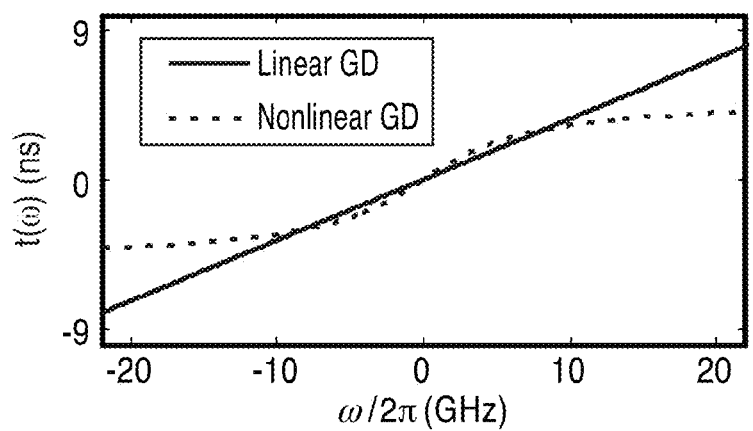
Figure 23E:
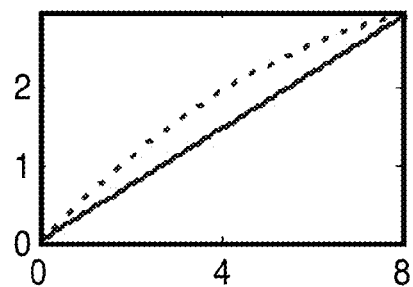
Figure 23F:
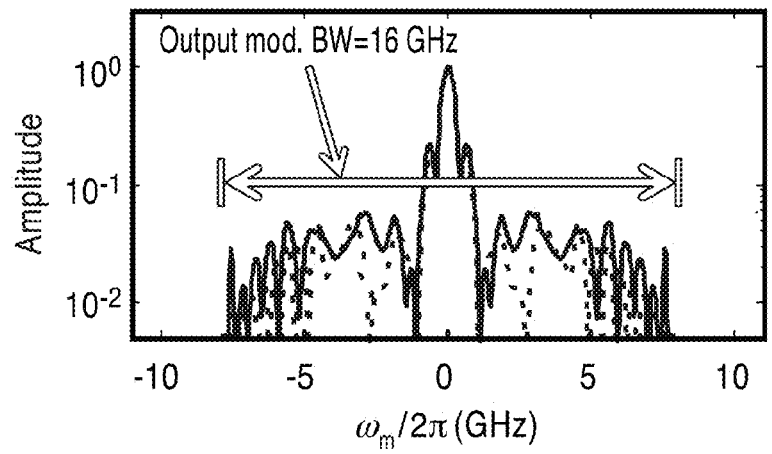
Figure 23G:
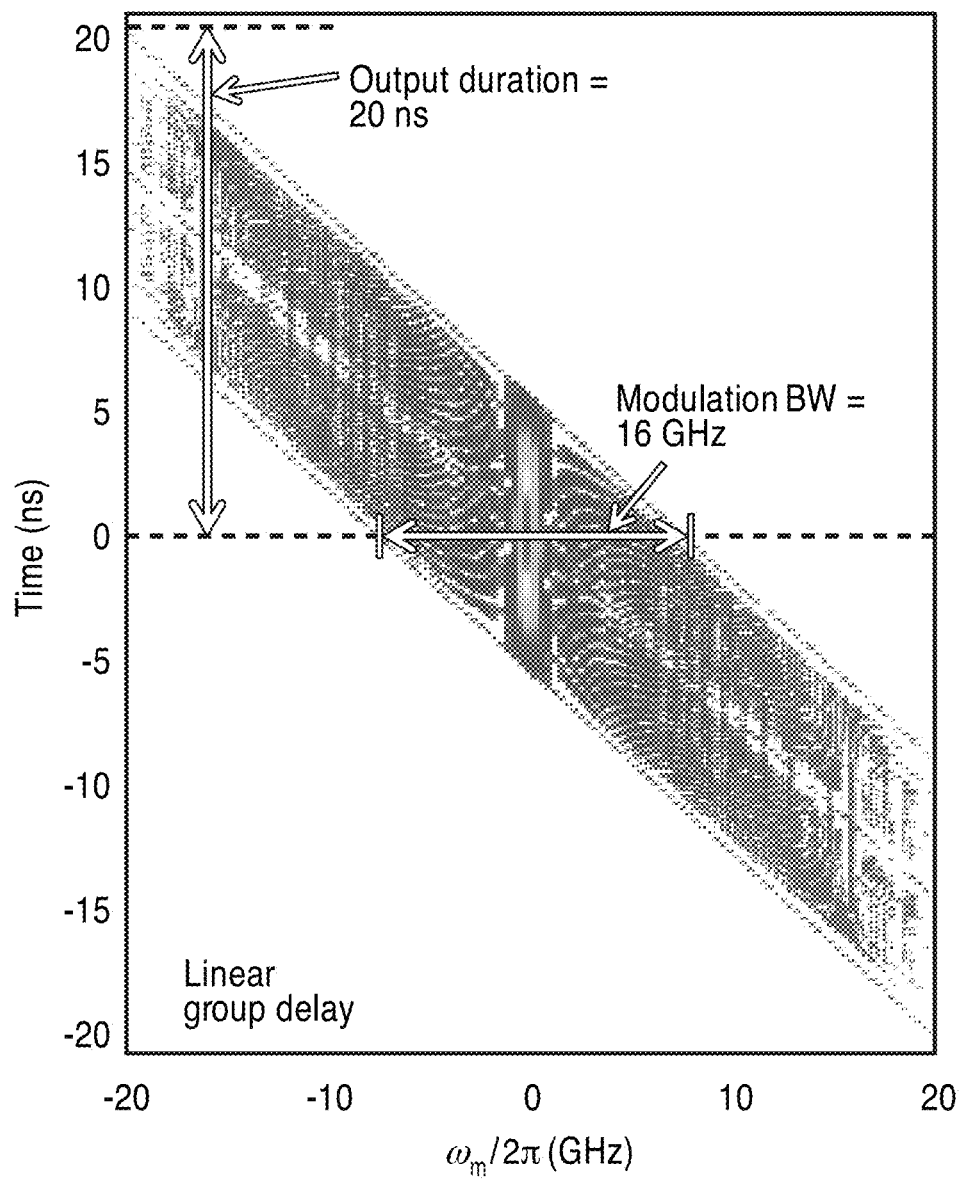
Figure 23H:
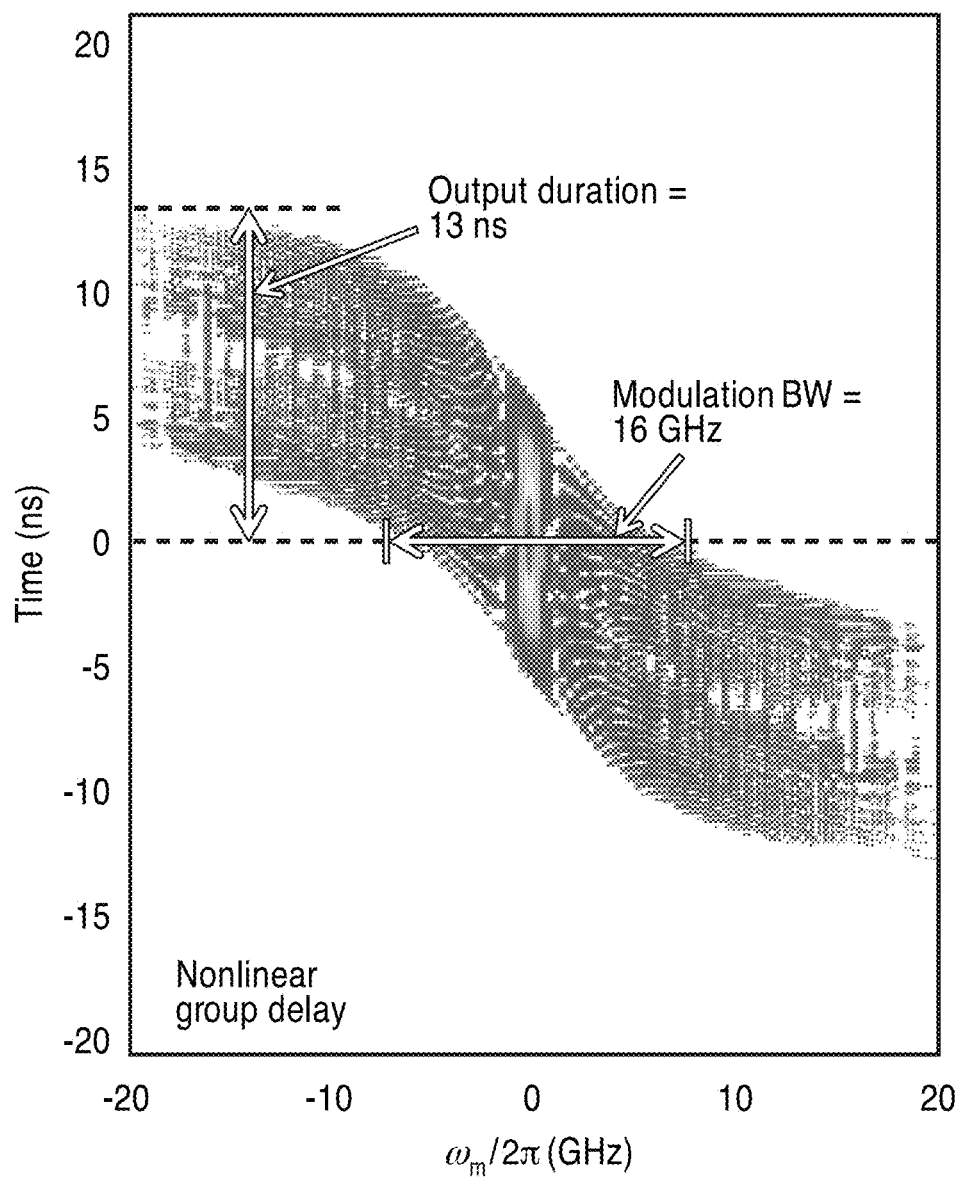

FIG. 22 illustrates an example embodiment 310 of compressing an electrical or microwave signal 312 utilizing AST 314. The electrical or microwave signal 312 and an optical carrier 318 is received at a modulator 316 and outputs an optical domain signal for AST optical filter 320 performed using a filter with a tailored frequency-dependent group delay. Output 322 of the AST is then converted to digital (e.g., ADC) 324, followed by back propagation 326 to generate output 328. The complex field of the transformed signal is measured and the input signal is reconstructed using back propagation.

As an example of engineering modulation bandwidth and time duration of an electrical signal using AST, the following discusses the optimum group delay profile for an optical filter operating in the near field regime. Operating in the near field regime is especially important for the cases where far field regime cannot be achieved because of the limited bandwidth of the electrical signals (compared to the optical carrier) and there is insufficient available group delay. Because the losses of optical devices increase with increasing group delay, in many cases the high losses do not permit the system to reach the far field.

Figure 25A:
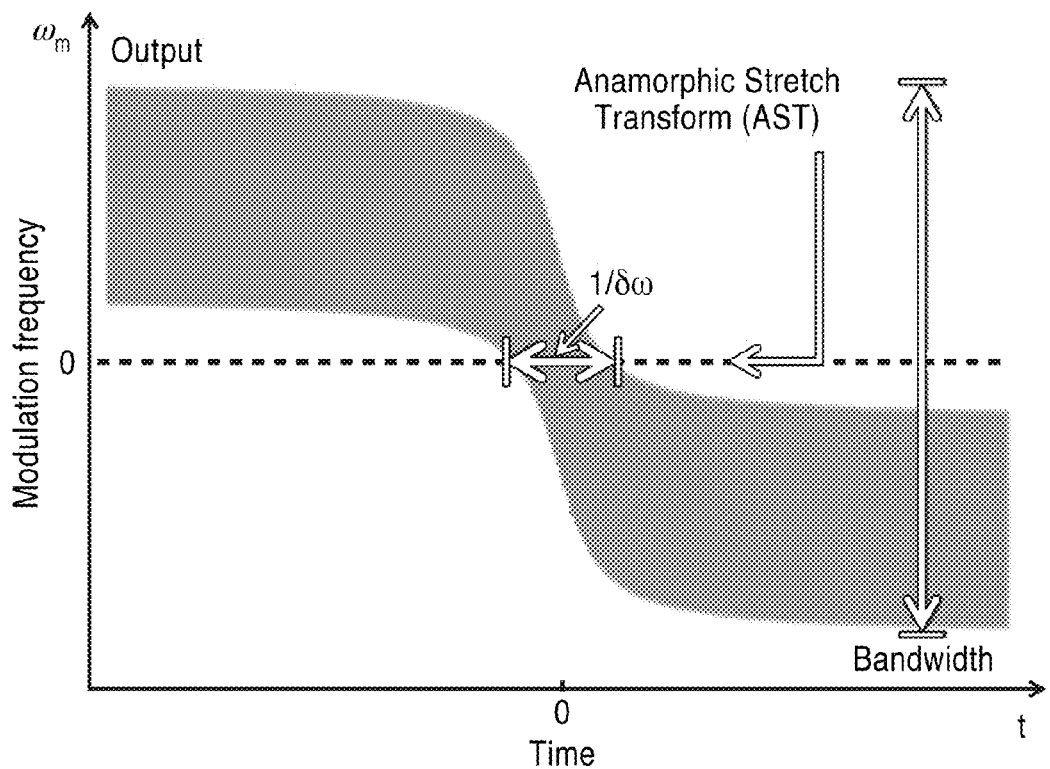
FIG. 25A and FIG. 25B are pseudo-plots of stretched modulation distribution ($S_M$) in an illustration of engineering time-bandwidth product of AST according to an embodiment of the present invention.

FIG. 23A through FIG. 23H illustrate an example demonstration of AST performed in the near field. In FIG. 25A signal duration is depicted showing stretched modulation distribution ($S_M$) of the signal in FIG. 25B. In this example, time duration is approximately 6 ns, while modulation bandwidth is 40 GHz. The objective of this demonstration is to show compression of the input electrical signal modulation bandwidth from 40 GHz to 16 GHz, resulting in a time-bandwidth product compression factor of 2.5.

The filter transfer function is chosen such that for frequency components ranging from DC to 8 GHz a larger group delay is applied to higher frequencies than the case of linear group delay. The group delay for frequency components above 8 GHz is designed to be less than the case of linear group delay. This is because to achieve the same output modulation bandwidth, less group delay is required for fast features.

In FIG. 25C temporal duration is shown reduced from about 20 ns to about 13 ns, providing about a 35% reduction. FIG. 25D compares the AST nonlinear group delay used with a linear group delay that would have resulted in the same 16 GHz output modulation bandwidth, with a magnified portion in FIG. 25E. As seen in FIG. 25F, the modulation bandwidth is 16 GHz in both cases. FIG. 25G and FIG. 25H compare $S_M$ plots for the case of linear group delay (FIG. 25G) and the AST nonlinear group delay (FIG. 25H) utilized here. It should be appreciated that the reduction in temporal signal length, and the number of samples needed to represent it, is reduced by nearly 35% using the anamorphic transform.

10. AST in Compression of Genomic Sequencing Data

The proliferation of high-throughput sequencing technologies have led to rapid accumulation of genomic data. As prices drop for high throughput instruments such as automated genome sequencers, small biology labs can become big-data generators. A single sequenced human genome is around 140 GB in size. The storage and transfer of the tremendous amount of genomic data have become a mainstream problem, motivating the development of high-performance compression tools designed specifically for genomic data. A recent surge of interest in the development of novel algorithms and tools for storing and managing genomic re-sequencing data emphasizes the growing demand for efficient methods for genomic data compression.

While standard data compression tools (e.g., ZIP and RAR) are used to compress sequence data, they do not exploit the fact that the genomic data contains repetitive content and many sequences exhibit high levels of similarity. These properties of the genome data has been exploited to achieve more efficient compression.

The proposed anamorphic stretch transform (AST) data compression can be used to compress genomic data. The basic principle is a digital implementation of the technique where the data is passed through the reshaping operation followed by resampling. The reshaping uses a kernel with a specific phase derivative resulting in time bandwidth compression. The AST is preferably followed by entropy encoding to further reduce data size. To make use of repetitive and similarity attributes of genomic data, the anamorphic compression can be preceded by an optional compression where only variations with respect to a reference sequence are kept.

11. AST for Spectroscopy and Coherent Temporal Imaging 11.1 Introduction.

Ultrafast non-repetitive phenomena harbor a wealth of fascinating information about a system that is inaccessible to pump-and-probe measurements and to other equivalent-time instruments such as sampling oscilloscopes. Capturing non-repetitive and rare events such as optical rogue waves requires real-time instruments. Technical challenges are twofold: (1) digitizing the wideband signal in real time and (2) dealing with the massive volume of data generated in the process.

Coherent dispersive Fourier transform (DFT) combines DFT and coherent detection. Known as time stretch transform (TST), it is used to slow down signals so they can be digitized in real-time. At the same time, coherent detection enables improved sensitivity, digital cancellation of dispersion-induced impairments and optical nonlinearities, and the decoding of phase-modulated optical data formats. By recovering optical amplitude and phase of the time stretched waveform, TST measures both time domain and spectral profile of non-repetitive signals at high-throughput. With complex field detection, DFT can operate in both near-field and far-field regimes. However, in the near field there is no Fourier transform, as there is no one-to-one frequency-time mapping. In TST, as well as in temporal imaging, the time-bandwidth product remains constant. For a bandwidth compression of M, the record length is expanded by M times.

The time stretch technique is inherently an analog optical link but one that uses a broadband laser and large dispersion to slow down the envelope of a fast temporal waveform. Another method to capture ultrafast signals is temporal imaging which duplicates the function of a spatial imaging system in the time domain. The time lens multiplies (mixes) the signal with a local oscillator that has a linear instantaneous frequency (IF) and this is followed by a Fourier transformation performed by a diffraction grating or temporal dispersion. Conventional temporal imaging can only measure the signal intensity; it does not capture the phase profile.

However, the inventive signal transformation can be utilized to capture fast time waveforms that are beyond the speed of the digitizer and at the same time, minimize record length. AST warps the signal with a specific phase operator that causes feature-selective time stretch. Upon uniformly sampling the transformed signal, fast features receive a higher sampling density than slow features, whereby time bandwidth product is reduced along with the size of the digital data produced, and all without losing information. This is performed by removing redundancy from the signal in an open loop fashion; i.e., without a-priori knowledge about the signal. AST increases the frame rate and also solves the big data problem that arises during high throughput operation necessary for capturing non-repetitive signals and rare events. To identify the proper AST phase operator that leads to time-bandwidth compression, the 2D function of stretched modulation distribution ($S_M$) was introduced. $S_M$ can be also used to find the optimum AST phase operator to increase the time bandwidth product in arbitrary waveform generation methods based on frequency to time mapping. AST may also be interpreted in a multitude of ways including warped coherent time-frequency mapping.

The anamorphic stretch transform can be applied to temporal imaging. The impact is that the spectrum measurement resolution is enhanced while the record length is minimized. In other words, this is a temporal imaging system in which the time-bandwidth product is compressed. Reducing the record length avoids generation of superfluous data and also maximizes the frame rate of spectral measurements.

Figure 24:
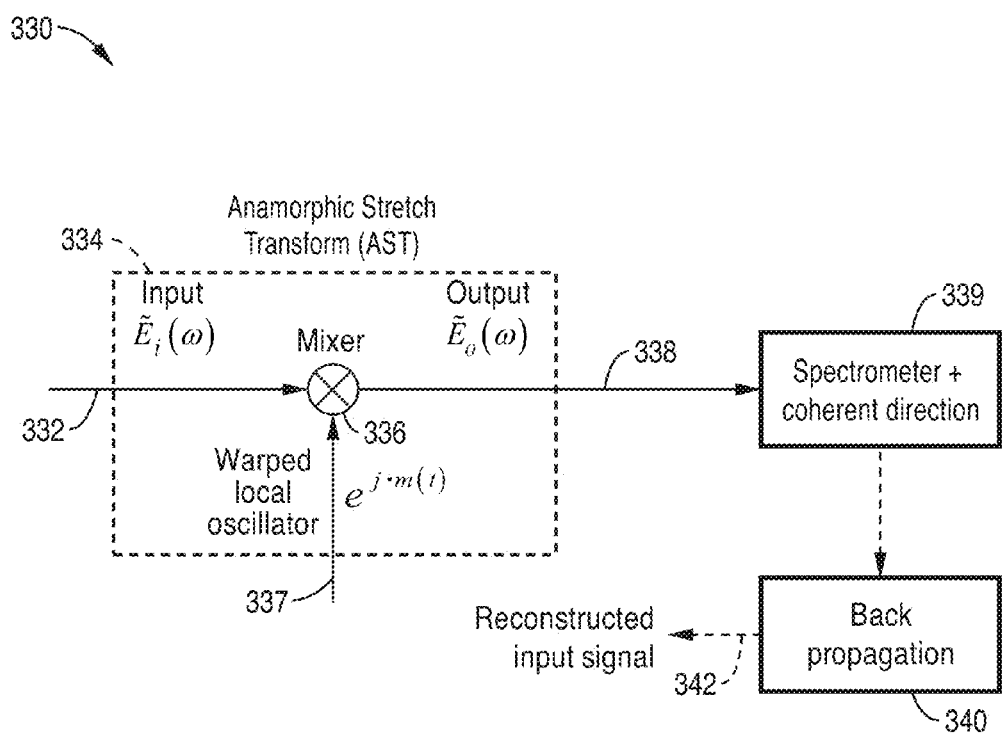
FIG. 24 is a block diagram of temporal imaging utilizing AST according to an embodiment of the present invention.

FIG. 24 illustrates an example embodiment 330 of AST to temporal imaging. The input signal $\tilde{E}_i(\omega)$ 332 is received by AST block 334 and warped by mixing it 336 with a local oscillator (LO) $e^{j-m(t)}$ 337 that has a nonlinear instantaneous frequency, such as utilizing LO with a warped chirp, to output $\tilde{E}_o(\omega)$ 338. Spectrometry with coherent detection 339 is then used to measure the complex-field of the output signal. The input signal is then reconstructed digitally by back propagation 340 to output reconstructed input signal 342. The $S_M$ function is utilized herein to design the instantaneous frequency profile that leads to time-bandwidth compression. Compared to conventional temporal imaging, the present method results is a shorter record length with the same resolution enhancement factor. Moreover, in contrast to conventional temporal imaging, where only the signal time intensity can be captured, the proposed coherent temporal imaging concept can recover complex-field of both time domain and spectrum.

Figure 25B:
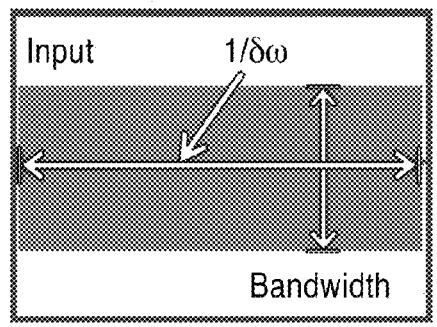

FIG. 25A and FIG. 25B depicts representations (pseudo-plot) showing the application of $S_M$ to engineer the time-bandwidth product using AST in FIG. 25A, and bandwidth versus $1/\delta\omega$ for the input signal in FIG. 25B. $S_M$ is a 3D plot showing dependence of the envelope intensity on time and envelope frequency. The figure compares the $S_M$ of the input signal (inset) without any mixer in front and the $S_M$ after mixing in the main figure with a local oscillator with sublinear IF, i.e. AST or warped temporal imaging. Using AST, spectral resolution is increased, however, the bandwidth is not expanded proportionally, thus time-bandwidth compression is achieved. The $S_M$ function is preferably utilized in designing the local oscillator with optimum IF for AST operation.

Coherent detection allows the temporal imaging and dispersive Fourier transform systems to operate in the traditional far field as well as in near field regimes. In this regard, the inventive method can be employed for near field time-bandwidth product manipulation. More specifically, coherent temporal imaging allows for near field time-bandwidth product compression or expansion.

11.2 Principle of Operation.

A mixer is employed with a nonlinearly chirped local oscillator. Here, t is the time variable, and the local oscillator phase profile is an arbitrary warped function of time, m(t), with corresponding instantaneous frequency IF(t)=∂[m(t)]/∂t (see FIG. 25A). The object of this demonstration is to increase the spectral resolution at the output so it can be captured with a spectrometer with lower resolution. At the same time the record length is minimized to avoid generation of redundant data. Minimizing the record length also maximizes the frame rate of spectral measurement.

$S_M$ is utilized to find the optimum instantaneous frequency warp profile. $S_M$ is a 2D distribution that describes the output signal intensity as a function of both time and frequency. In the time domain it can be represented as follow:

$$S_M(\omega_m, t) = \int_{-\infty}^{\infty} E_i(t_1) E_i^*(t_1+t) e^{-j \cdot t \left[\frac{m(t_1+t)-m(t_1)}{t}\right]} e^{-j\omega_m \cdot t_1} dt_1 \quad (11)$$

where $\omega_m$ is the envelope frequency. The $S_M$ function given by Eq. 11 is the time-domain equivalent of similarly named function introduced in Eq. 6. Using $S_M$ allows determining what chirp profile to utilize for achieving high spectrum resolution while minimizing record length. The trajectory at $\omega_m=0$ in a $S_M$ plot of FIG. 25A represents the output auto-correlation and the inverse of its width determines the output signal spectral resolution. Also the output signal bandwidth, i.e., the record length, can be measured as the frequency range over which the function has non-zero values. In FIG. 25A the qualitative $S_M$ plot illustrated how to engineer the signal time-bandwidth product. The figure compares the $S_M$ of the input signal in FIG. 25B and the case that it is mixed with a local oscillator with sublinear instantaneous frequency. As can been seen from FIG. 25B, the resolution $\delta\omega$ is increased, however, the bandwidth is not expanded proportionally. In other words, the time-bandwidth product has been compressed. It should be mentioned that the output signal has both amplitude and phase information requiring complex-field detection for decompression. The input complex-field spectrum or time domain can then be reconstructed from the measured complex field.

To compress the TBP, as suggested by $S_M$ plots in FIG. 25A, the system should have a sublinear IF profile. The following function provides a simple mathematical description of such IF function:

$$\mathrm{IF}(t) = A \cdot \tan^{-1}(B \cdot t), \quad (12)$$

where $\tan^{-1}$ is the inverse tangent function. Parameters A and B are arbitrary real numbers. Parameter A determines the amount of output spectral resolution. Parameter B is related to the degree of anamorphism or warping of the instantaneous frequency.

11.3 Numerical Results.

As an example of engineering the signal time-bandwidth product using anamorphic temporal imaging, the following discusses optimum IF profile for a local oscillator to enhance spectral resolution with reduced record length.

To show the utility in single-shot high-throughput spectroscopy, the input signal of an optical spectrum was chosen that resembles spectroscopy traces measured by spectrometers. The resolution of spectral measurement is a key parameter allowing for a precise positioning of the absorption lines. Yet there is a trade-off between the resolution of the spectrometer and its update rate. The inventive method enables fine spectrum features to be captured with a spectrometer that otherwise would not have sufficient resolution. At the same time, this inventive method compresses the time-bandwidth product so the record length is minimized and update rate is maximized.

Figure 26A:
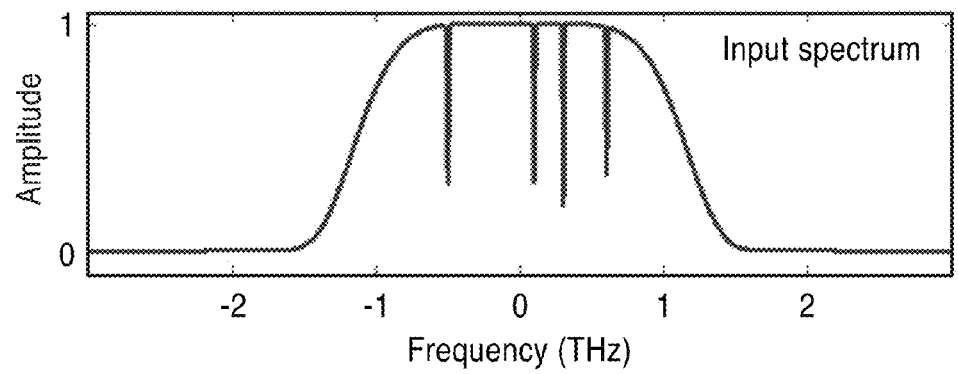
FIG. 26A and FIG. 26B are plots of input spectrum and its stretched modulation distribution ($S_M$) according to an embodiment of the present invention.
Figure 26B:
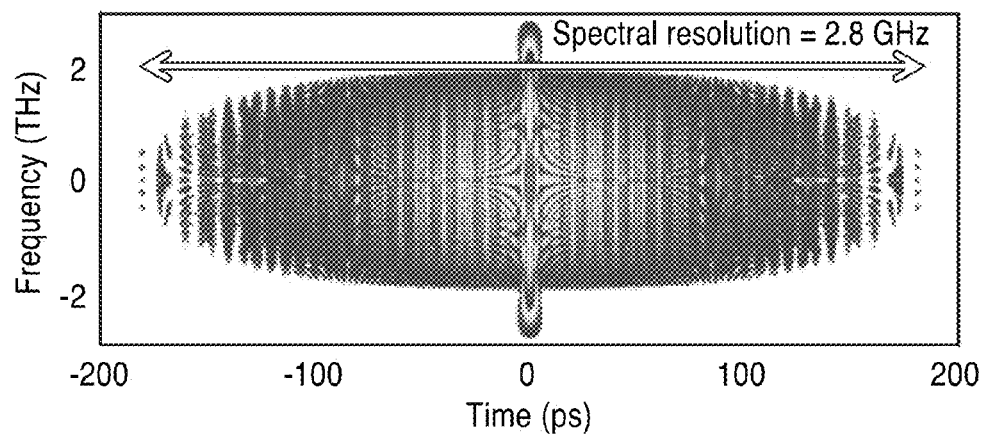

FIG. 26A and FIG. 26B depict an input signal spectrum and $S_M$ plot, respectively, for this spectrographic demonstration embodiment of FIG. 24. The optical spectrum under test had approximately 5.6 THz full bandwidth and 2.8 GHz spectral resolution, and thus a time bandwidth product of 2,000. The object of the demonstration is to reshape the signal so it can be measured using a spectrometer with 50 GHz resolution, thus achieving a spectral resolution enhancement factor of 17.8.

The IF profile for AST operation is chosen such that the output spectral resolution is fixed to 50 GHz, i.e., the target spectral resolution. Parameter A in Eq. (11) was designed to $2.14 \times 10^{13}$ Hz for the given target spectral resolution. To minimize the output bandwidth, such as the record length, parameter B in Eq. (11) was designed to $1.05 \times 10^{11}$.

Figure 27A:
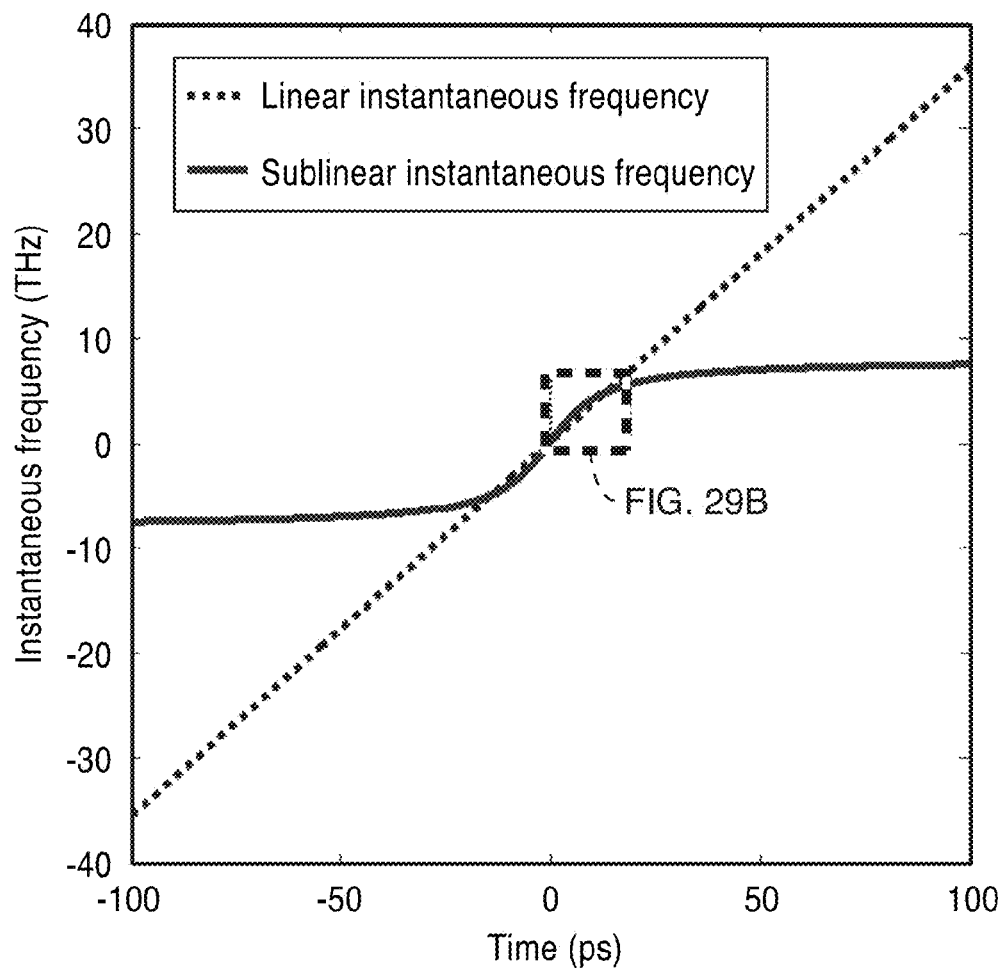
FIG. 27A and FIG. 27B are plots of linear and sublinear (nonlinear) IF utilized according to an embodiment of the present invention.
Figure 27B:
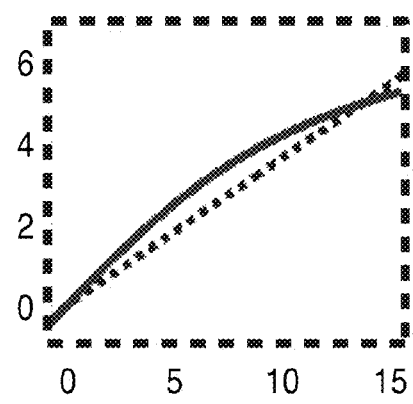

FIG. 27A and FIG. 27B depict a comparison between designed nonlinear IF profile and the linear IF profile having a chirp factor of $m_2 = 2.24 \times 10^{24}$ 1/s² that results in the same spectral resolution. FIG. 27B is a magnification of a marked portion of FIG. 27A.

Figure 28A:
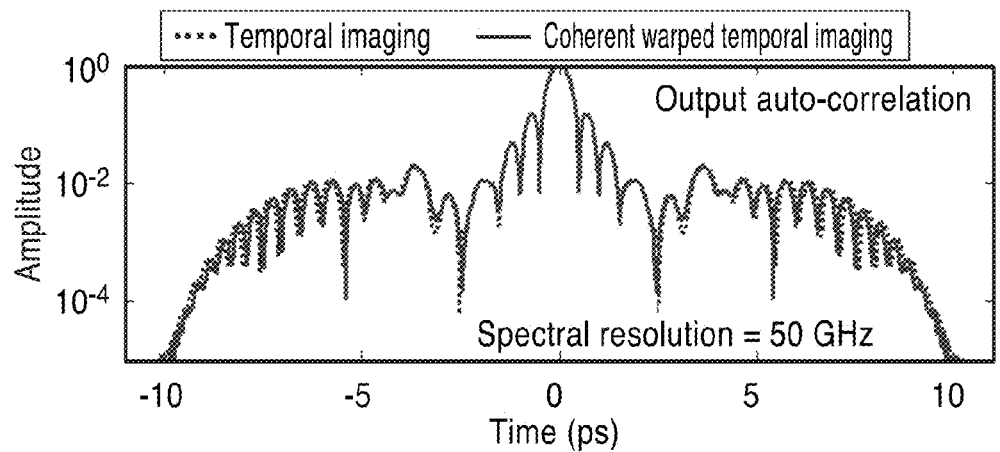
FIG. 28A through FIG. 28C are plots of time-bandwidth compression using coherent warped temporal imaging according to an embodiment of the present invention.
Figure 28B:
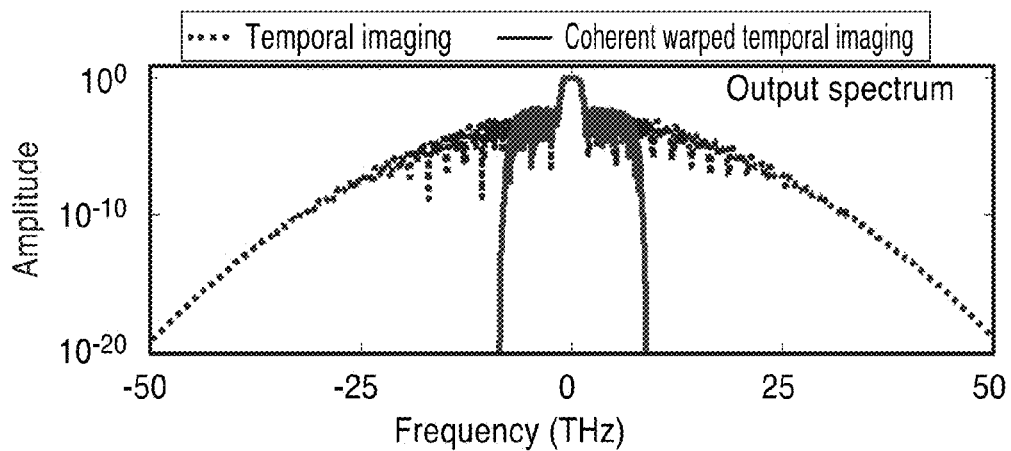
Figure 28C:
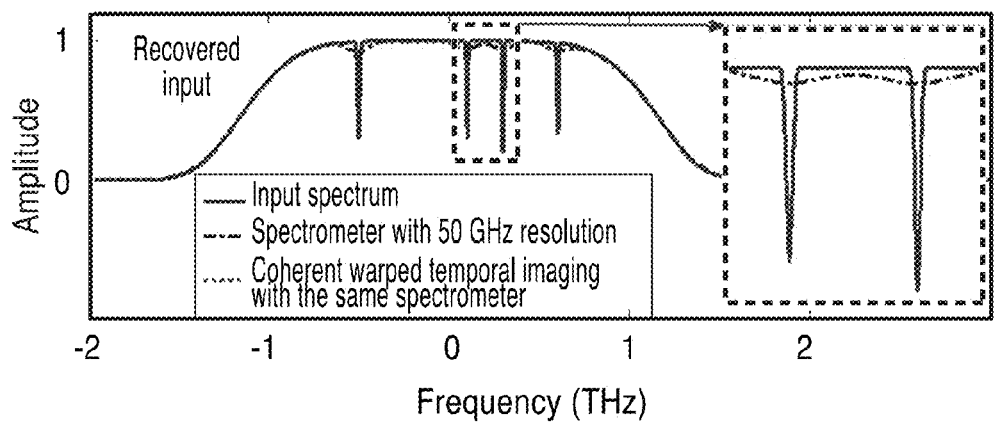

FIG. 28A through FIG. 28C illustrate time-bandwidth product compression using coherent warped temporal imaging. In FIG. 28A is seen a comparison of output auto-correlation for the case of linear and AST nonlinear instantaneous frequency (IF) profiles. Both auto-correlations are reduced to 20 ps, which is a spectral resolution of 50 GHz. It can be seen in this figure that coherent warped temporal imaging very closely tracks temporal imaging. In FIG. 28B, a comparison of output spectrums is seen for linear and AST nonlinear IF chirp profiles. For temporal imaging, the spectrum is seen across the full range of the figure, while coherent warped temporal imaging is seen more localized about the carrier. As seen in FIG. 28A and FIG. 28B in both cases the spectral resolution is 50 GHz, however, the output bandwidth and hence the record length in the case of nonlinear (warped) IF, such as AST, is reduced from 100 THz to about 17 THz, a reduction of 5.9 times, and thus using AST resulted in a 5.9 times shorter record length, and to a compression of 5.9 times in the time-bandwidth product or 5.9 times higher update rate in spectral measurement. In FIG. 28C is seen recovered input spectrum using a spectrometer with 50 GHz resolution, in which the original spectrum and the captured spectrum are shown with the same spectrometer, but without AST, for comparison. The fine spectrum features are missed using the spectrometer with 50 GHz resolution without AST, however, they are fully recovered using AST with the same spectrometer. The inset in FIG. 28C depicts how the fine features of the signal are missed with the 50 GHz spectrometer that does not employ AST.

Figure 29A:
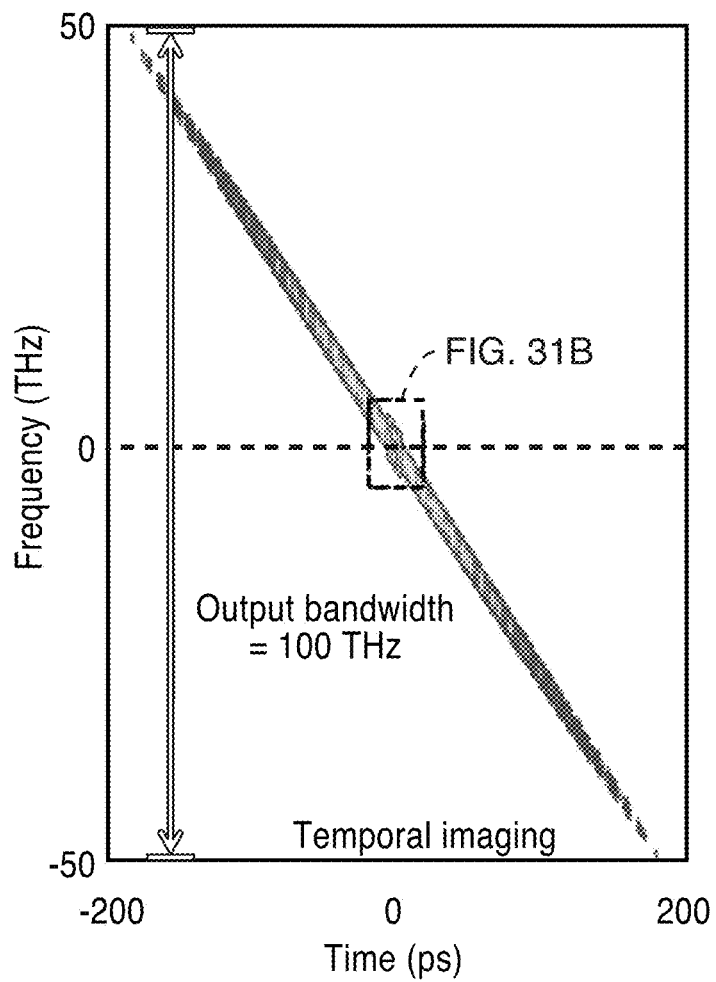
FIG. 29A through FIG. 29D are time-frequency plots comparing temporal imaging and coherent warped temporal imaging according to an embodiment of the present invention.
Figure 29B:
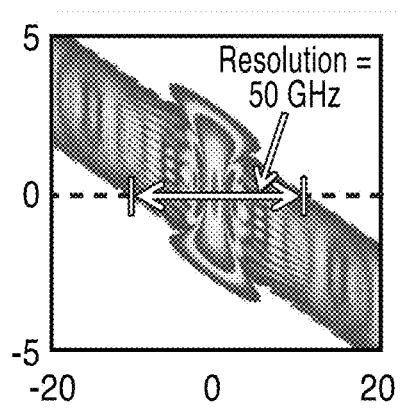
Figure 29C:
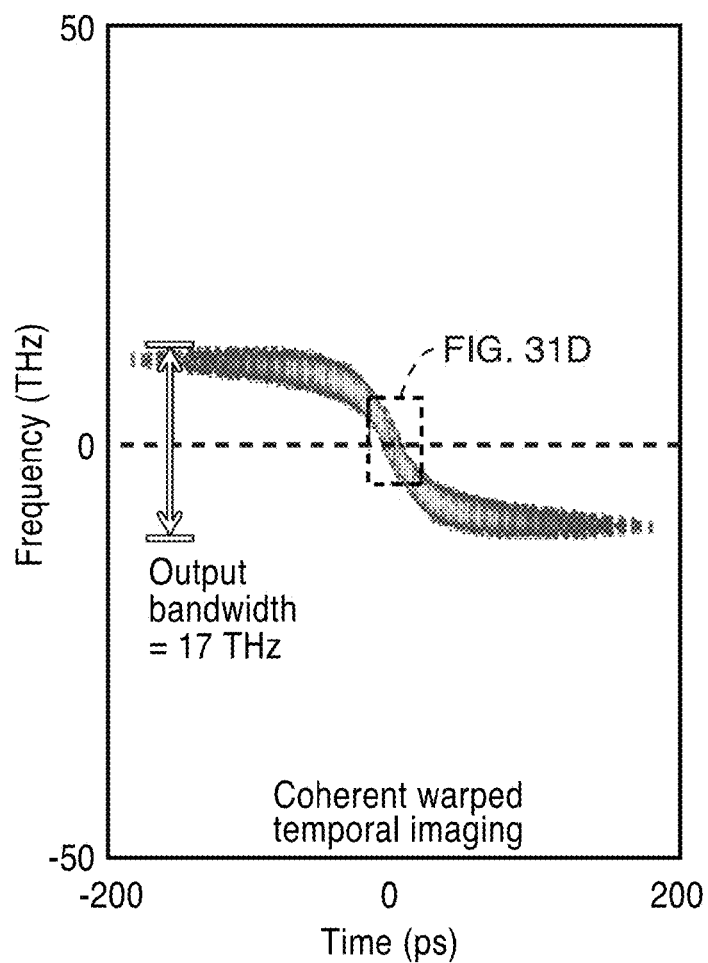
Figure 29D:
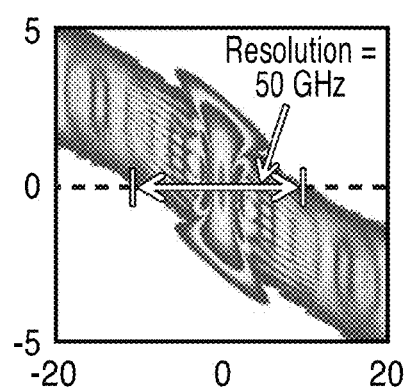

FIG. 29A through FIG. 29D compare $S_M$ plots for the cases of linear IF profiles in FIG. 29A and magnified portion in FIG. 29B, to the warped (nonlinear) IF profiles in FIG. 29C with magnified portion FIG. 29D, for the signals seen in FIG. 26A through FIG. 26C. These $S_M$ plots were used to design and analyze the optimized temporal imaging operation that achieves time-bandwidth compression. The output signal in this case is in the near field regime.

Embodiments of the present invention may be described with reference to flowchart illustrations of methods and systems according to embodiments of the invention, and/or algorithms, formulae, or other computational depictions, which may also be implemented as computer program products. In this regard, each block or step of a flowchart, and combinations of blocks (and/or steps) in a flowchart, algorithm, formula, or computational depiction can be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the block(s) of the flowchart(s).

Accordingly, blocks of the flowcharts, algorithms, formulae, or computational depictions support combinations of means for performing the specified functions, combinations of steps for performing the specified functions, and computer program instructions, such as embodied in computer-readable program code logic means, for performing the specified functions. It will also be understood that each block of the flowchart illustrations, algorithms, formulae, or computational depictions and combinations thereof described herein, can be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer-readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the block(s) of the flowchart(s), algorithm(s), formula(e), or computational depiction(s).

From the discussion above it will be appreciated that the invention can be embodied in various ways, including the following:

1. A method of capturing a temporal waveform, comprising: receiving a temporal waveform at a transformation stage; performing a transformation at said transformation stage which imparts a nonlinear warp onto the frequency spectrum of the waveform to output a compressed temporal waveform.

2. The method of any of the previous embodiments, wherein said transformation stage comprises a warped/anamorphic phase operation.

3. The method of any of the previous embodiments, wherein said transformation stage comprises a filter with non-quadratic phase response.

4. The method of any of the previous embodiments, wherein the temporal waveform is nonuniformly transformed during said nonlinear warping so that a uniform and finite sampling rate matches features of the temporal waveform.

5. The method of any of the previous embodiments, wherein during said nonlinear warping spectrum of the temporal waveform is warped in a Fourier domain to a spectrum probability density function (SPDF).

6. The method of any of the previous embodiments, wherein said method is configured for increasing the bandwidth of data converters without reducing record length or requiring a higher number of samples.

7. The method of any of the previous embodiments, wherein said transformation stage is utilized for imparting said nonlinear warp to said temporal waveform prior to receipt on a conventional data converter to provide adaptive temporal sampling in which because of the transformation, sampling rate adapts to the temporal waveform so that fine temporal features are sampled at a higher rate than the coarse temporal features.

8. The method of any of the previous embodiments, wherein said data converter comprises capturing of the transformed temporal waveform with an analog to digital converter (ADC).

9. The method of any of the previous embodiments, further comprising a decompression of said compressed temporal waveform.

10. The method of any of the previous embodiments, wherein said decompression performs the inverse of said transformation on a compressed temporal waveform received from a conventional data converter.

11. The method of any of the previous embodiments, wherein said conventional data converter comprises a digital to analog converter (DAC).

12. The method of any of the previous embodiments, wherein said transformation stage is performed in the analog domain prior to sampling, and does not suffer from either quantization noise or the limits of a finite number of samples and quantization noise of a data converter.

13. The method of any of the previous embodiments, wherein said transformation is performed in one or more domains selected from a group of domains consisting of analog, digital, optical, and electrical/radio/microwave frequency.

14. The method of any of the previous embodiments, wherein said transformation is performed on digital data with all-digital signal processing.

15. The method of any of the previous embodiments, wherein said nonlinear warping is performed using a filter having a specific transfer function; wherein unless this specific transfer function is known, an eavesdropper would have difficulty recovering the temporal waveform.

16. The method of any of the previous embodiments, wherein said method enhances resolution of spectroscopy or to decrease number of samples required without adversely impacting equivalent system resolution.

17. The method of any of the previous embodiments, wherein said transformation exploits a natural frequency-to-time relation inherent in temporal dispersion, and does not rely on a-priori knowledge of the temporal waveform.

18. A method for increasing temporal resolution of data converters, comprising: receiving a temporal waveform at a transformation stage; performing a transformation at said transformation stage utilizing frequency-selective mapping of the spectrum, with nonlinear warping, whereby mapping scale has a larger stretch factor on fine temporal features, subjecting said temporal waveform to an injective group delay to produce a compressed temporal waveform; and receiving said compressed temporal waveform at a data converter wherein it is sampled with a uniform sample pattern.

19. The method of any of the previous embodiments, wherein said injective group delay corresponds to a phase response that depends on a combination of even-order powers of frequency with weighting factors.

20. The method of any of the previous embodiments, wherein said transformation is performed in one or more domains selected from a group of domains consisting of analog, digital, optical, and electrical/radio/microwave frequency.

21. The method of any of the previous embodiments, wherein said transformation reduces number of samples required to obtain a given temporal bandwidth.

22. The method of any of the previous embodiments, wherein said transformation is performed on digital data with all-digital signal processing.

23. The method of any of the previous embodiments, wherein said nonlinear warping is performed using a filter having a specific transfer function, whereby unless this specific transfer function is known, an eavesdropper would have difficulty recovering the temporal waveform.

24. The method of any of the previous embodiments, wherein said method enhances resolution of spectroscopy, or decreases number of samples required, without adversely impacting equivalent system resolution.

25. The method of any of the previous embodiments, wherein said transformation exploits a natural frequency-to-time relation inherent in temporal dispersion, and does not rely on a-priori knowledge of the temporal waveform.

26. A method for imaging or capturing of a temporal waveform, wherein said method comprising placing, between the waveform and the detector, a transformation stage that imparts a nonlinear warp onto the frequency spectrum of the waveform.

27. The method of any of the previous embodiments, wherein said transformation stage comprises a warped/anamorphic phase operation.

28. The method of any of the previous embodiments, wherein said transformation stage comprises a filter with non-quadratic phase response.

29. The method of any of the previous embodiments, wherein the temporal waveform is nonuniformly transformed (warped) such that the uniform and finite sampling rate matches the features of the temporal waveform.

30. The method of any of the previous embodiments, wherein the spectrum (Fourier domain) of the temporal waveform is warped according to the waveform's spectrum probability density function (SPDF).

31. A method to increase the bandwidth of data converters. The present method achieves this without reducing the record length or requiring higher number of samples.

32. A method for achieving adaptive temporal sampling using a conventional data converter. The sampling rate adapts to the temporal waveform in such a way that fine temporal features with high frequencies are sampled at a higher rate than the coarse features with lower frequencies. In other words, more samples are assigned to the fine features where they are needed and less to coarse features.

33. Same for both capture and playback, i.e. decompression, of temporal waveforms such as capture with an Analog to Digital Converter (ADC) and playback with a Digital to Analog Converter (DAC). Our technique solves the temporal resolution of ADC and the DAC.

34. A method for achieving aforementioned increased sampling bandwidth through analog transformation. In the present method, waveform is "groomed" in the analog domain prior to sampling. As such it does not suffer from quantization noise and the limitation imposed by the data converter's finite number of samples and quantization noise.

35. A method for increasing the record length and/or temporal resolution of data converters through frequency-selective (warped) mapping of the spectrum. In conventional far-field temporal dispersion, the waveform is subjected to a phase shift that varies quadratically with temporal frequency. Here the waveform's spectrum is mapped and stretched in time in such a way that the map's scale is the same for all frequencies. In the inventive transformation, the stretch factor for fine temporal features with high frequencies is larger. Compared to conventional systems in which the signal experiences a linear group delay, our transformation subjects the temporal waveform to an injective group delay.

36. A method of achieving the same by subjecting the temporal waveform to a filter with injective group delay. Injective group delay corresponds to a phase response that depends on combination of even-order powers of frequency with weighting factors.

37. Implementation of the proposed transformation in analog domain or in digital domain. Also, the implementation can be performed in optical or electrical (radio frequency/microwave) domains.

38. The use of aforementioned method for data compression. For a given temporal bandwidth and record length, our technique reduces the number of samples needed. The product of the record length multiplied by the bandwidth represents the total amount of information. The present technique reduces the number of samples needed to represent the same amount of information. Such compression of the requisite digital data reduces the communication channel bandwidth necessary to transmit the information. It also reduces the amount of digital storage necessary to store the information.

39. Use of aforementioned image/data compression where the transformation is performed in the analog domain.

40. Use of aforementioned data compression where the transformation is performed on digital data with all-digital signal processing.

41. A method for encryption of a temporal waveform. The present method intentionally warps, i.e. distorts the temporal waveform using a filter with specific transfer function. Unless the filter's transfer function is known, an eavesdropper will have difficulty recovering the temporal waveform.

42. A method to enhance the resolution of spectroscopy via dispersive Fourier transform or to decrease the required number of samples without losing the equivalent systems resolution.

43. A method of compressing analog temporal signals, comprising: performing an anamorphic spectrum transformation of an analog input signal to warp its signal spectrum to provide time-bandwidth compression; and sampling a signal whose signal spectrum has been warped by the transformation; wherein the transformation performs reallocating samples to assign more samples to fine features with high frequency waveform portions of the waveform and fewer samples to coarse features with low frequency portions of the signal, resulting in shorter record length and fewer number of samples.

44. The method of any of the previous embodiments, wherein the transformation can be configured for operation in a near-field regime, or a far-field regime.

45. The method of any of the previous embodiments, wherein the warping of the signal spectrum is configured or implemented by programming executing within a digital signal processor.

46. The method of any of the previous embodiments, wherein the analog temporal compression is loss-less in response to it allocating more samples to fine feature with higher frequencies and fewer to coarse features with lower frequencies.

47. The method of any of the previous embodiments, wherein the time-bandwidth compression results in a reduced time-bandwidth product.

48. The method of any of the previous embodiments, wherein the reduced time-bandwidth product simplifies digitizing wide band signals, or reducing the volume of digital data generated, or a combination thereof.

49. The method of any of the previous embodiments, wherein utilizing the method for time-bandwidth compression allows a conventional digitizer to sample and digitize an analog signal with variable resolution.

50. The method of any of the previous embodiments, wherein the time-bandwidth compression allows capturing frequency components that were previously beyond bandwidth of a digitizer while reducing total digital data volume.

51. The method of any of the previous embodiments, wherein the analog temporal signals comprise communication signals or signals generated by sensors.

52. The method of any of the previous embodiments, wherein the transformation is applied in a digital domain to compress data to alleviate storage and transmission bottlenecks.

53. The method of any of the previous embodiments, wherein the transformation describes both the spectrum and temporal duration of the waveform's envelope, i.e. its intensity.

54. The method of any of the previous embodiments, wherein the transformation receives an analog signal as the first signal having a first signal spectrum which is transformed in response to filtering with a tailored frequency dependent group delay to warp the first signal spectrum into an output having a second signal spectrum that is ready for sampling.

55. An apparatus for compressing analog temporal signals, comprising: a digital signal processor configured for receiving an analog signal; programming executable on the digital signal processor for performing any of the steps recited in claims 1 through 12.

56. An apparatus for compressing analog temporal signals, comprising: a digital signal processor configured for receiving an analog signal; programming executable on the digital signal processor for performing an anamorphic spectrum transformation of the analog signal to warp its signal spectrum to provide time-bandwidth compression by filtering with a tailored frequency dependent group delay to warp the analog signal having a first waveform electric-field spectrum into a second waveform envelope spectrum ready for sampling; wherein the anamorphic spectrum transformation allows samples to be reallocated by assigning more samples to fine features with high frequency waveform portions of the analog signal and fewer samples to coarse features with low frequency portions of the analog signal.

57. A method of feature selective analog temporal signal compression, comprising reshaping a temporal signal in response to applying an anamorphic stretch transform (AST) in which sharp features of the signal are stretched to a greater extent than coarse features; and sampling with a digitizer; and allocating a higher number of samples to the fine features and fewer to coarse features where they are redundant. Since the net result of the operation is feature selective stretching of the waveform envelope, the method can also be called Anamorphic Stretch Transform (AST). Since the frequency response of the filter used to perform the operation resembles the letter "S", the reshaping has also been called the S-Transform (ST) in Applicant's previous provisional patent applications.

58. The method of any of the previous embodiments, wherein said feature selective compression method is configured to allow temporal signal reconstruction to be performed in response to complex-field recovery, followed by an inverse anamorphic stretch transform (inverse AST) operation.

59. The method of any of the previous embodiments, wherein said anamorphic stretch transform (AST) and said inverse anamorphic stretch transform (inverse AST) can be performed in an analog domain, or an optical domain, or in a digital domain, or a combination of analog, optical and digital domains.

60. The method of any of the previous embodiments, wherein said anamorphic stretch transform (AST) and said inverse AST are performed on digital data with digital signal processing.

61. The method of any of the previous embodiments, wherein said feature selective image compression is performed in real time for data compression, or for data decompression, or for both data compression and decompression.

62. The method of any of the previous embodiments, further comprising performing a combination of data compression techniques with a secondary form of data compression being performed after said anamorphic stretch transform (AST), whereby utilizing the combination of data compression techniques provides improved data compression factor.

63. The method of any of the previous embodiments, wherein said anamorphic stretch transform (AST) is performed by reshaping the complex spectrum of the temporal signal using a filter with sublinear phase derivative versus frequency.

64. The method of any of the previous embodiments, wherein said phase derivative is an inverse tangent function of frequency.

65. The method of any of the previous embodiments, wherein said filter has a response determined by a Modulation Intensity Distribution (MID) also called Anamorphic Spectral Distribution (ASD) which is a 3D distribution function that computes modulation intensity spectrum of the temporal signal and its duration when the image is reshaped with an arbitrary phase operation.

66. The method of any of the previous embodiments, wherein said anamorphic stretch transform (AST) is performed in response to reshaping the temporal signal in the time domain, by convolving the temporal signal with a function having superlinear dependence of phase derivative versus time.

67. The method of any of the previous embodiments, further comprising encryption of the data in response to securely maintaining the transfer function of said anamorphic stretch transform (AST), whereby since the transfer function is unknown it would be difficult for an eavesdropper to recover the original data.

68. The method of any of the previous embodiments, wherein it is executed on CPU, GPU, FPGA or other dedicated processors.

69. The method of any of the previous embodiments, wherein it is executed in real time.

70. The method of any of the previous embodiments, wherein it is utilized in combination with secondary compression techniques such as ZIP, RAR, compressive sensing, etc.

71. The method of any of the previous embodiments, utilized in the application of the transform to compress the genomic sequenced data.

72. The method of any of the previous embodiments, applied to compression/decompression of web browsing.

73. The method of any of the previous embodiments, applied to compression/decompression of video streaming.

74. A method of feature selective analog temporal signal compression, comprising: reshaping a temporal signal in response to applying an anamorphic stretch transform (AST) in which sharp features of the temporal signal are stretched to a greater extent than coarse features; sampling with a digitizer; and allocating a higher number of samples to fine features and fewer samples to coarse features where they are redundant and outputting a compressed temporal signal.

75. The method of any of the previous embodiments, wherein said method is configured for being performed in a near-field regime, or a far-field regime.

76. The method of any of the previous embodiments, wherein said anamorphic stretch transform (AST) provides time-bandwidth compression resulting in a reduced time-bandwidth product.

77. The method of any of the previous embodiments, wherein said feature selective compression method is configured for temporal signal reconstruction in response to complex-field recovery, followed by an inverse anamorphic stretch transform (inverse AST) operation.

78. The method of any of the previous embodiments, wherein said anamorphic stretch transform (AST) and said inverse anamorphic stretch transform (inverse AST) can be performed in an analog domain, or an optical domain, or in a digital domain, or a combination of analog, optical and digital domains.

79. The method of any of the previous embodiments, wherein said anamorphic stretch transform (AST) and said inverse AST are performed on digital data with a computer processor or digital signal processor.

80. The method of any of the previous embodiments, wherein said feature selective image compression is performed in real time for data compression, or for data decompression, or for both data compression and decompression.

81. The method of any of the previous embodiments, further comprising performing a secondary form of data compression in combination with said anamorphic stretch transform (AST), whereby utilizing the combination of data compression techniques provides an improved data compression factor.

82. The method of any of the previous embodiments, wherein said secondary form of data compression is selected from a group of compression techniques consisting of ZIP, RAR, and compressive sensing.

83. The method of any of the previous embodiments, wherein said anamorphic stretch transform (AST) is performed by reshaping complex spectrum of the temporal signal using a filter with sublinear phase derivative versus frequency.

84. The method of any of the previous embodiments, wherein said phase derivative is an inverse tangent function of frequency.

85. The method of any of the previous embodiments, wherein said filter has a response determined by a stretched modulation distribution (SM), also referred to as anamorphic spectral distribution (ASD), which is a 3D distribution function that computes modulation intensity spectrum of a temporal signal and its duration when reshaped with an arbitrary phase operation.

86. The method of any of the previous embodiments, wherein said anamorphic stretch transform (AST) is performed in response to reshaping the temporal signal in the time domain, by convolving the temporal signal with a function having superlinear dependence of phase derivative versus time.

87. The method recited in claim 1: wherein said anamorphic stretch transform (AST) has a transfer function which is required for use when recovering said temporal signal; and further comprising securely maintaining said transfer function to prevent an eavesdropper from decompressing the compressed temporal signal to recover said temporal signal.

88. The method of any of the previous embodiments, wherein said anamorphic stretch transform (AST) is executed from a computer processor selected from the group of processing devices consisting of CPU, GPU, DSP, and processor enabled FPGA or ASIC, along with associated memory.

89. The method of any of the previous embodiments, wherein said anamorphic stretch transform (AST) is executed in real time.

90. The method of any of the previous embodiments, wherein the analog temporal signals comprise communication signals or signals generated by sensors.

91. The method of any of the previous embodiments, wherein said feature selective analog temporal signal compression is utilized for compressing genomic sequenced data.

92. The method of any of the previous embodiments, wherein said feature selective analog temporal signal compression is utilized for compression during web browsing or video streaming.

93. A method of compressing an analog temporal signal, comprising: performing an anamorphic spectrum transformation of an analog temporal signal to warp its signal spectrum to provide time-bandwidth compression; and sampling a signal whose signal spectrum has been warped by said anamorphic spectrum transformation; wherein said anamorphic spectrum transformation performs reallocating samples to assign more samples to fine features with high frequency waveform portions and fewer samples to coarse features with low frequency portions of the analog temporal signal, resulting in shorter record length and fewer number of samples.

94. The method of any of the previous embodiments, wherein said anamorphic spectrum transformation is configured for operation in a near-field regime, or a far-field regime.

95. The method of any of the previous embodiments, wherein said warping of the signal spectrum is configured for being performed by programming executable on a computer processor or digital signal processor.

96. The method of any of the previous embodiments, wherein the analog temporal compression is loss-less in response to allocating more samples to fine features with higher frequencies and fewer samples to coarse features with lower frequencies.

97. The method of any of the previous embodiments, wherein said time-bandwidth compression results in a reduced time-bandwidth product.

98. The method of any of the previous embodiments, wherein said reduced time-bandwidth product simplifies digitizing wide band signals, or reducing generated digital data volume, or a combination thereof.

99. The method of any of the previous embodiments, wherein utilizing the method for time-bandwidth compression allows a conventional digitizer to sample and digitize an analog signal with variable resolution.

100. The method of any of the previous embodiments, wherein said time-bandwidth compression is configured for capturing frequency components that were previously beyond bandwidth limitations of a digitizer while reducing total digital data volume.

101. The method of any of the previous embodiments, wherein the analog temporal signal comprises a communication signal or a signal generated by one or more sensors.

102. The method of any of the previous embodiments, wherein said anamorphic spectrum transformation is applied in a digital domain to compress data to alleviate storage and transmission bottlenecks.

103. The method of any of the previous embodiments, wherein said anamorphic spectrum transformation describes both spectrum and temporal duration of waveform envelope, for the analog temporal signal.

104. The method of any of the previous embodiments, wherein said anamorphic spectrum transformation receives the analog temporal signal as a first signal having a first signal spectrum, which is transformed in response to filtering with a tailored frequency dependent group delay to warp the first signal spectrum into an output having a second signal spectrum that is ready for sampling.

105. The method of any of the previous embodiments, wherein said method of compressing an analog temporal signal is configured for temporal signal reconstruction in response to complex-field recovery, followed by an inverse anamorphic stretch transform (inverse AST) operation.

106. An apparatus for compressing analog temporal signals, comprising: a computer processor or digital signal processor configured for receiving an analog signal; and programming executable on the computer processor or digital signal processor for performing any of the steps recited in any of the previous embodiments.

107. A method of decompressing an analog temporal signal compressed by anamorphic spectrum transformation, comprising: receiving a compressed signal resulting from anamorphic spectrum transformation of an analog temporal signal; performing temporal signal reconstruction of the compressed signal in response to complex-field recovery, followed by an inverse anamorphic stretch transform (inverse AST) operation resulting in reconstruction of the analog temporal signal.

108. An apparatus for compressing analog temporal signals, comprising: a computer processor or digital signal processor configured for receiving an analog signal; programming executable on said computer processor or digital signal processor for performing an anamorphic spectrum transformation of the analog signal to warp its signal spectrum to provide time-bandwidth compression by filtering with a tailored frequency dependent group delay to warp the analog signal having a first waveform electric-field spectrum into a second waveform envelope spectrum ready for sampling; wherein said anamorphic spectrum transformation allows samples to be reallocated by assigning more samples to fine features with high frequency waveform portions of the analog signal and fewer samples to coarse features with low frequency portions of the analog signal.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Parameters and Acronyms

| Parameter | Definition |
|---|---|
| t | Time |
| $\omega$ | Carrier Frequency |
| $\omega_m$ | Modulation intensity frequency |
| $\omega_s$ | Digitizer sampling rate |
| $\Delta\omega_m$ | Modulation intensity bandwidth |
| M | Modulation intensity bandwidth compression factor |
| N | Number of samples (Discrete-time record length) |
| E | Complex amplitude in time domain |
| $\tilde{E}$ | Electric field spectrum |
| $H(\omega)$ | Filter transfer function |
| $\beta(\omega)$ | Filter phase response |
| GVD | Group Velocity Dispersion |
| $\beta_2$ | Total $2^{nd}$ order dispersion (GVD) coefficient |
| $\tau(\omega)$ | Group delay profile |
| I | Intensity |
| FT{ } | Fourier Transform |
| ADC | Analog to digital converter |
| AST | Anamorphic Stretch Transform |
| $S_M$ | Stretched Modulation Distribution |
| DFT | Time-stretch Dispersive Fourier Transform |

What is claimed is:

1. A method of capturing a temporal waveform, comprising:
   receiving a temporal waveform within a transformation stage of an electronic and/or optical circuit;
   wherein said temporal waveform comprises a temporal signal which is sampled at a sufficient rate to obtain desired signal information; and
   performing a transformation at said transformation stage for imparting a nonlinear warp onto the frequency spectrum of the waveform;
   wherein said transformation is performed in one or more domains selected from a group of domains consisting of analog, digital, optical, and electrical/radio/microwave frequency;
   outputting a compressed temporal waveform from the electronic and/or optical circuit.

2. The method recited in claim 1, wherein said transformation stage comprises a warped/anamorphic phase operation.

3. The method recited in claim 1, wherein said transformation stage comprises a filter with non-quadratic phase response.

4. The method recited in claim 1, wherein the temporal waveform is nonuniformly transformed during said nonlinear warping so that a uniform and finite sampling rate matches features of the temporal waveform.

5. The method recited in claim 4, wherein during said nonlinear warping, spectrum in a Fourier domain of the temporal waveform is warped to a spectrum probability density function (SPDF).

6. The method recited in claim 1, wherein said method is configured for increasing the bandwidth of data converters without reducing record length or requiring a higher number of samples.

7. The method recited in claim 1, wherein said transformation stage is utilized for imparting said nonlinear warp to said temporal waveform prior to receipt on a conventional data converter to provide adaptive temporal sampling in which because of the transformation, sampling rate adapts to the temporal waveform so that fine temporal features are sampled at a higher rate than the coarse temporal features.

8. The method recited in claim 7, wherein said data converter comprises capturing of the transformed temporal waveform with an analog to digital converter (ADC).

9. The method recited in claim 1, further comprising a decompression of said compressed temporal waveform.

10. The method recited in claim 9, wherein said decompression performs the inverse of said transformation on a compressed temporal waveform received from a conventional data converter.

11. The method recited in claim 10, wherein said conventional data converter comprises a digital to analog converter (DAC).

12. The method recited in claim 1, wherein said transformation stage is performed in the analog domain prior to sampling, and does not suffer from either quantization noise or the limits of a finite number of samples and quantization noise of a data converter.

13. The method recited in claim 1, wherein said transformation is performed on digital data with all-digital signal processing.

14. The method recited in claim 1, wherein said nonlinear warping is performed using a filter having a specific transfer function; wherein unless this specific transfer function is known, an eavesdropper would have difficulty recovering the temporal waveform.

15. The method recited in claim 1, wherein said method enhances resolution of spectroscopy, or decreases required number of samples without detracting from equivalent system resolution.

16. The method recited in claim 1, wherein said transformation exploits a natural frequency-to-time relation inherent in temporal dispersion, and does not rely on a-priori knowledge of the temporal waveform.

17. A method for increasing temporal resolution of data converters, comprising:
  receiving a temporal waveform at a transformation stage of an electronic and/or optical circuit;
  wherein said temporal waveform comprises a temporal signal which is sampled at a sufficient rate to obtain desired signal information;
  performing a transformation at said transformation stage utilizing frequency-selective mapping of the spectrum, with nonlinear warping, whereby mapping scale has a larger stretch factor on fine temporal features, subjecting said temporal waveform to an injective group delay to produce a compressed temporal waveform from the electronic and/or optical circuit; and
  receiving said compressed temporal waveform at a data converter wherein it is sampled with a uniform sample pattern.

18. The method recited in claim 17, wherein said injective group delay corresponds to a phase response that depends on a combination of even-order powers of frequency with weighting factors.

19. The method recited in claim 17, wherein said transformation is performed in one or more domains selected from a group of domains consisting of analog, digital, optical, and electrical/radio/microwave frequency.

20. The method recited in claim 17, wherein said transformation reduces number of samples required to obtain a given temporal bandwidth.

21. The method recited in claim 17, wherein said transformation is performed on digital data with all-digital signal processing.

22. The method recited in claim 17, wherein said nonlinear warping is performed using a filter having a specific transfer function, whereby unless this specific transfer function is known, an eavesdropper would have difficulty recovering the temporal waveform.

23. The method recited in claim 17, wherein said method enhances resolution of spectroscopy, or decreases number of samples required, without adversely impacting equivalent system resolution.

24. The method recited in claim 17, wherein said transformation exploits a natural frequency-to-time relation inherent in temporal dispersion, and does not rely on a-priori knowledge of the temporal waveform.

25. A method of capturing a temporal waveform, comprising:
  receiving a temporal waveform within a transformation stage of an electronic and/or optical circuit;
  wherein said temporal waveform comprises a temporal signal which is sampled at a sufficient rate to obtain desired signal information;
  performing a transformation at said transformation stage for imparting a nonlinear warp onto the frequency spectrum of the waveform;
  wherein the temporal waveform is nonuniformly transformed during said nonlinear warping so that a uniform and finite sampling rate matches features of the temporal waveform; and
  outputting a compressed temporal waveform from the electronic and/or optical circuit.

26. The method recited in claim 25, wherein during said nonlinear warping, spectrum in a Fourier domain of the temporal waveform is warped to a spectrum probability density function (SPDF).

27. A method of capturing a temporal waveform, comprising:
  receiving a temporal waveform within a transformation stage of an electronic and/or optical circuit;
  wherein said temporal waveform comprises a temporal signal which is sampled at a sufficient rate to obtain desired signal information;
  performing a transformation at said transformation stage for imparting a nonlinear warp onto the frequency spectrum of the waveform;
  fine temporal features are sampled at a higher rate than the coarse temporal features; and
  outputting a compressed temporal waveform from the electronic and/or optical circuit to the conventional data converter;
  wherein said method is configured for increasing the bandwidth of data converters without reducing record length or requiring a higher number of samples.

28. A method of capturing a temporal waveform, comprising:
  receiving a temporal waveform within a transformation stage of an electronic and/or optical circuit;
  wherein said temporal waveform comprises a temporal signal which is sampled at a sufficient rate to obtain desired signal information;
  performing a transformation at said transformation stage for imparting a nonlinear warp onto the frequency spectrum of the waveform;
  wherein said transformation stage is utilized for imparting said nonlinear warp to said temporal waveform prior to receipt on a conventional data converter to provide adaptive temporal sampling in which because of the transformation, sampling rate adapts to the temporal waveform so that fine temporal features are sampled at a higher rate than the coarse temporal features; and outputting a compressed temporal waveform from the electronic and/or optical circuit to the conventional data converter.

29. The method recited in claim 28, wherein said data converter comprises capturing of the transformed temporal waveform with an analog to digital converter (ADC).

30. A method of capturing a temporal waveform, comprising:

receiving a temporal waveform within a transformation stage of an electronic and/or optical circuit;

wherein said temporal waveform comprises a temporal signal which is sampled at a sufficient rate to obtain desired signal information;

performing a transformation at said transformation stage for imparting a nonlinear warp onto the frequency spectrum of the waveform;

outputting a compressed temporal waveform from the electronic and/or optical circuit; and decompressing said compressed temporal waveform, in which decompression performs the inverse of said transformation on a compressed temporal waveform received from a conventional data converter.

31. The method recited in claim 30, wherein said conventional data converter comprises a digital to analog converter (DAC).

32. A method of capturing a temporal waveform, comprising:

receiving a temporal waveform within a transformation stage of an electronic and/or optical circuit;

wherein said temporal waveform comprises a temporal signal which is sampled at a sufficient rate to obtain desired signal information;

performing a transformation at said transformation stage for imparting a nonlinear warp onto the frequency spectrum of the waveform;

wherein said transformation stage is performed in the analog domain prior to sampling, and does not suffer from either quantization noise or the limits of a finite number of samples and quantization noise of a data converter; and outputting a compressed temporal waveform from the electronic and/or optical circuit.

33. A method of capturing a temporal waveform, comprising:

receiving a temporal waveform within a transformation stage of an electronic and/or optical circuit;

wherein said temporal waveform comprises a temporal signal which is sampled at a sufficient rate to obtain desired signal information;

performing a transformation at said transformation stage for imparting a nonlinear warp onto the frequency spectrum of the waveform;

wherein said nonlinear warping is performed using a filter having a specific transfer function; wherein unless this specific transfer function is known, an eavesdropper would have difficulty recovering the temporal waveform; and outputting a compressed temporal waveform from the electronic and/or optical circuit.

34. A method of capturing a temporal waveform, comprising:

receiving a temporal waveform within a transformation stage of an electronic and/or optical circuit;

wherein said temporal waveform comprises a temporal signal which is sampled at a sufficient rate to obtain desired signal information;

performing a transformation at said transformation stage for imparting a nonlinear warp onto the frequency spectrum of the waveform; and outputting a compressed temporal waveform from the electronic and/or optical circuit;

wherein said method enhances resolution of spectroscopy, or decreases required number of samples without detracting from equivalent system resolution.

35. A method of capturing a temporal waveform, comprising:

receiving a temporal waveform within a transformation stage of an electronic and/or optical circuit;

wherein said temporal waveform comprises a temporal signal which is sampled at a sufficient rate to obtain desired signal information;

performing a transformation at said transformation stage for imparting a nonlinear warp onto the frequency spectrum of the waveform;

wherein said transformation exploits a frequency-to-time relation within temporal dispersion, and does not rely on a-priori knowledge of the temporal waveform; and outputting a compressed temporal waveform from the electronic and/or optical circuit.

* * * * *